(12) United States Patent
Duan et al.

(10) Patent No.: US 11,063,224 B2
(45) Date of Patent: Jul. 13, 2021

(54) ORGANIC ELECTROLUMINESCENT DEVICE

(71) Applicants: KunShan Go-Visionox Opto-Electronics Co., Ltd., Kunshan (CN); TSINGHUA UNIVERSITY, Beijing (CN)

(72) Inventors: Lian Duan, Kunshan (CN); Yilang Li, Kunshan (CN); Xiaozeng Song, Kunshan (CN); Dongdong Zhang, Kunshan (CN); Guomeng Li, Kunshan (CN)

(73) Assignees: KUNSHAN GO-VISIONOX OPTO-ELECTRONICS CO., LTD., Kunshan (CN); TSINGHUA UNIVERSITY, Beijing (CN)

( * ) Notice: Subject to any disclaimer, the term of this patent is extended or adjusted under 35 U.S.C. 154(b) by 210 days.

(21) Appl. No.: 16/398,263

(22) Filed: Apr. 30, 2019

(65) Prior Publication Data
US 2019/0259959 A1    Aug. 22, 2019

Related U.S. Application Data

(63) Continuation of application No. PCT/CN2018/106108, filed on Sep. 18, 2018.

(30) Foreign Application Priority Data

May 30, 2018    (CN) .......................... 201810542709.2

(51) Int. Cl.
*H01L 51/00* (2006.01)
*H01L 51/50* (2006.01)

(52) U.S. Cl.
CPC ........ *H01L 51/0072* (2013.01); *H01L 51/006* (2013.01); *H01L 51/0058* (2013.01);
(Continued)

(58) Field of Classification Search
None
See application file for complete search history.

(56) References Cited

U.S. PATENT DOCUMENTS

2004/0150327 A1    8/2004  Kawai et al.
2012/0248968 A1*  10/2012  Ogiwara .............. C09K 11/025
                                                        313/504
(Continued)

FOREIGN PATENT DOCUMENTS

CN    102709485 A    10/2012
CN    104716268 A     6/2015
(Continued)

OTHER PUBLICATIONS

Wong, Michael Y., and Eli Zysman-Colman. "Purely organic thermally activated delayed fluorescence materials for organic light-emitting diodes." Advanced Materials 29, No. 22 (2017): 1605444. (Year: 2017).*

(Continued)

*Primary Examiner* — Robert S Loewe
(74) *Attorney, Agent, or Firm* — Kilpatrick Townsend & Stockton

(57) ABSTRACT

The present application discloses an organic electroluminescent device including a host material and guest material, the host material is an exciplex formed by electron donor material and electron receptor material, the guest material is thermal activated delayed fluorescent material, a singlet energy level of the host material is lower than a singlet energy level of the guest material.

20 Claims, 3 Drawing Sheets

(52) U.S. Cl.
CPC ...... *H01L 51/0061* (2013.01); *H01L 51/0067* (2013.01); *H01L 51/0074* (2013.01); *H01L 51/5092* (2013.01); *H01L 51/007* (2013.01); *H01L 51/5016* (2013.01); *H01L 51/5056* (2013.01); *H01L 51/5072* (2013.01)

(56) References Cited

U.S. PATENT DOCUMENTS

| | | | |
|---|---|---|---|
| 2013/0292656 A1* | 11/2013 | Seo | H01L 51/504 257/40 |
| 2013/0306945 A1* | 11/2013 | Seo | H01L 51/5072 257/40 |
| 2015/0349284 A1 | 12/2015 | Seo et al. | |
| 2016/0087227 A1* | 3/2016 | Kim | H01L 51/0073 257/40 |
| 2016/0093823 A1* | 3/2016 | Seo | H01L 51/5004 257/40 |
| 2016/0104855 A1* | 4/2016 | Ohsawa | B25H 1/12 257/40 |
| 2016/0164020 A1* | 6/2016 | Kim | C09K 11/06 257/40 |
| 2016/0248031 A1* | 8/2016 | Seo | H01L 51/5012 |
| 2016/0248032 A1* | 8/2016 | Seo | H01L 51/504 |
| 2016/0322582 A1 | 11/2016 | Qiu et al. | |
| 2016/0351833 A1* | 12/2016 | Hosoumi | H01L 51/0074 |
| 2017/0025630 A1 | 1/2017 | Seo et al. | |
| 2017/0194585 A1* | 7/2017 | Yan | H01L 51/0051 |
| 2017/0271610 A1* | 9/2017 | Takahashi | H01L 51/5072 |
| 2017/0309687 A1* | 10/2017 | Watabe | H01L 27/322 |
| 2017/0346029 A1* | 11/2017 | Kim | H01L 51/5004 |
| 2018/0145273 A1 | 5/2018 | Seo et al. | |
| 2018/0375053 A1 | 12/2018 | Duan et al. | |
| 2019/0019971 A1 | 1/2019 | Xie et al. | |
| 2019/0027542 A1 | 1/2019 | Watabe et al. | |
| 2019/0296256 A1* | 9/2019 | Kim | C09K 11/06 |
| 2019/0348625 A1* | 11/2019 | Mitsumori | H01L 51/0088 |
| 2020/0321539 A1* | 10/2020 | Zhao | H01L 51/006 |

FOREIGN PATENT DOCUMENTS

| | | |
|---|---|---|
| CN | 105503766 A | 4/2016 |
| CN | 105895811 A | 8/2016 |
| CN | 106206974 A | 12/2016 |
| CN | 106206996 A | 12/2016 |
| CN | 106206997 A | 12/2016 |
| CN | 106981577 A | 7/2017 |
| CN | 106997890 A | 8/2017 |
| CN | 107305926 A | 10/2017 |
| CN | 107492596 A | 12/2017 |
| CN | 107851727 A | 3/2018 |
| JP | 2016207998 A | 12/2016 |
| WO | 2017101657 A1 | 6/2017 |

OTHER PUBLICATIONS

Sun, Jin Won, Kwon-Hyeon Kim, Chang-Ki Moon, Jeong-Hwan Lee, and Jang-Joo Kim. "Highly efficient sky-blue fluorescent organic light emitting diode based on mixed cohost system for thermally activated delayed fluorescence emitter (2CzPN)." ACS Applied Materials & Interfaces 8, No. 15 (2016): 9806-9810. (Year: 2016).*

Sun, Jin Won, Jeong-Hwan Lee, Chang-Ki Moon, Kwon-Hyeon Kim, Hyun Shin, and Jang-Joo Kim. "A fluorescent organic light-emitting diode with 30% external quantum efficiency." Advanced Materials 26, No. 32 (2014): 5684-5688. (Year: 2014).*

Seino, Yuki, Susumu Inomata, Hisahiro Sasabe, Yong-Jin Pu, and Junji Kido. "High-performance green OLEDs using thermally activated delayed fluorescence with a power efficiency of over 100 lm W-1." Advanced Materials 28, No. 13 (2016): 2638-2643. (Year: 2016).*

Hosokai et al. "Role of intermediate state in the excited state dynamics of highly efficient TADF molecules." In Organic Light Emitting Materials and Devices XX, vol. 9941, p. 994107. International Society for Optics and Photonics, 2016. (Year: 2016).*

CN First Office Action dated Mar. 19, 2019 in the corresponding CN Application (application No. 201810542709.2).

International Search Report dated Feb. 27, 2019 in the corresponding International Application (application No. PCT/CN2018/106108).

Office Action of China Taiwan dated Mar. 19, 2019 in the corresponding TW application (application No. 107133046).

* cited by examiner

ORGANIC ELECTROLUMINESCENT DEVICE

CROSS-REFERENCES TO RELATED APPLICATIONS

This application is a continuation application for International Application PCT/CN2018/106108, filed on Sep. 18, 2018, which claims priority to Chinese Patent Application No. 201810542709.2, entitled "AN ORGANIC ELECTROLUMINESCENT DEVICE" filed on May 30, 2018, the contents of which are expressly incorporated by reference herein in their entireties.

FIELD

The present application relates to the field of display technology, and particularly relates to an organic electroluminescent device.

BACKGROUND

Organic light-emitting diodes (OLED), due to their advantages such as being ultra-thin, light weight, low power consumption, active light-emitting, wide viewing angle and quick response, have great application prospect in the field of display and illumination and have received more and more attention from people.

Traditional fluorescent material is easy to synthesize and has low price, stable material and relatively long service life for device, however, because of the reason of electron spin barrier, only 25% of singlet state excitons at most can be utilized to emit light, and the external quantum efficiency is usually lower than 5%, which needs to be further enhanced.

In order to reduce cost and break through the internal quantum efficiency limitation of 25% for OLED devices at the same time, the Thermally Activated Delayed Fluorescence (TADF) mechanism has been proposed. In small-molecule organic material having relatively small singlet-triplet energy level difference ($\Delta E_{ST}$), the triplet state excitons can be converted into singlet state excitons by the process of Reverse Intersystem Crossing (RISC), and theoretically, the internal quantum efficiency of the device can reach 100%. The thermal activated delayed fluorescent material can have the advantages of both the fluorescent material and the phosphorescent material and is called the third-generation organic light-emitting material, which receives widespread attention.

OLED devices manufactured by the doping method have advantages in light-emitting efficiency, OLED devices having host material doped with guest material use an exciplex having a narrow energy gap as the host material to sensitize the guest material of dye molecules. These OLED devices increase the utilization rate of excitons and elevate the internal quantum efficiency of the devices. However, in the process of Forster energy transfer between the host material and the guest material, as the excitons have high excitation energy, severe Triple-Triplet Annihilation (TTA), Triplet-Polaron Annihilation (TPA) and Singlet-Triplet Annihilation (STA) would happen in the light-emitting layer, which leads to accelerated efficiency rolling-down of the device and shortened service life.

SUMMARY

Therefore, a technical problem to be solved by the present application is how to overcome the defects that the organic electroluminescent device using an exciplex as the host material in the prior art has severe phenomena of Triple-Triplet Annihilation (TTA), Triplet-Polaron Annihilation (TPA) and Singlet-Triplet Annihilation (STA) in its light-emitting layer which leads to accelerated efficiency rolling-down of the device and shortened light-emitting service life.

Thus, the present application provides an organic electroluminescent device comprising a light-emitting layer, wherein the light-emitting layer comprises host material and guest material, the host material is an exciplex formed by electron donor material and electron receptor material, the guest material is thermal activated delayed fluorescent material, a singlet energy level of the host material is lower than a singlet energy level of the guest material.

Preferably, in the aforementioned organic electroluminescent device, an energy level difference between the singlet energy level of the guest material and the singlet energy level of the host material is less than 0.3 eV.

Preferably, in the aforementioned organic electroluminescent device, an energy level difference between the singlet energy level of the host material and a triplet energy level of the host material is less than 0.15 eV.

Preferably, in the aforementioned organic electroluminescent device, an energy level difference between the singlet energy level of the guest material and a triplet energy level of the guest material is less than 0.3 eV.

Preferably, in the aforementioned organic electroluminescent device, the electron donor material has a singlet energy level higher than the singlet energy level of the guest material, and/or the electron receptor material has a singlet energy level higher than the singlet energy level of the guest material.

Preferably, in the aforementioned organic electroluminescent device, the electron donor material and the electron receptor material have a mass ratio of 1:9 to 9:1. More preferably, the electron donor material and the electron receptor material have a mass ratio of 1:5 to 5:1. Most preferably, the electron donor material and the electron receptor material have a mass ratio of 1:1.

Preferably, in the aforementioned organic electroluminescent device, the electron donor material is a compound having a hole transport function, the electron donor material contains at least one of the following groups:

a carbazolyl group, an aromatic amine group, a phenyl group, a fluorene group, a silane group; and a dense-cyclic group, a bicyclic group or a spirocyclic group formed by any of the groups above.

Further preferably, in the aforementioned organic electroluminescent device, the electron donor material has a compound structure selected from any one of the following structural formulas:

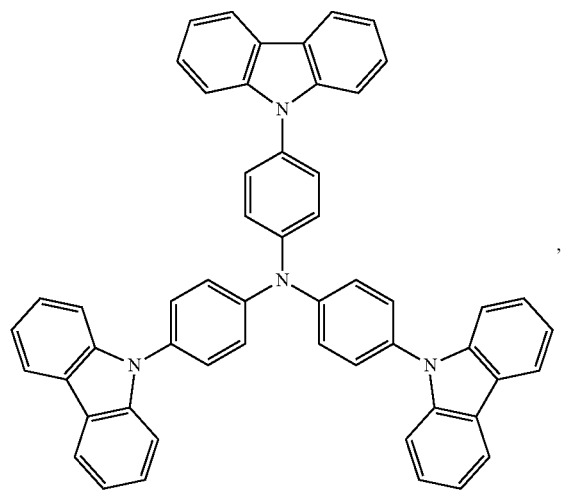
(D-1)
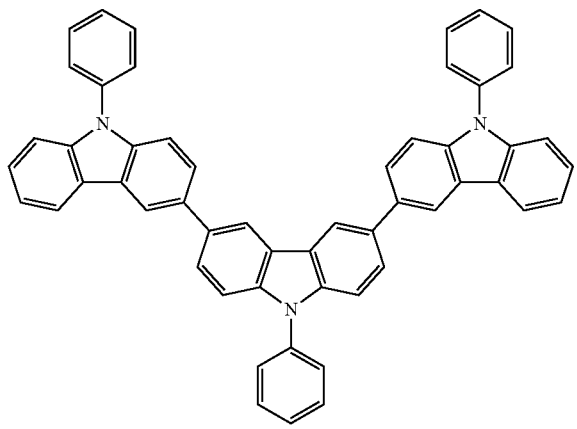
(D-2)
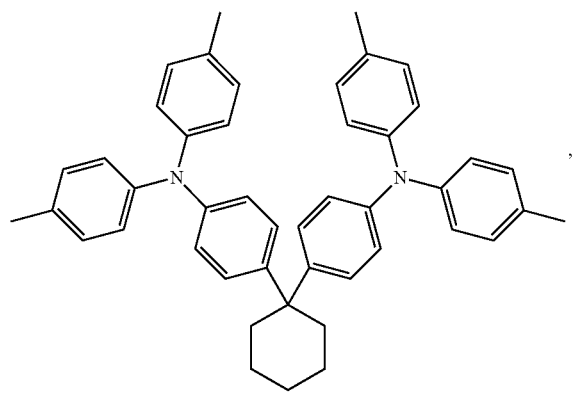
(D-3)
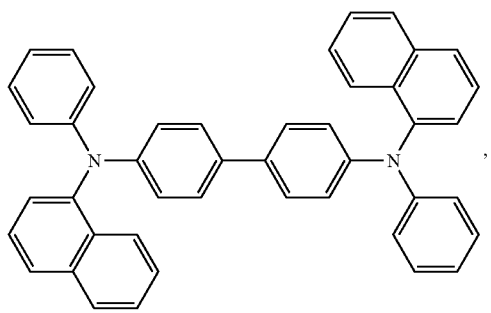
(D-4)
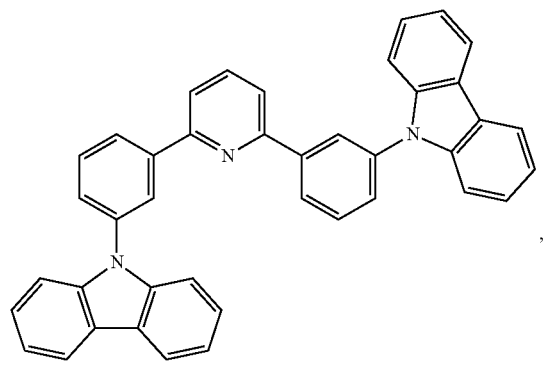
(D-5)
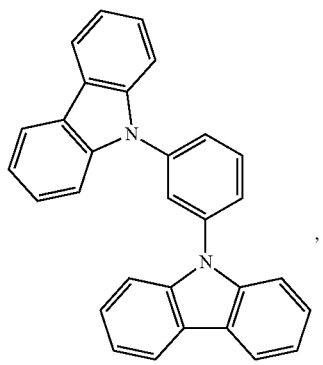
(D-6)
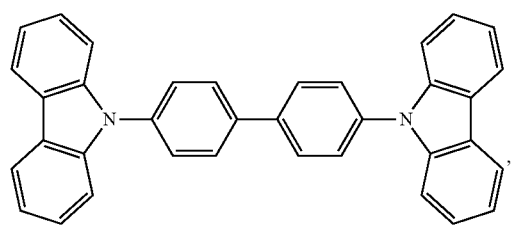
(D-7)
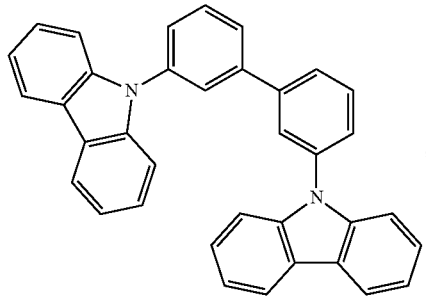
(D-8)

-continued
(D-9)
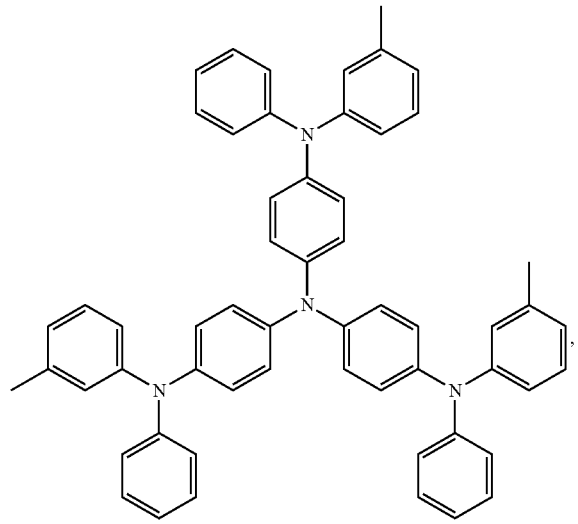
(D-10)
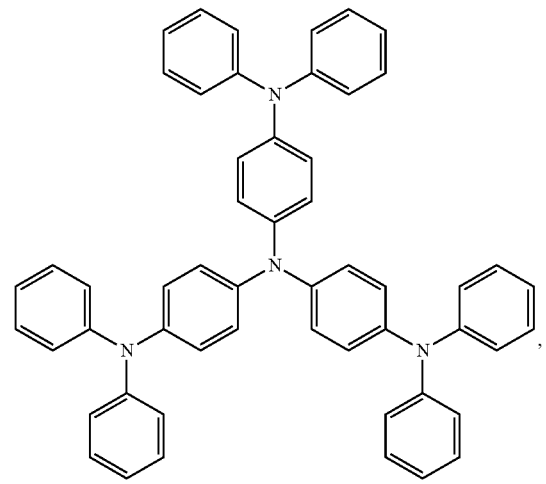
(D-11)
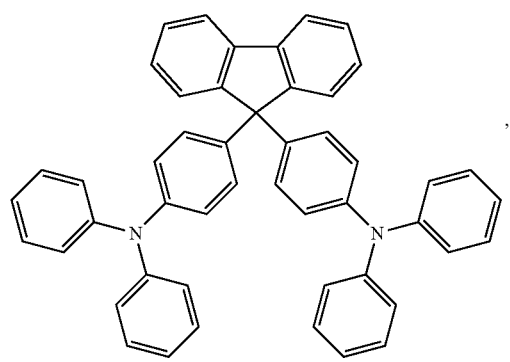
(D-12)
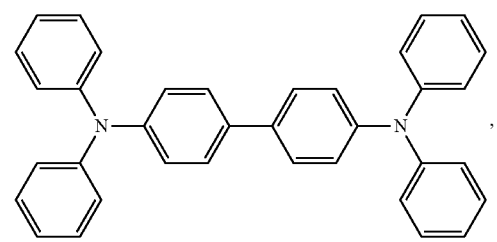
(D-13)
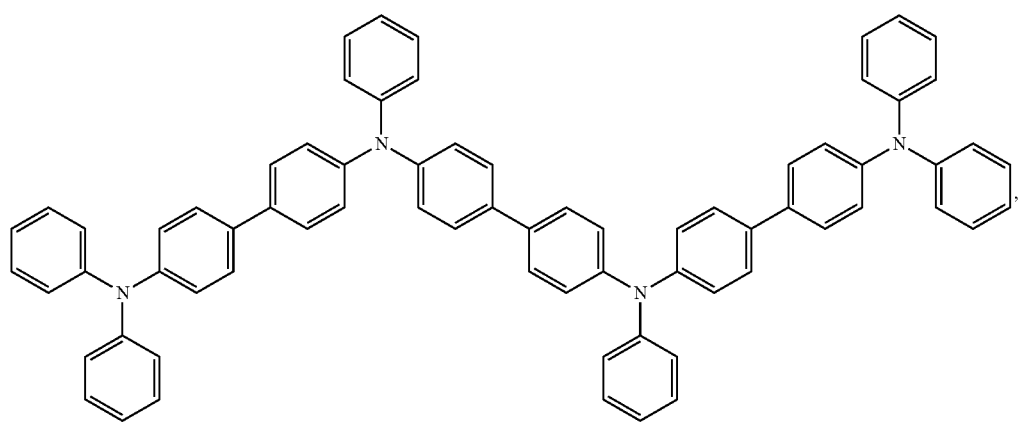

-continued
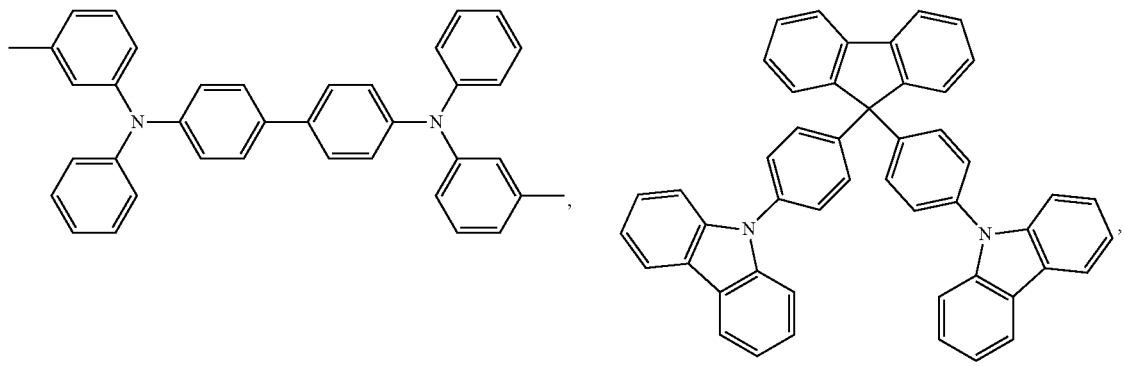
(D-14)
(D-15)
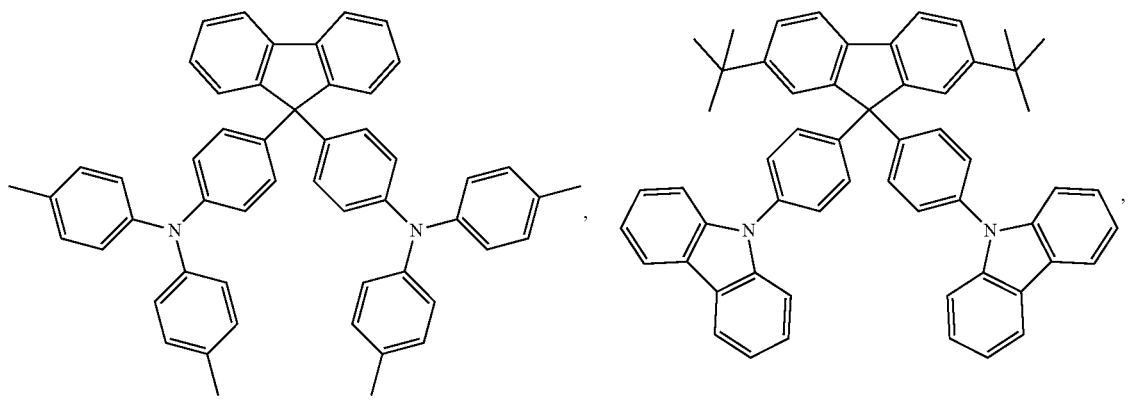
(D-16)
(D-17)
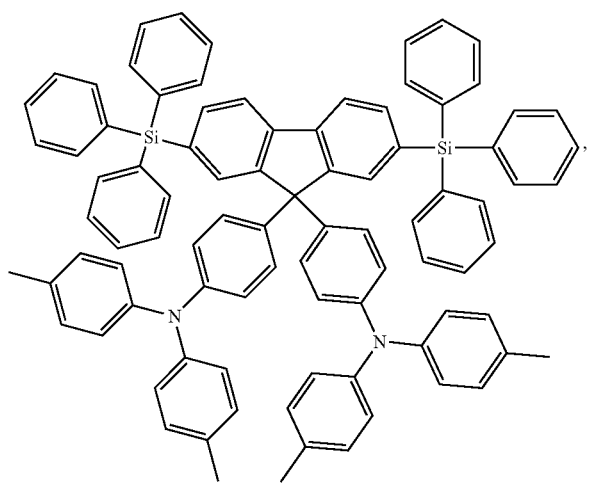
(D-18)

-continued

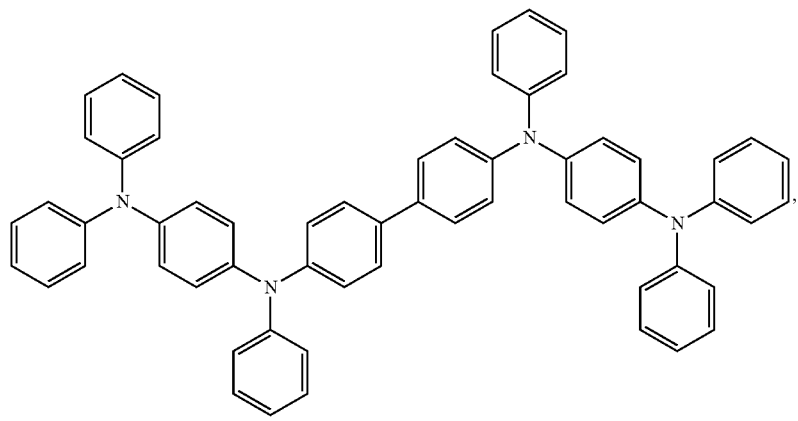
(D-19)

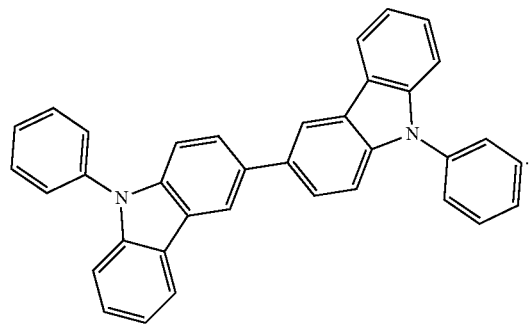
(D-20)

Preferably, in the aforementioned organic electroluminescent device, the electron receptor material is a compound having an electron transport function, the electron receptor material contains at least one of the following groups:

a pyridyl group, a pyrimidine group, a pyrazole group, an imidazolyl group, a pyrrole group, an oxazolyl group, a triazine group, a pyrazinyl group, a pyridazine group, a carbazole group, a cyan group, a phenyl group, a dibenzothiophene group, a phenyl phosphonyl group, a phenyl sulphone group; and a dense-cyclic group, a bicyclic group or a spirocyclic group formed by any of the groups above.

Preferably, in the aforementioned organic electroluminescent device, the electron receptor material has a compound structure selected from any one of the following structural formulas:

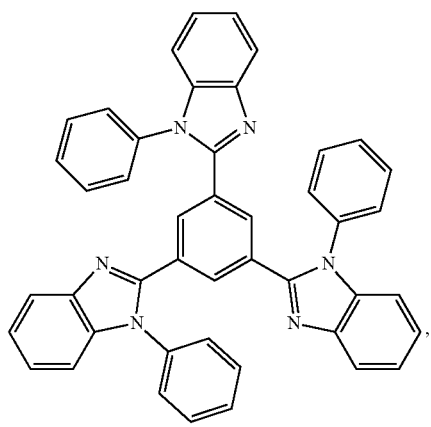
(A-1)

-continued

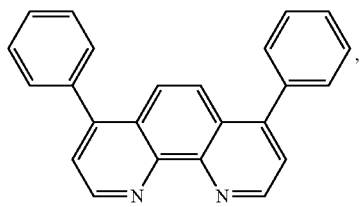
(A-2)

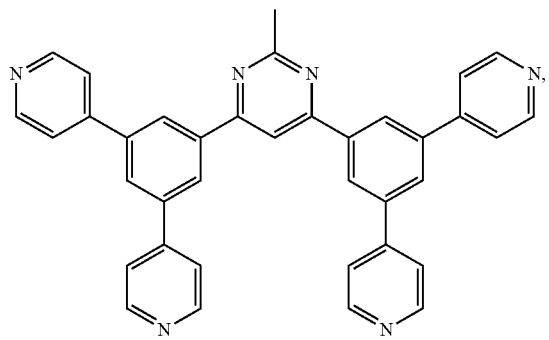
(A-3)

-continued
(A-4)
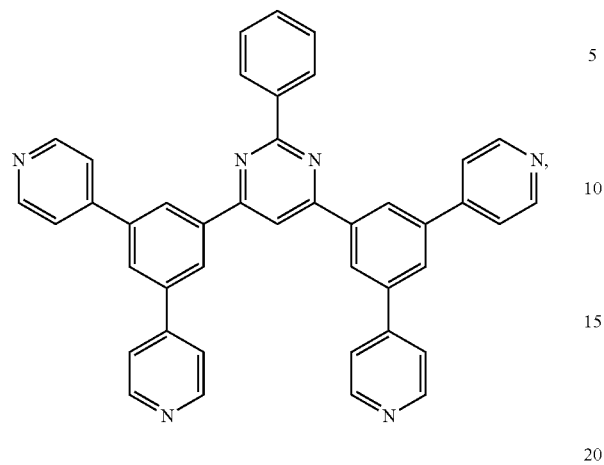
(A-5)
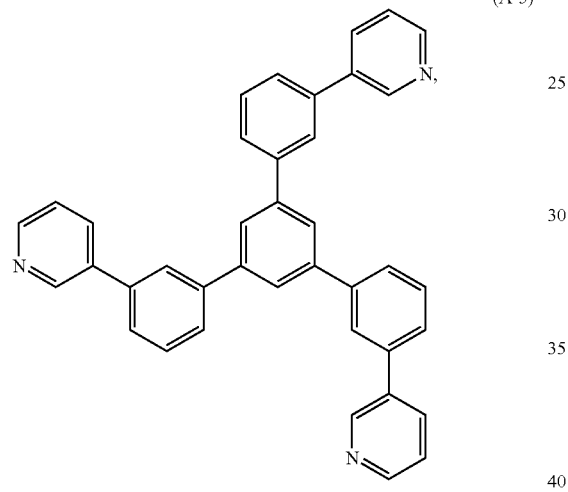
(A-6)
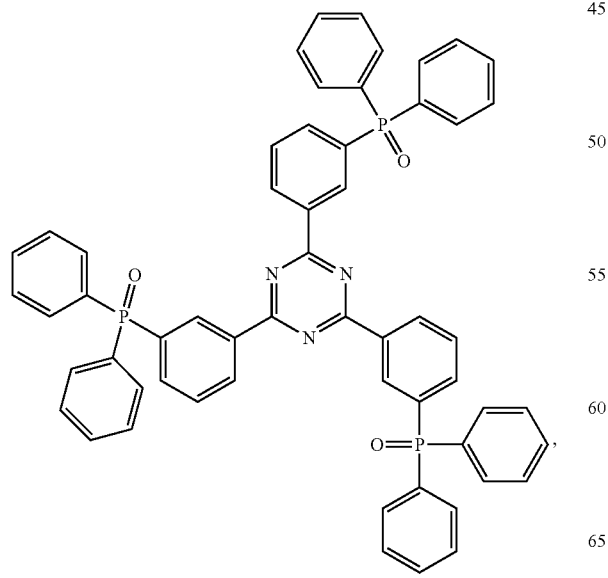
-continued
(A-7)
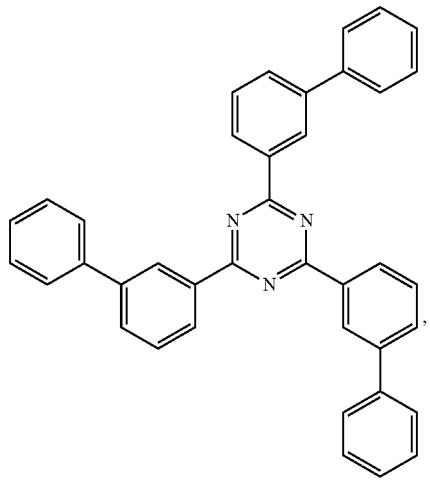
(A-8)
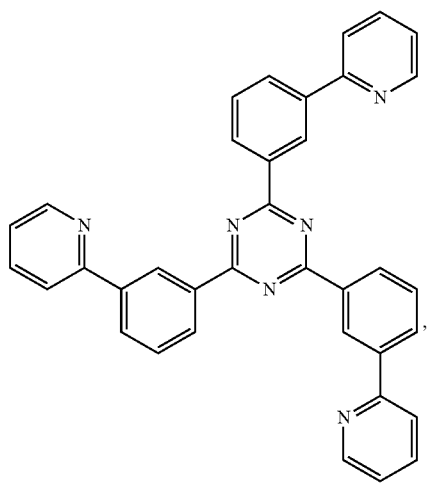
(A-9)
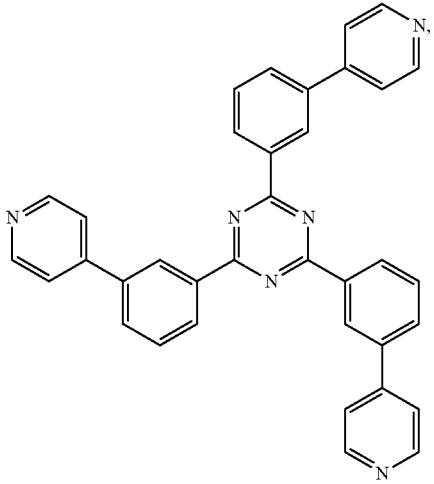

(A-10)
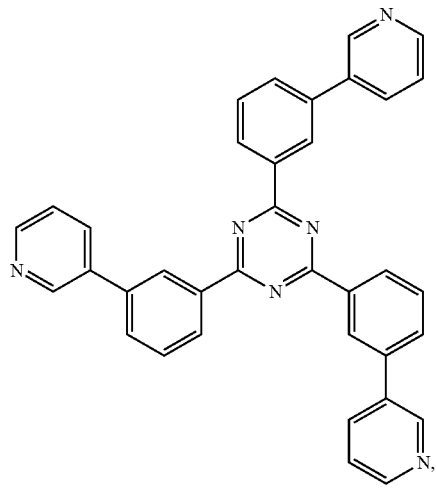
(A-11)
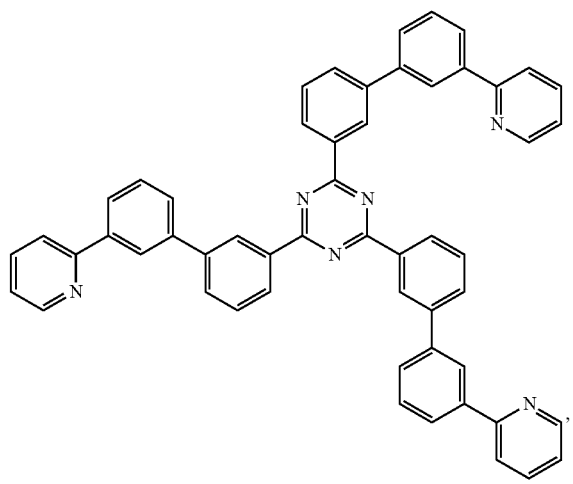
(A-12)
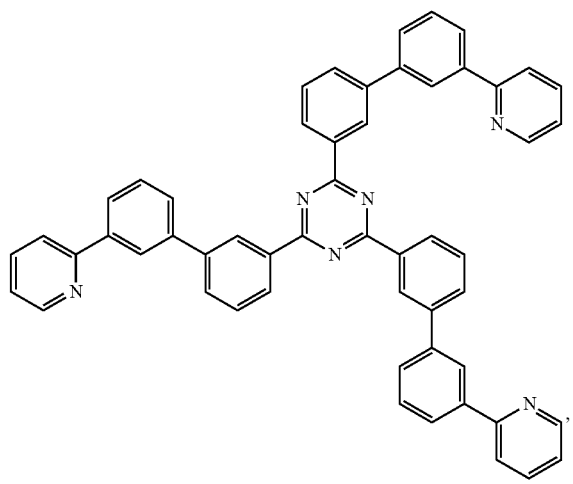
(A-13)
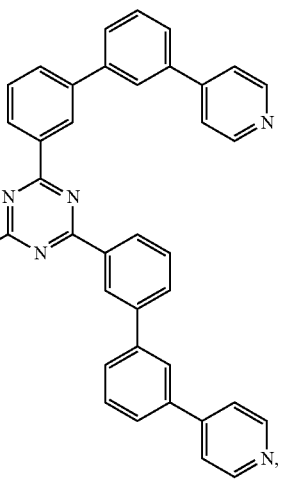
(A-14)
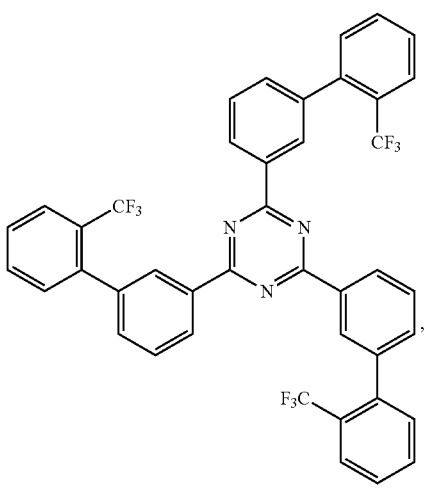
(A-15)
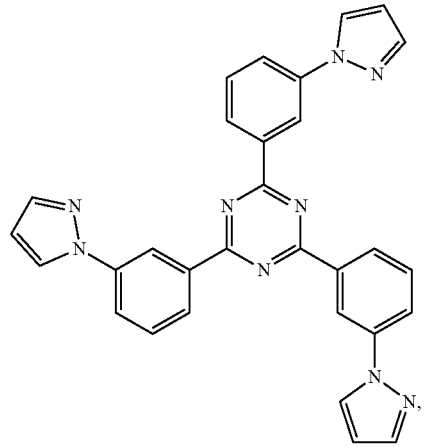

(A-16)
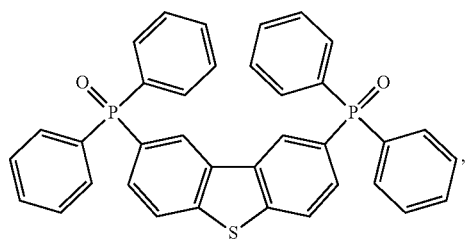
(A-17)
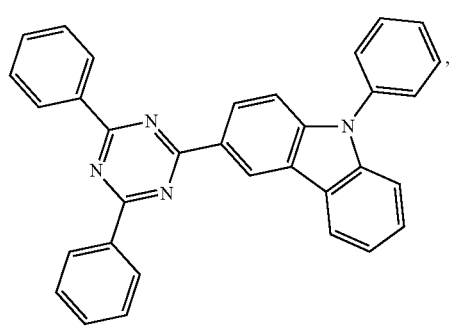
(A-18)
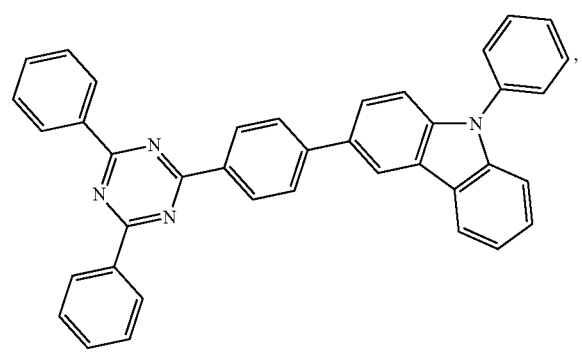
(A-19)
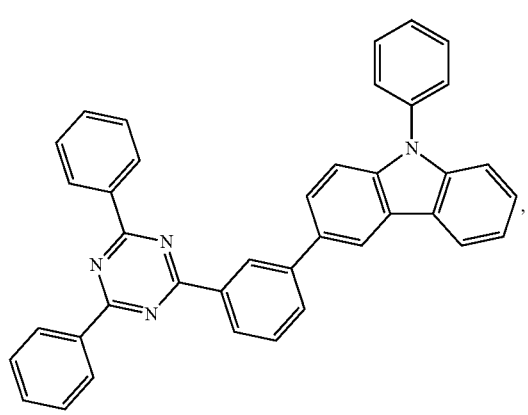
(A-20)
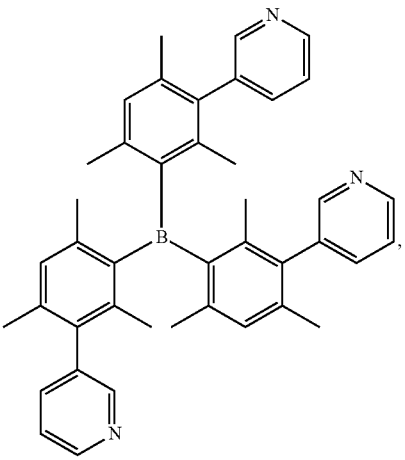
(A-21)
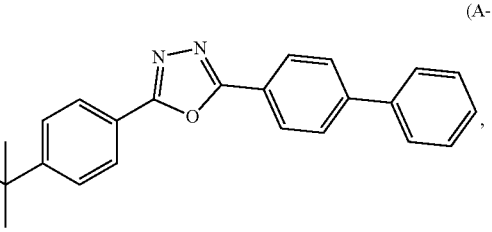
(A-22)
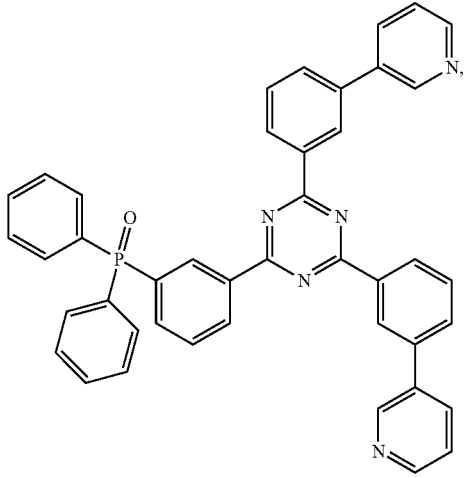
(A-23)
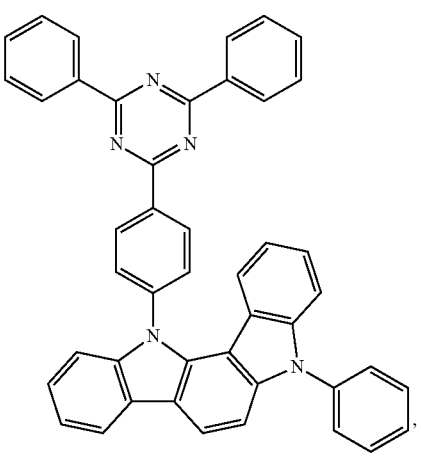

(A-24)
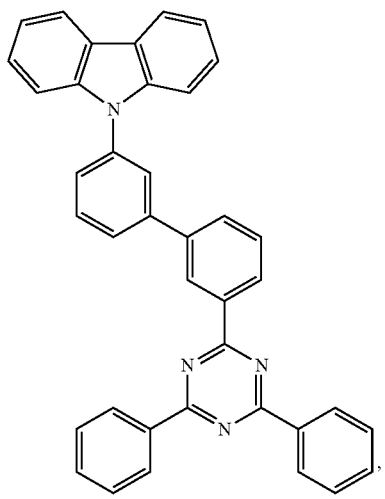
(A-25)
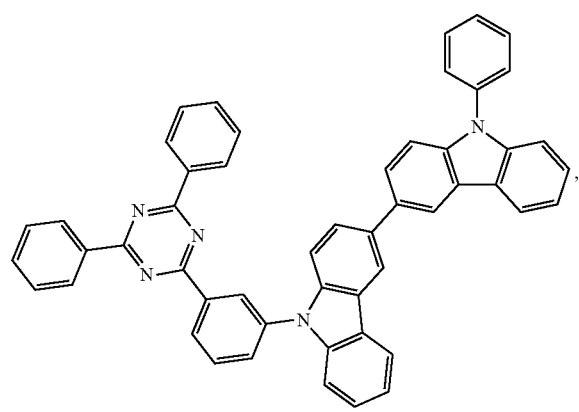
(A-26)
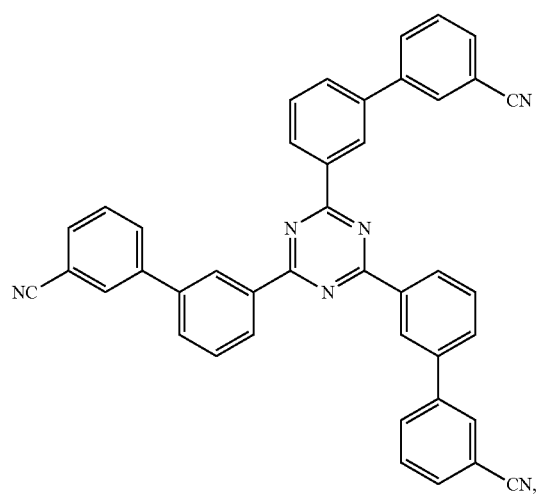
(A-27)
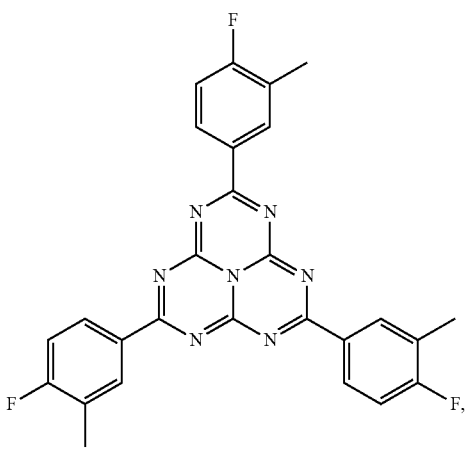
(A-28)
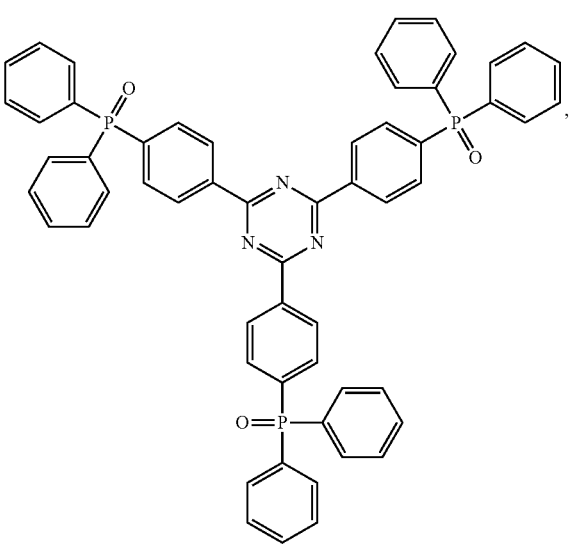
(A-29)
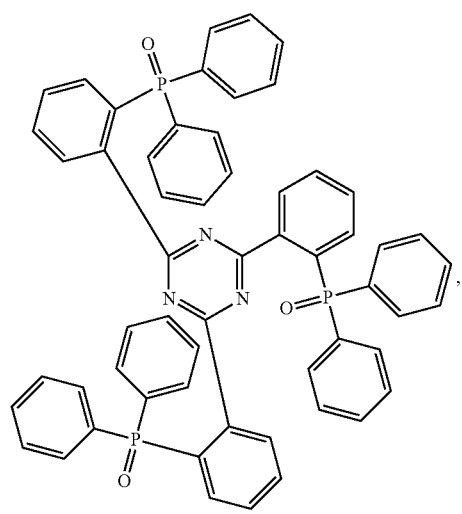

-continued
(A-31)
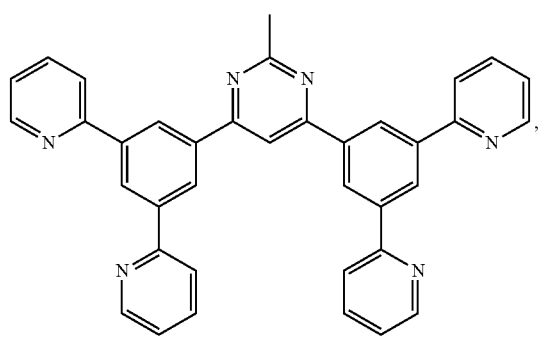
(A-32)
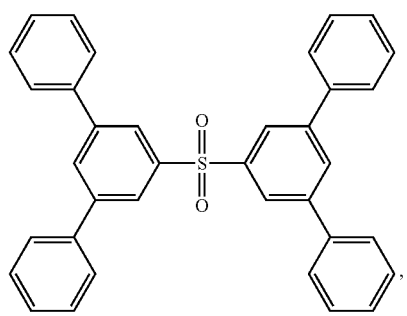
(A-33)
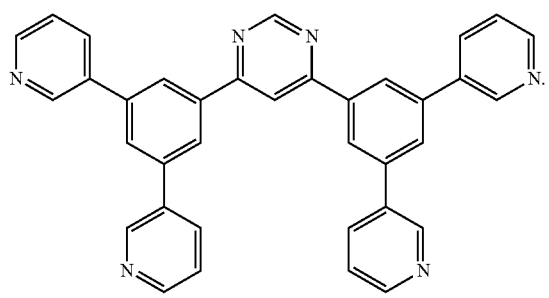
Preferably, in the aforementioned organic electroluminescent device, the thermal activated delayed fluorescent material has a compound structure selected from any one of the following structural formulas:
(T-1)
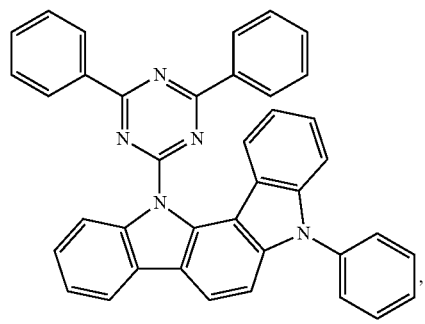
(T-2)
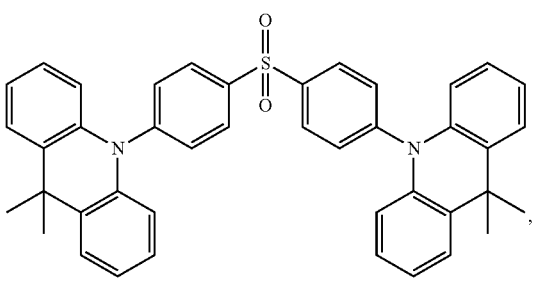
(T-3)
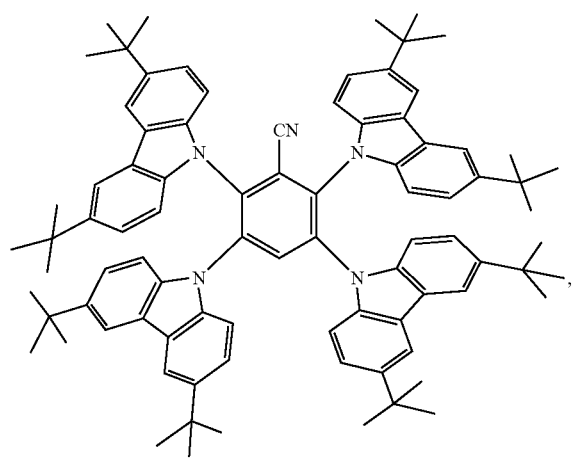
(T-4)
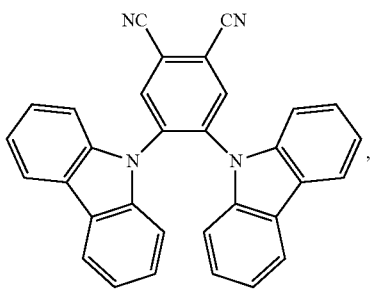

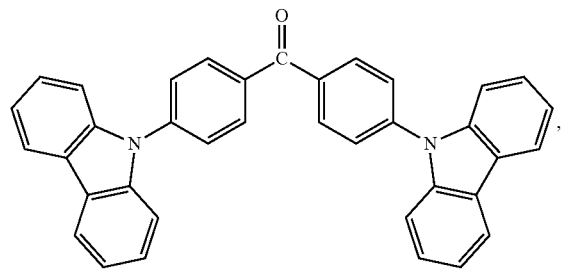
(T-5)
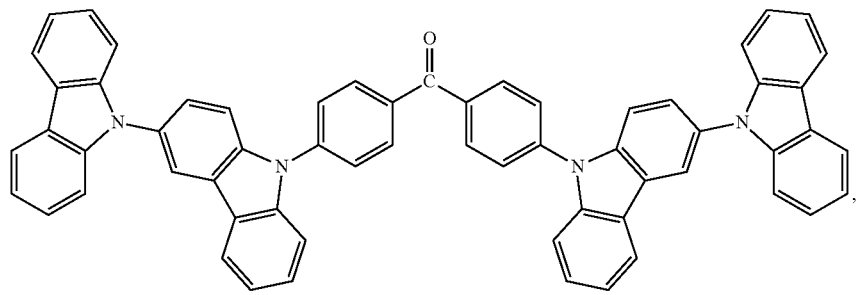
(T-6)
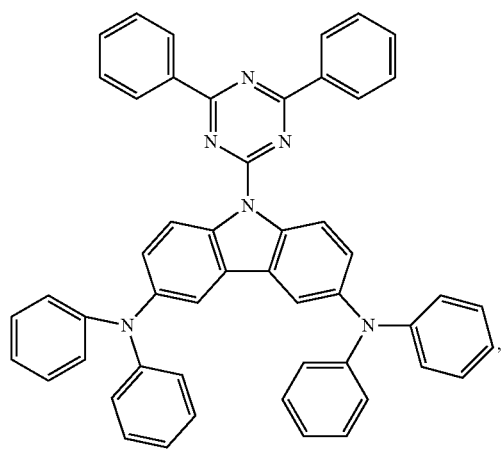
(T-7)
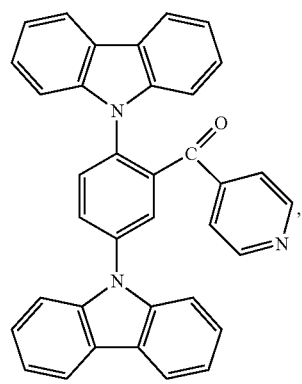
(T-8)
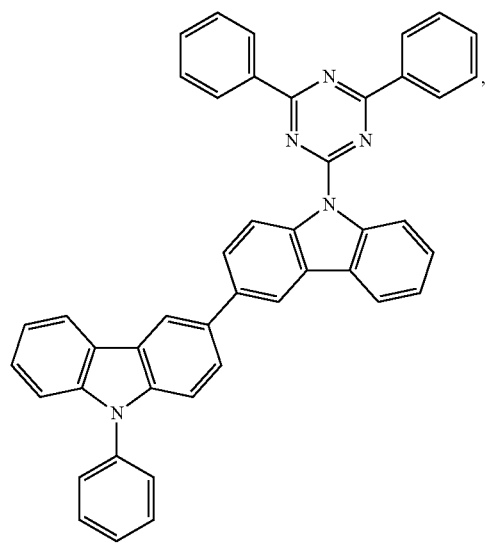
(T-9)
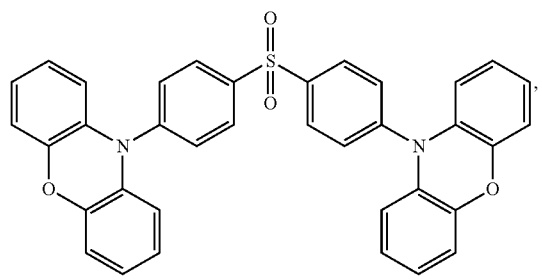
(T-10)

(T-11)
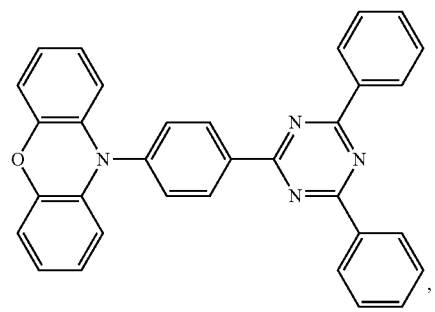
(T-12)
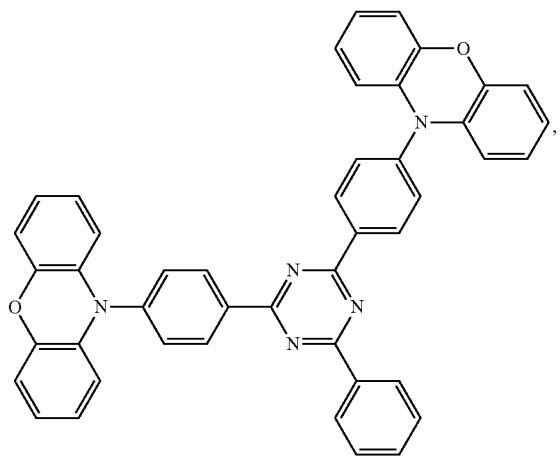
(T-13)
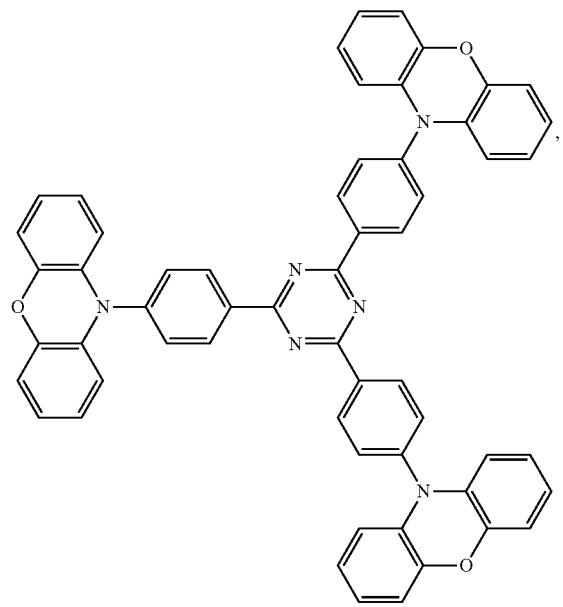
(T-14)
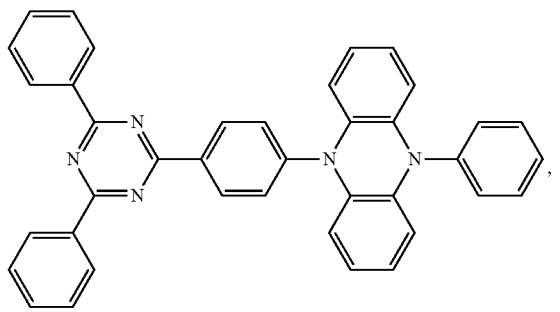
(T-15)
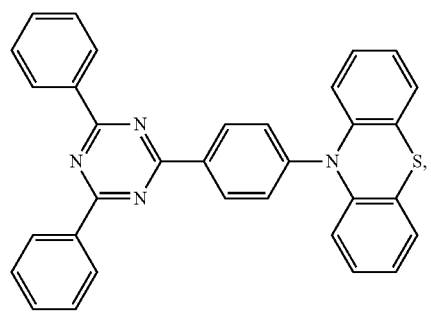
(T-16)
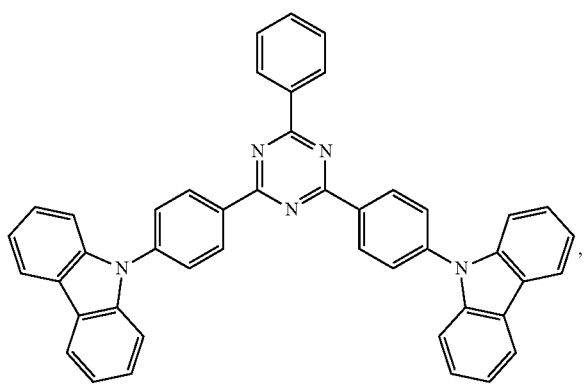

-continued
(T-17)
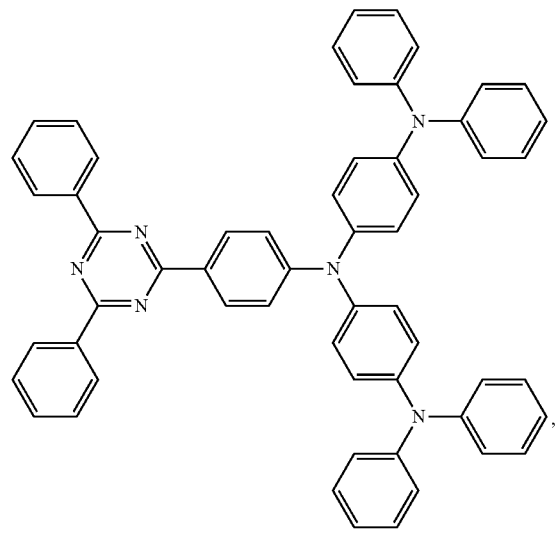
(T-18)
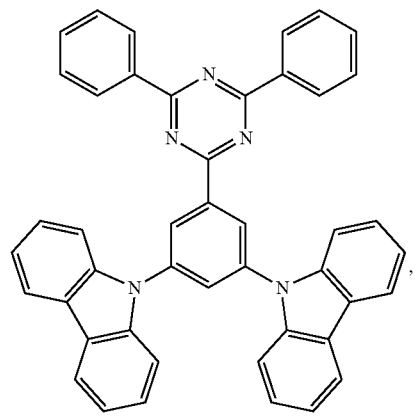
(T-19)
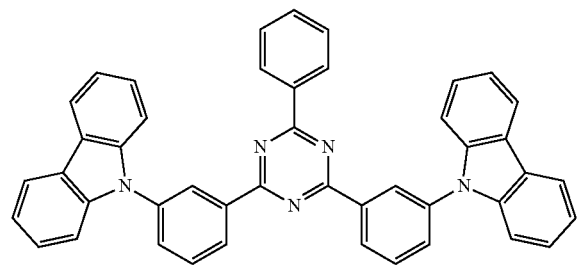
(T-20)
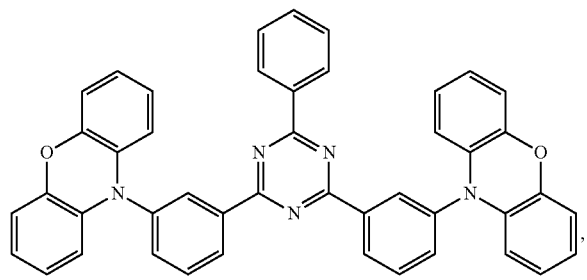
(T-21)
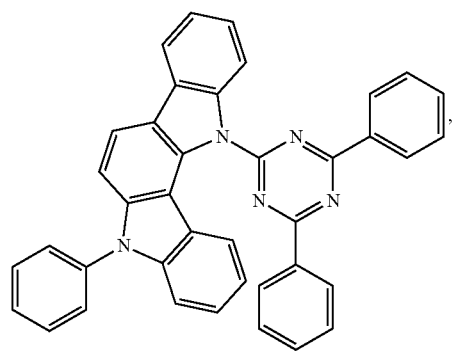
(T-22)
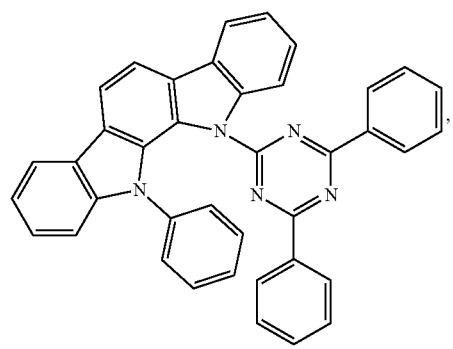

-continued
(T-23)
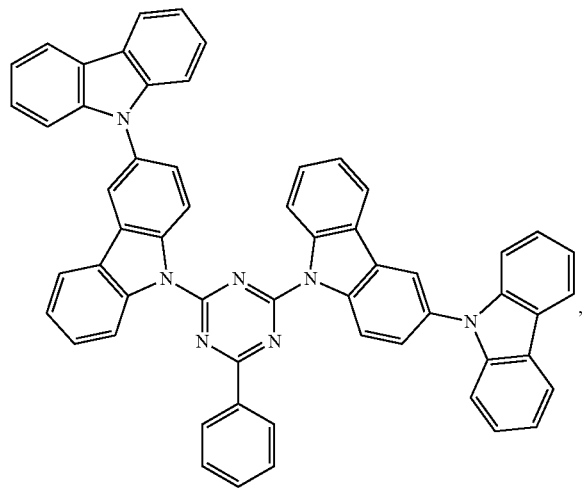
(T-24)
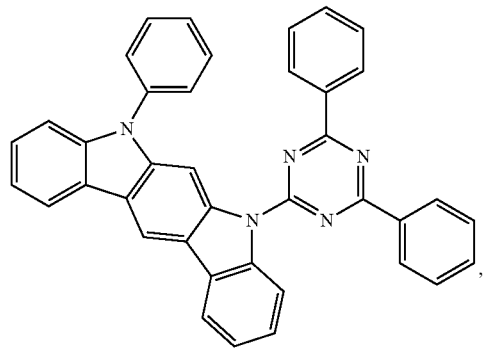
(T-25)
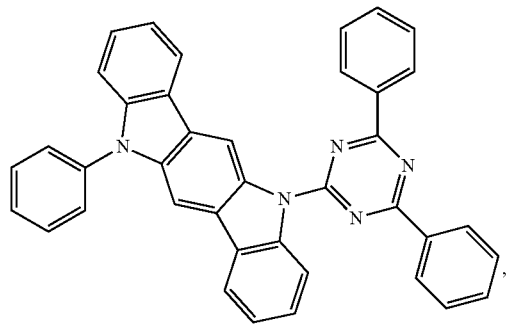
(T-26)
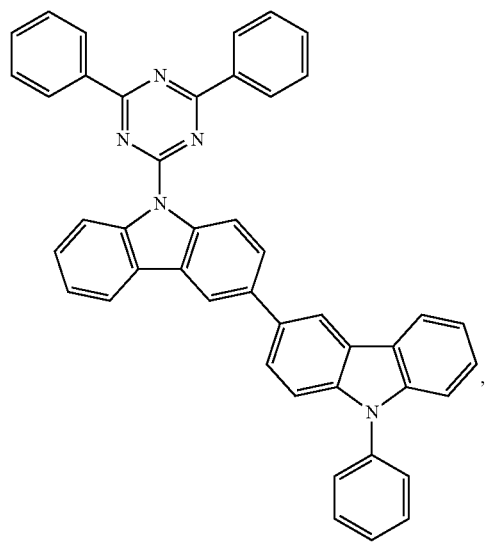
(T-27)
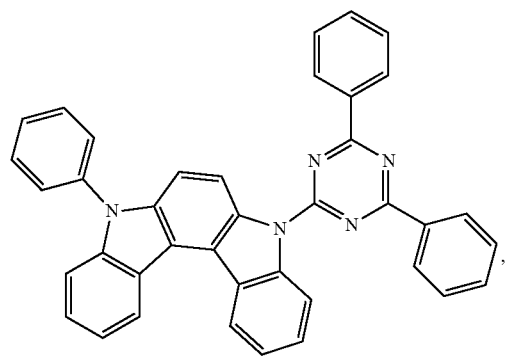
(T-28)
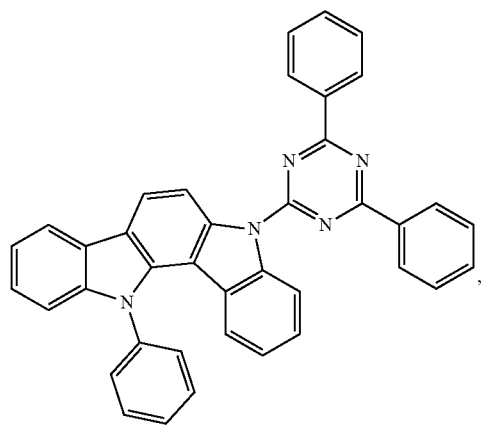

-continued
(T-29)
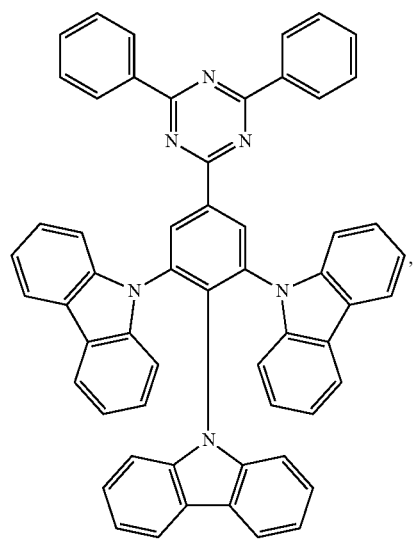
(T-30)
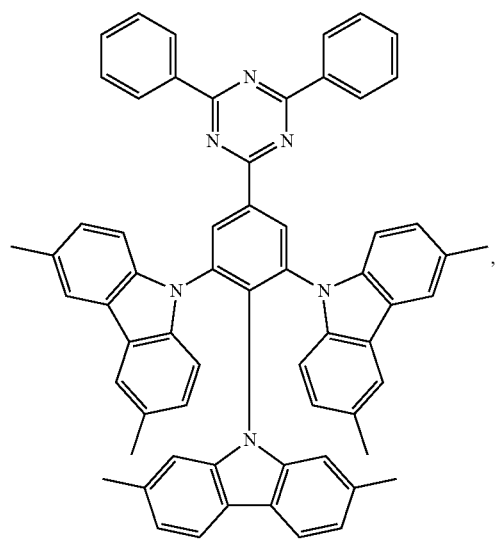
(T-31)
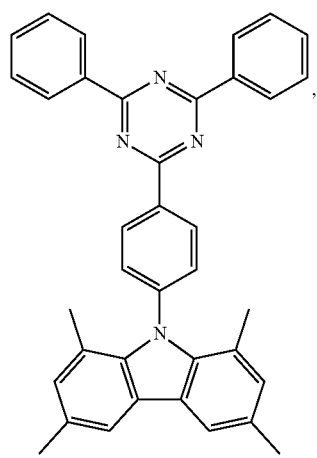
(T-32)
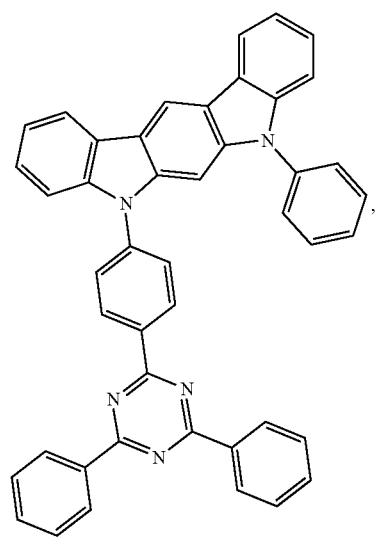
(T-33)
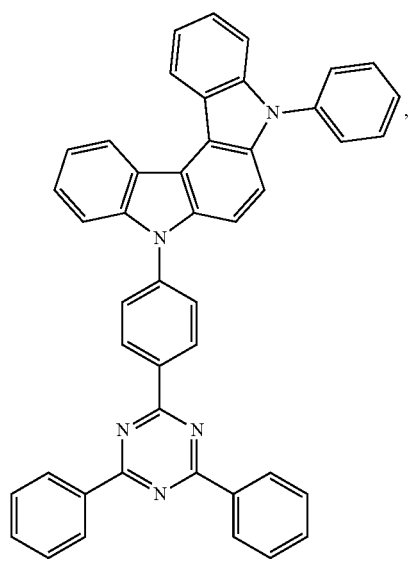
(T-34)
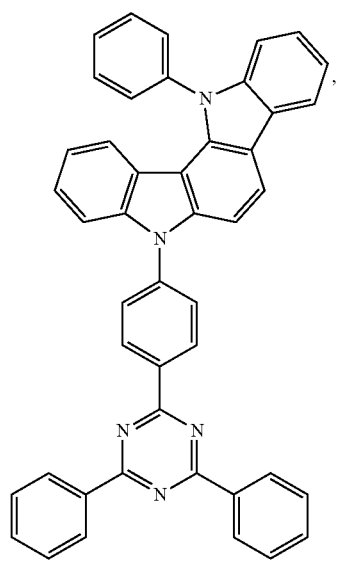

-continued
(T-35)
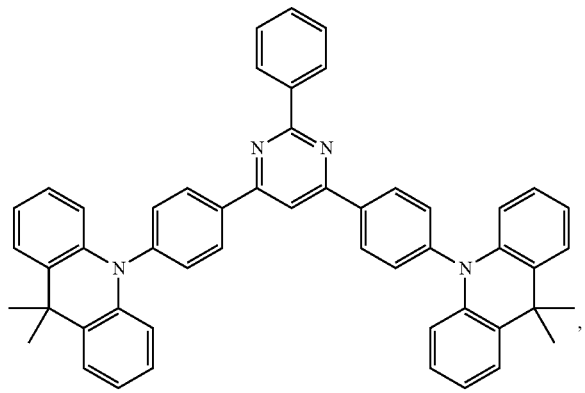
(T-36)
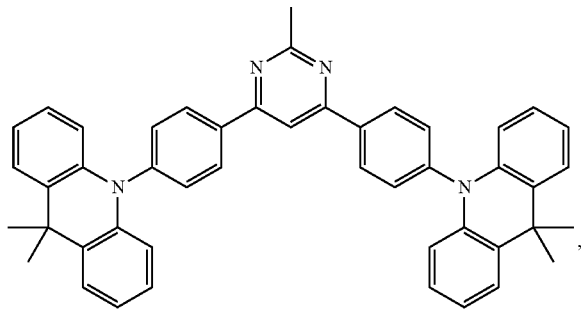
(T-37)
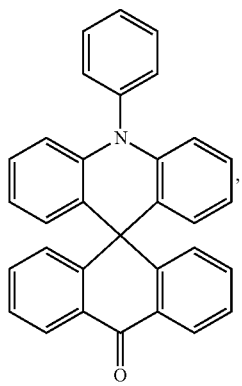
(T-38)
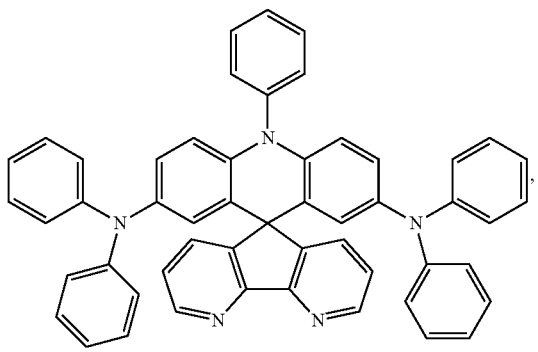
(T-39)
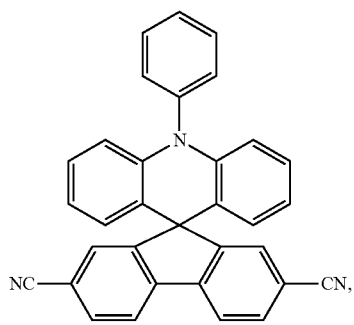
(T-40)
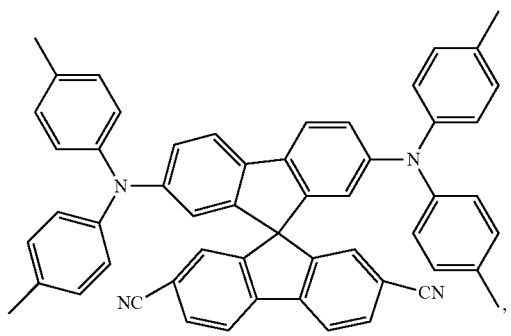
(T-41)
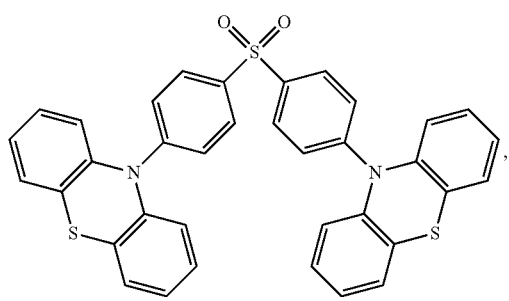
(T-42)
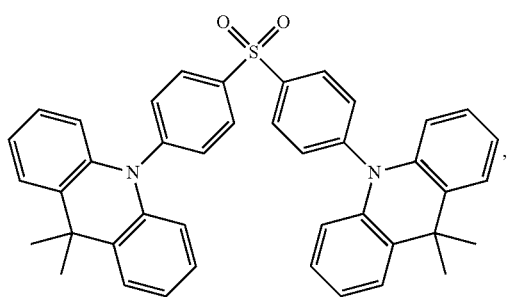

(T-43)
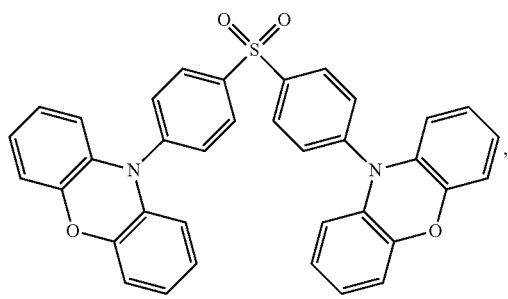
(T-44)
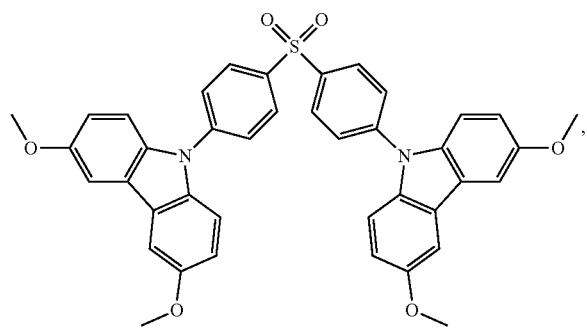
(T-45)
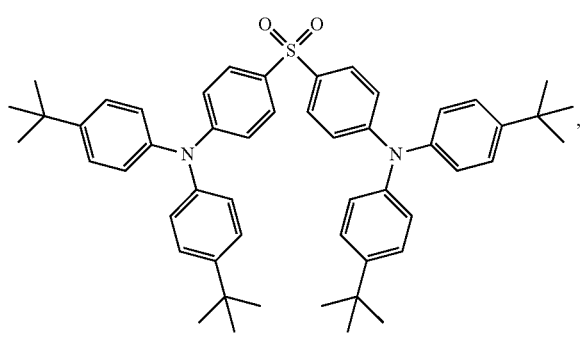
(T-46)
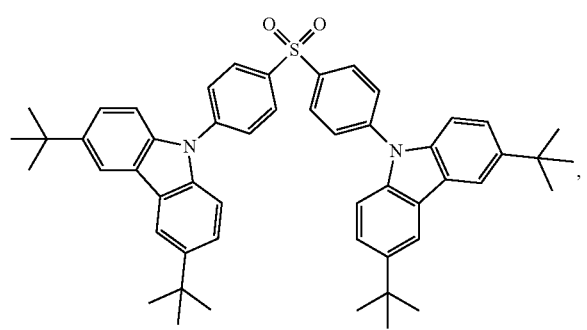
(T-47)
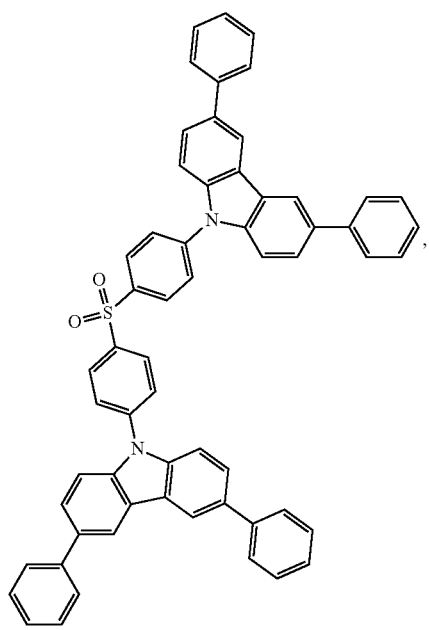
(T-48)
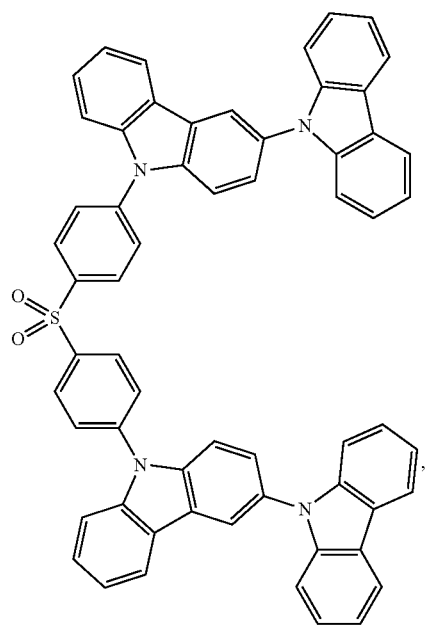

(T-49)
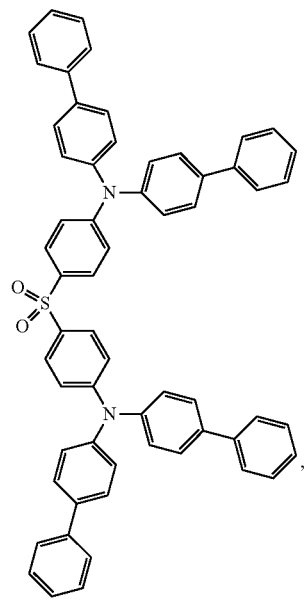
(T-50)
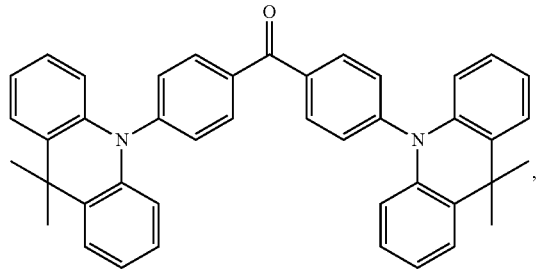
(T-51)
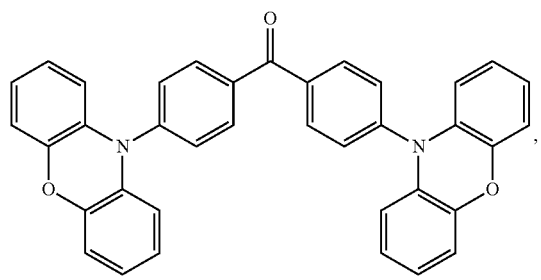
(T-52)
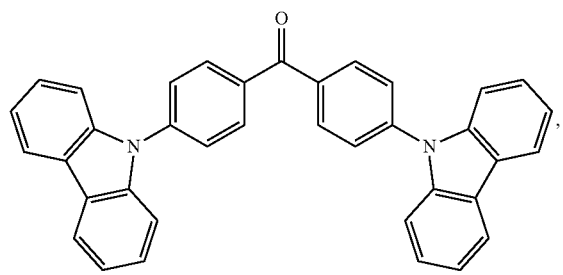
(T-53)
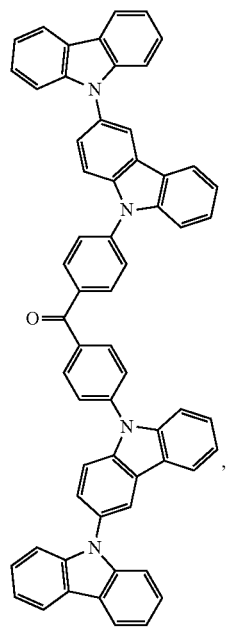
(T-54)
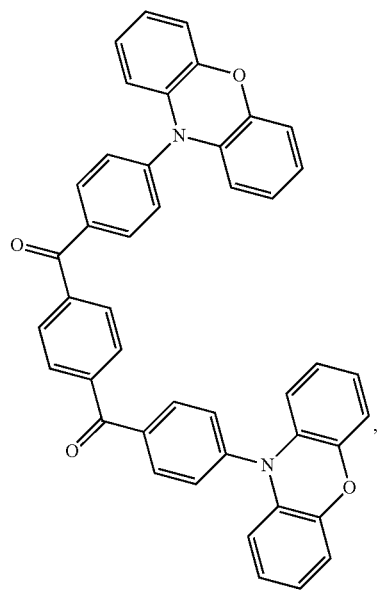

-continued
(T-55)
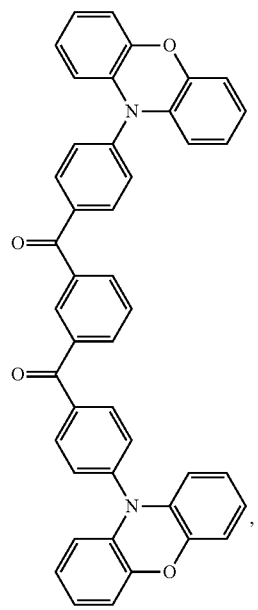
(T-56)
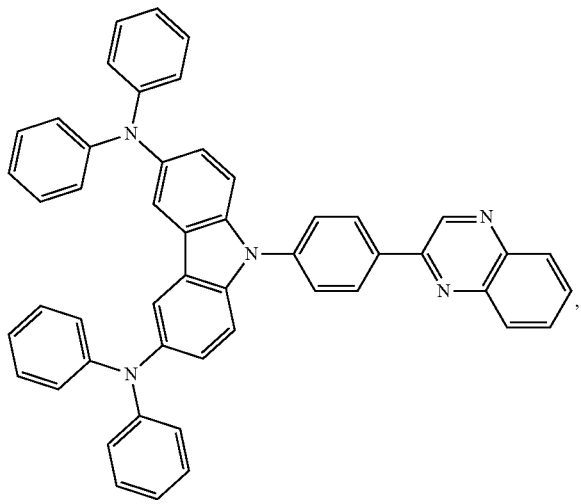
(T-57)
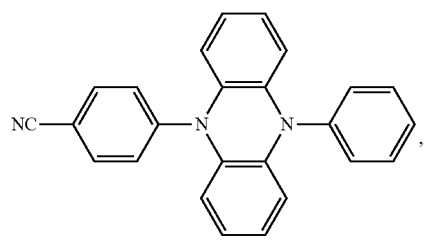
(T-58)
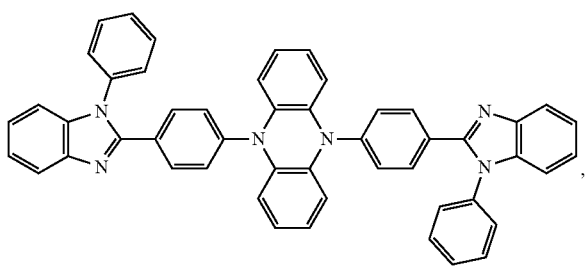
(T-59)
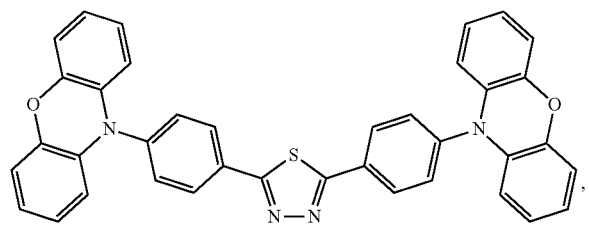
(T-60)
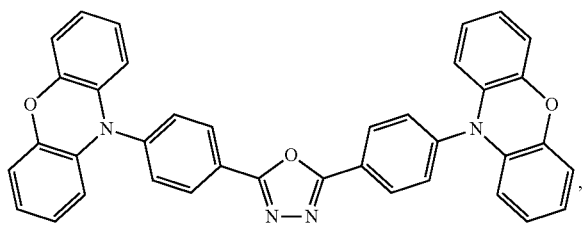
(T-61)
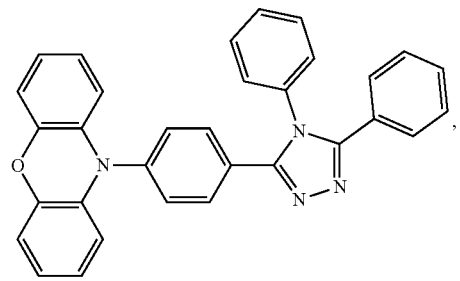
(T-62)
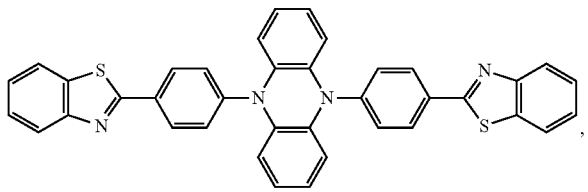

-continued
(T-63)
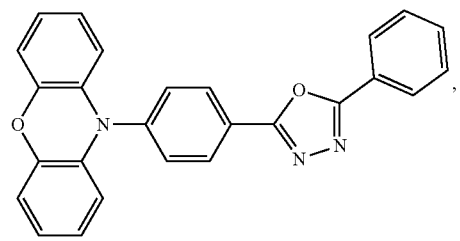
(T-64)
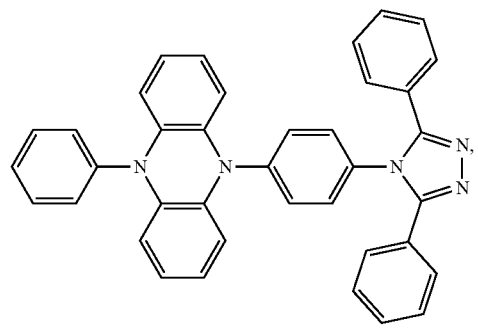
(T-65)
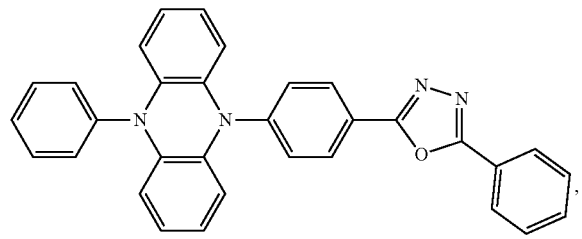
(T-66)
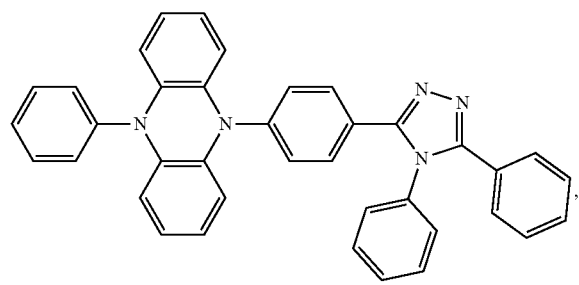
(T-67)
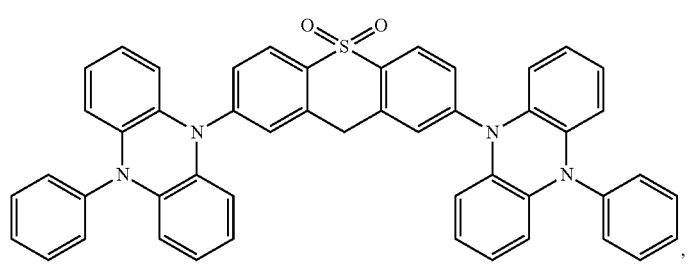
(T-68)
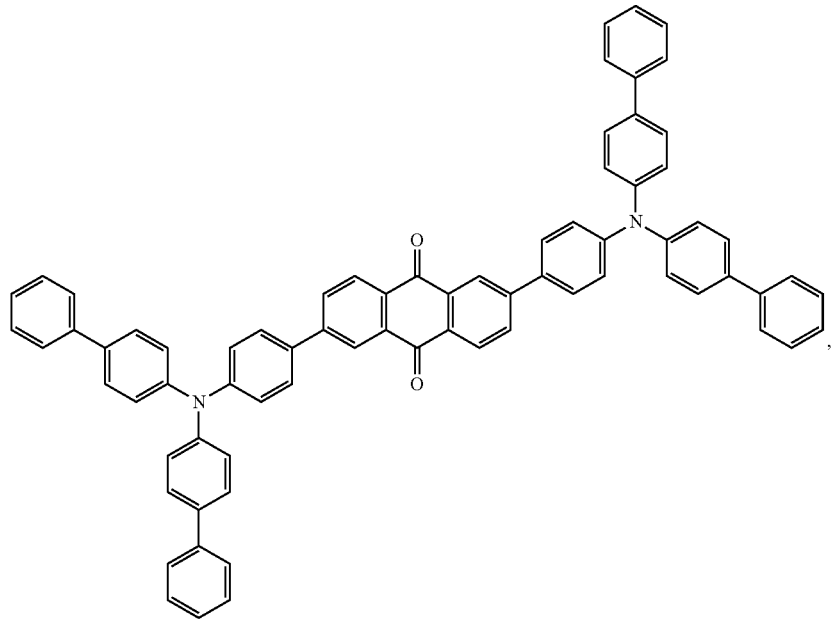

(T-69)
(T-70)
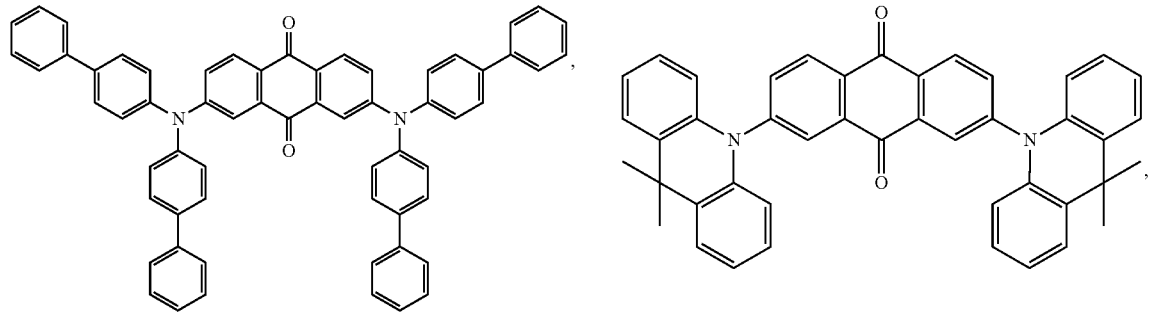
(T-71)
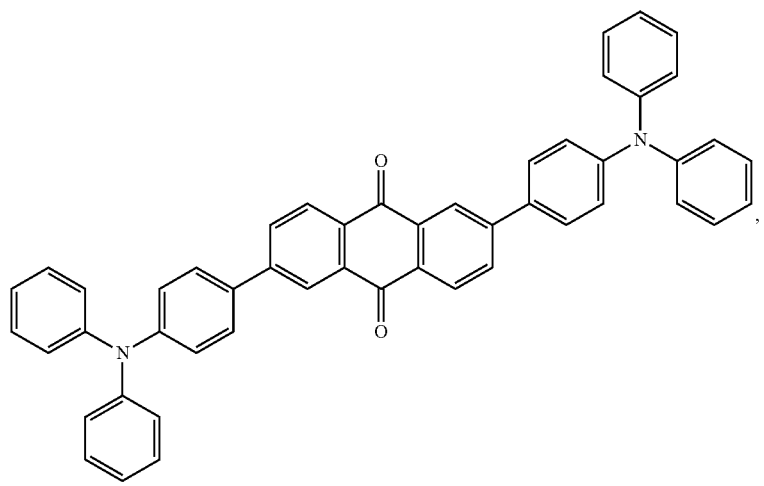
(T-72)
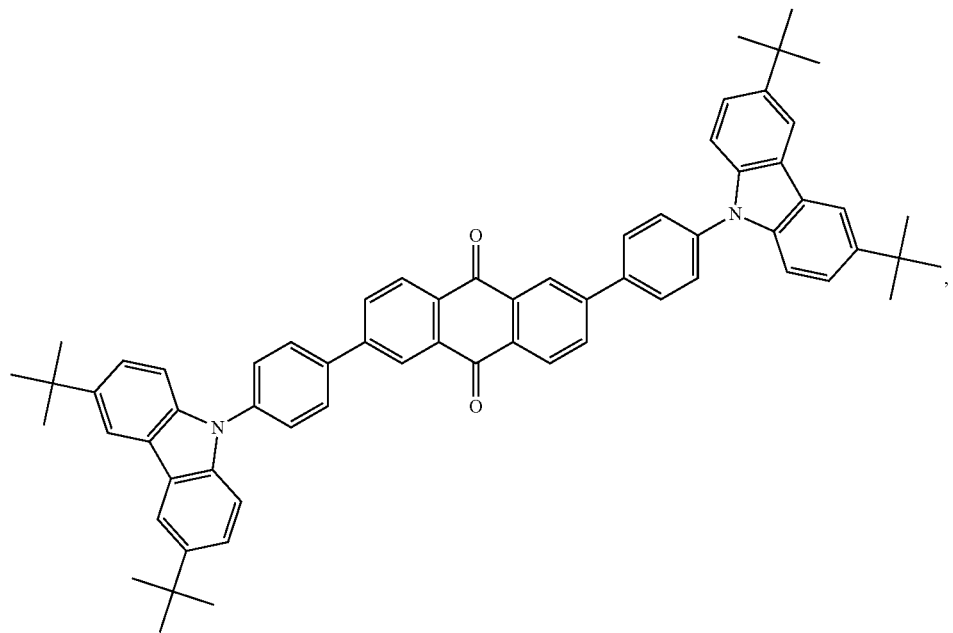

-continued
(T-73)
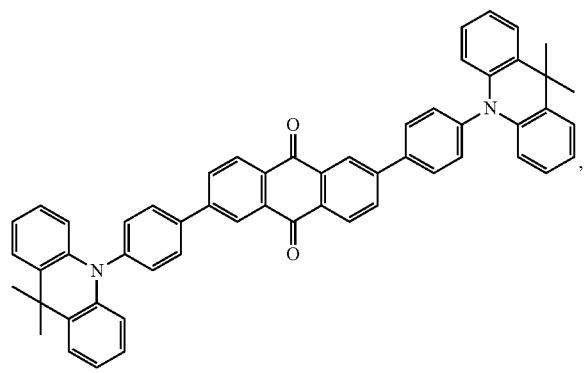
(T-74)
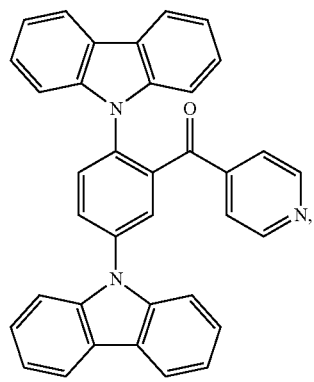
(T-75)
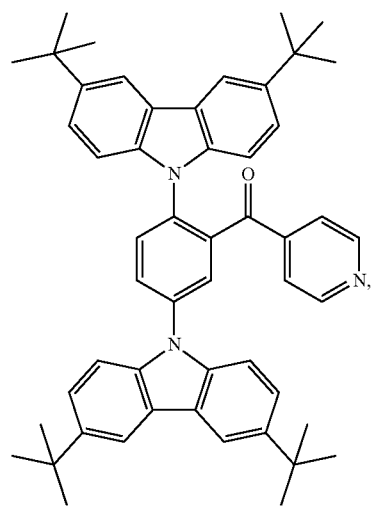
(T-76)
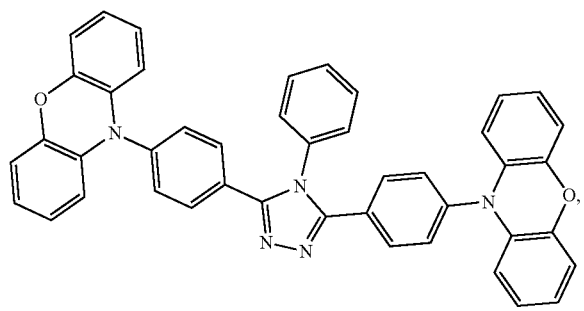
(T-77)
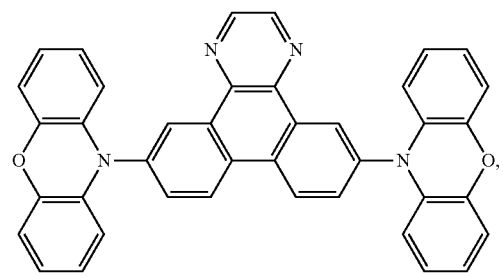
(T-78)
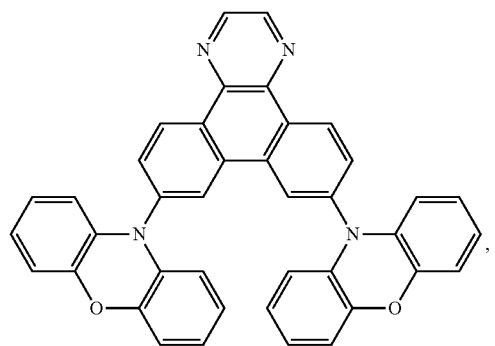

-continued
(T-79)
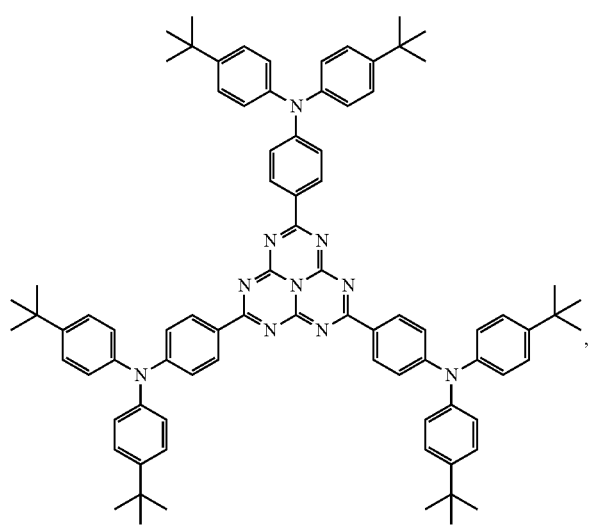
(T-80)
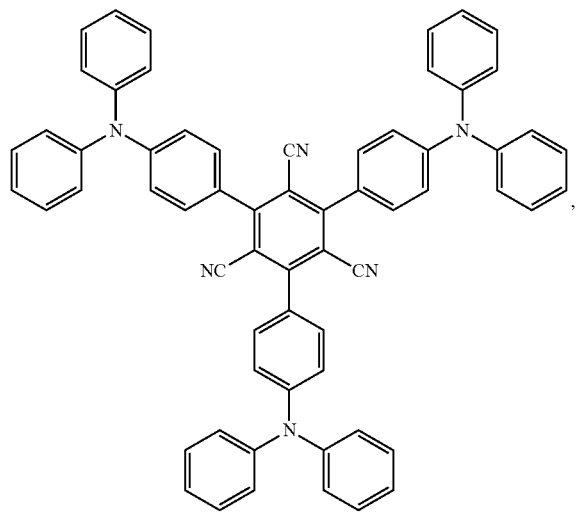
(T-81)
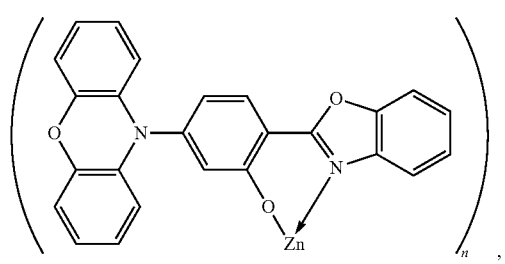
(T-82)
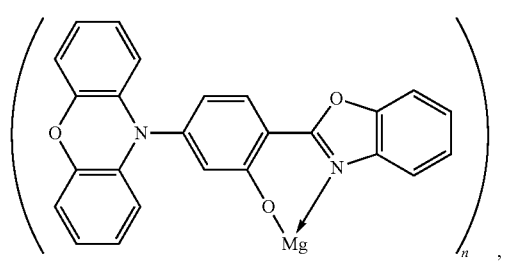
(T-83)
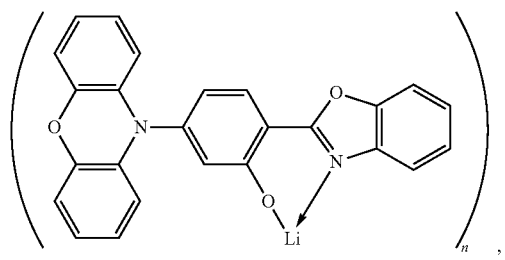
(T-84)
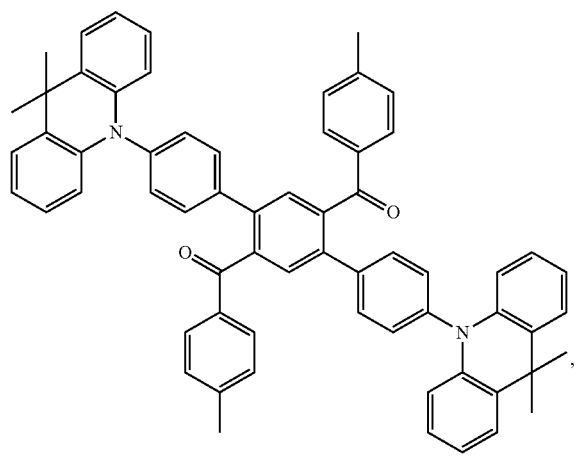

-continued
(T-85)
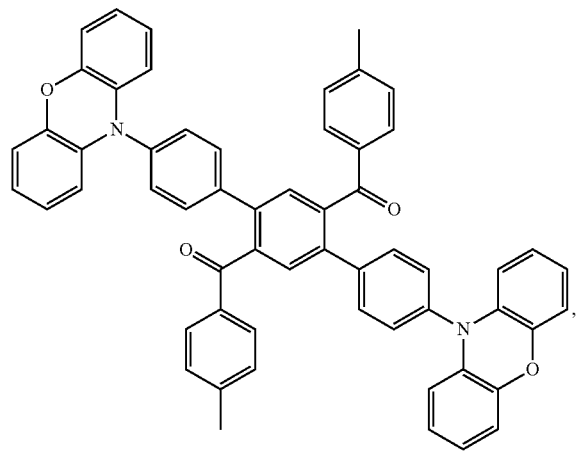
(T-86)
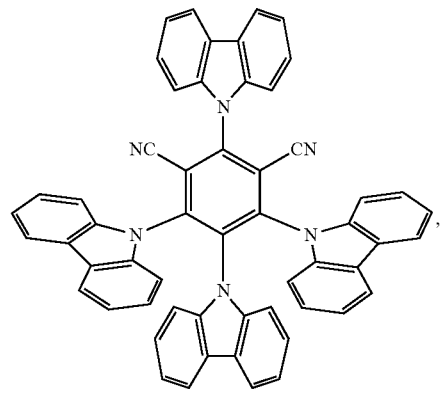
(T-87)
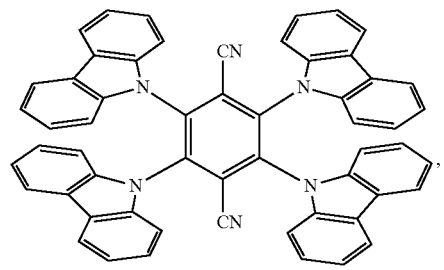
(T-88)
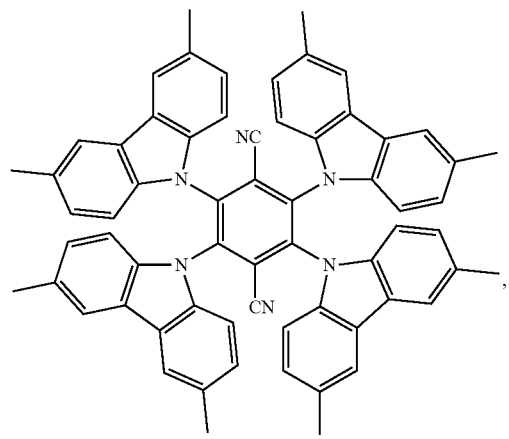
(T-89)
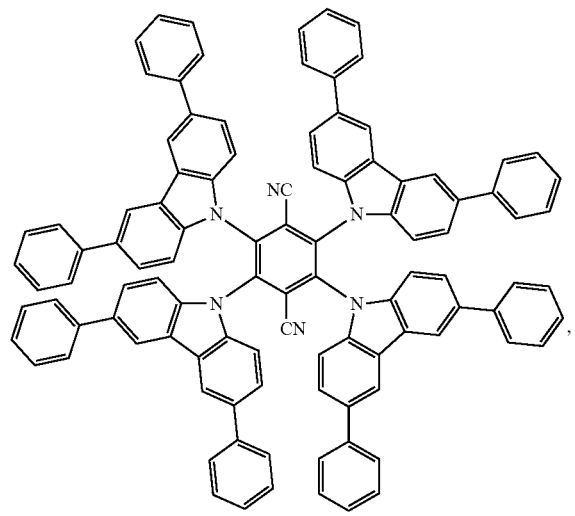
(T-90)
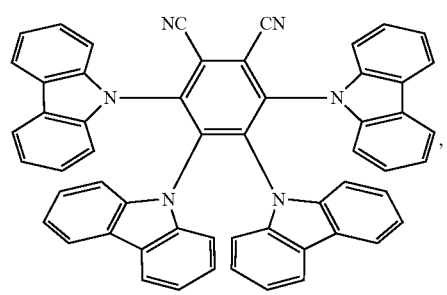

-continued
(T-91)
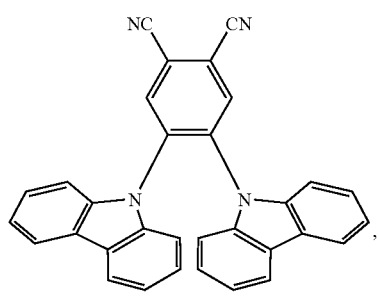
(T-92)
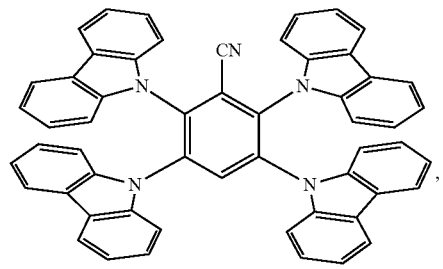
(T-93)
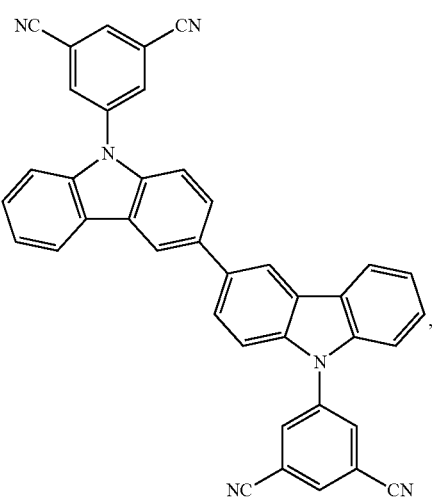
(T-94)
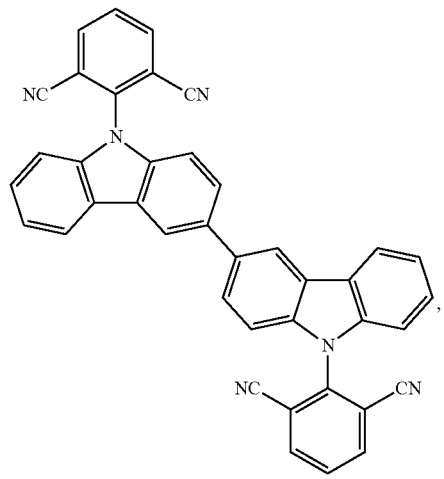
(T-95)
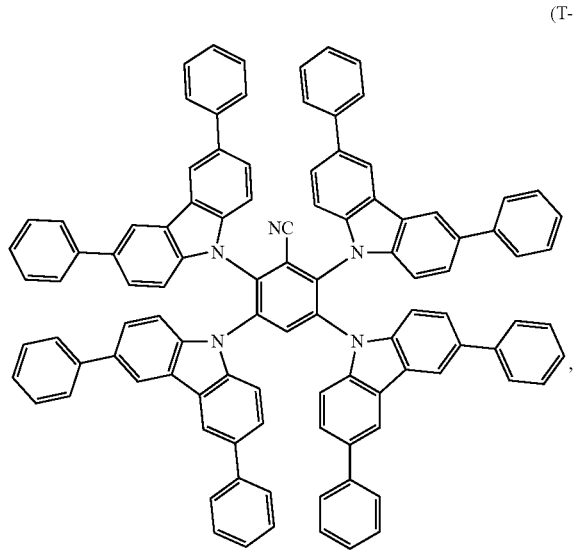
(T-96)
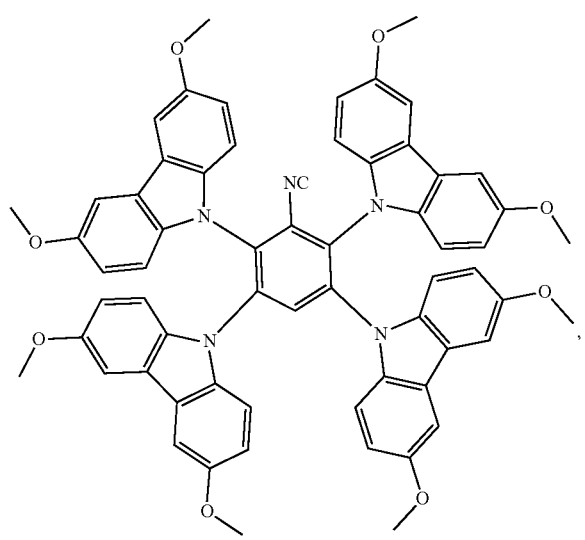

-continued
(T-97)
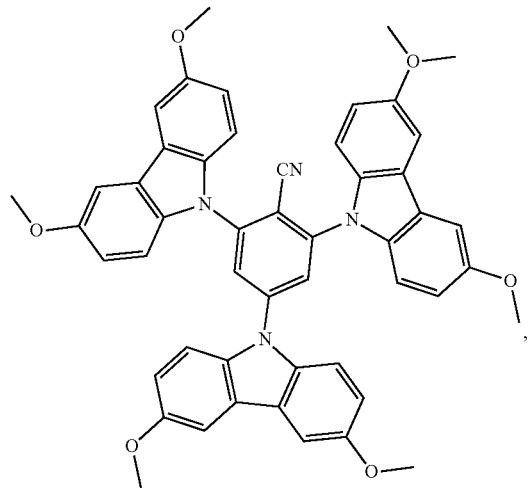
(T-98)
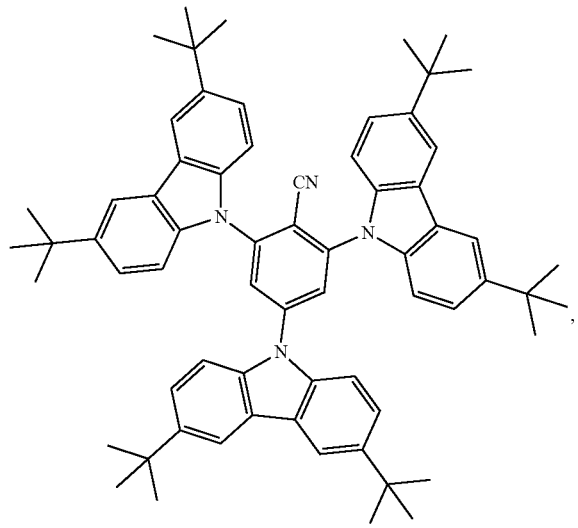
(T-99)
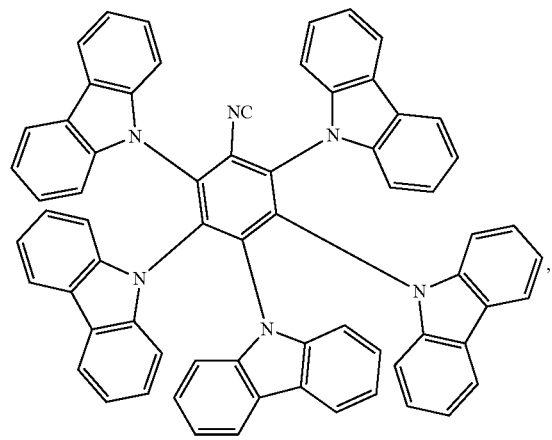
(T-100)
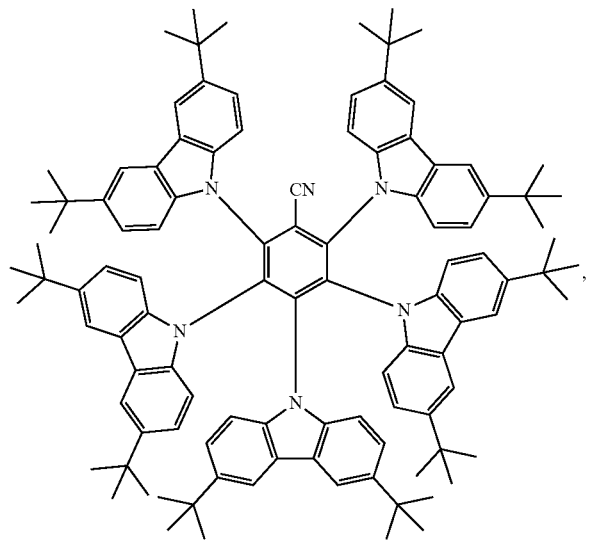
(T-101)
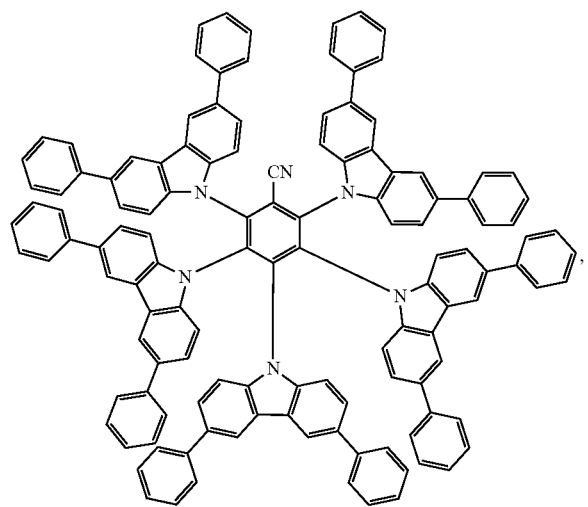
(T-102)
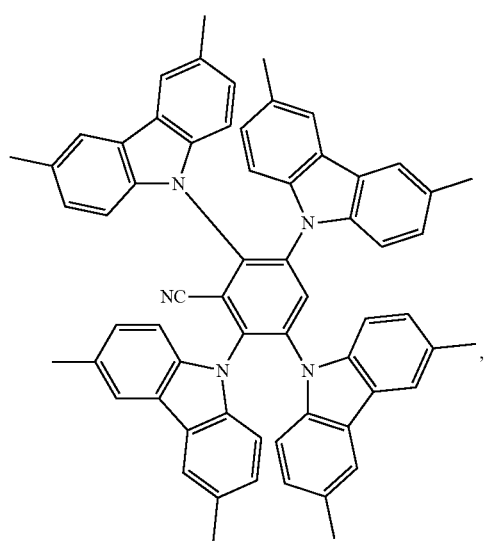

-continued
(T-103)
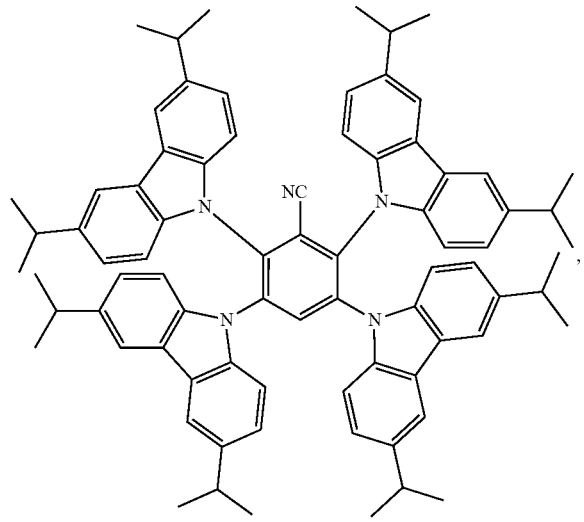
(T-104)
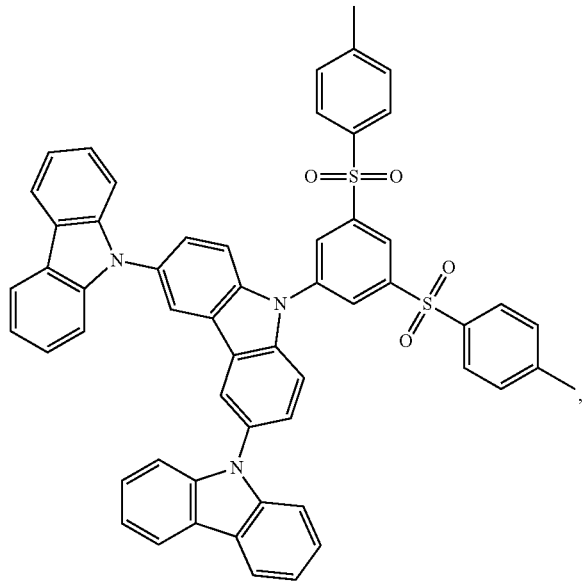
(T-105)
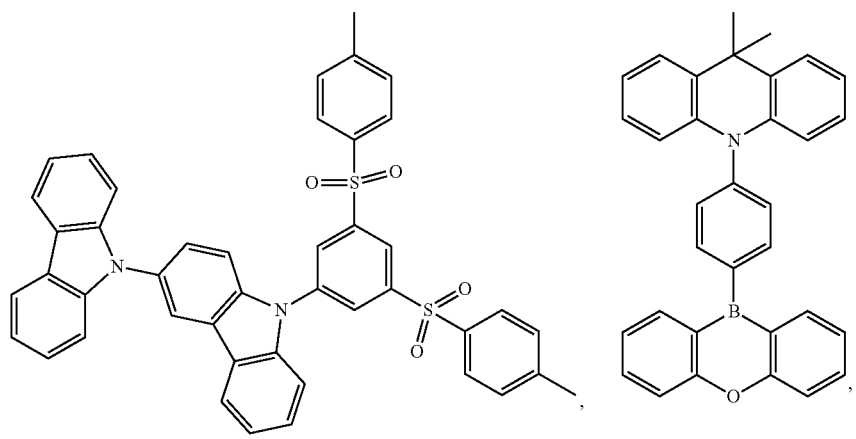
(T-106)
(T-107)
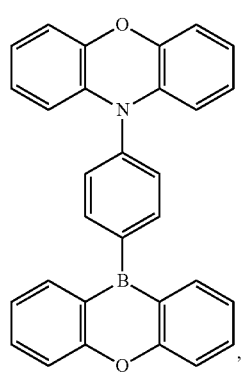
(T-108)
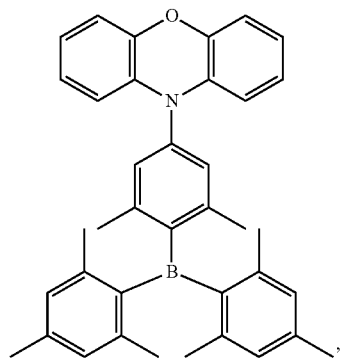

(T-109)

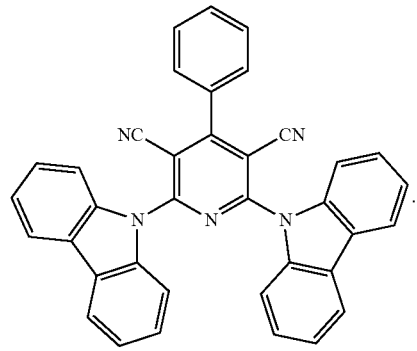

Preferably, in the aforementioned organic electroluminescent device, the guest material has a doping ratio of 0.1 wt %-50 wt %. More preferably, the guest material has a doping ratio of 1 wt %-20 wt %. Most preferably, the guest material has a doping ratio of 10 wt %.

Preferably, the aforementioned organic electroluminescent device also comprises: a first electrode, made of indium tin oxide (ITO); a hole injection layer, made of 2,3,6,7,10,11-hexacyano-1,4,5,8,9,12-hexaazobenzophenanthrene; a hole transport layer, made of N,N'-(di-1-naphthyl)-N,N'-diphenyl-1,1'-biphenyl-4,4'-diamine; an electron transport layer, made of 9,10-di-(3-(3-pyridine)-phenyl)-anthracene and quinoline lithium (Liq) in equal mass ratio; an electron injection layer, made of lithium fluoride (LiF); and a second electrode, made of metal aluminum (Al).

As for OLED devices having host material doped with guest material, an exciplex having a narrow energy gap is used as the host material to sensitize the guest material of dye molecules. Because of the small singlet-triplet energy level difference ($\Delta E_{ST}$) of the host material, the triplet state $T_1$ excitons of the host material can be effectively converted into singlet state $S_1$ excitons by Reverse Intersystem Crossing, the singlet state $S_1$ energy of the host material is passed on to the singlet state $S_1$ of the guest material of dye molecules by Forster energy transfer, and the singlet state $S_1$ excitons of the guest material of dye molecules jump back to the base state $S_0$ by radiative transition, so as to emit fluorescent light. These OLED devices increase the utilization rate of excitons and elevate the internal quantum efficiency of the devices. However, in the process of Forster energy transfer between the host material and the guest material, as the excitons have high excitation energy, severe Triple-Triplet Annihilation (TTA), Triplet-Polaron Annihilation (TPA) and Singlet-Triplet Annihilation (STA) would happen in the light-emitting layer, which leads to accelerated efficiency rolling-down of the device and shortened service life.

The technical solution of the present application has the following advantages:
1. In the organic electroluminescent device provided by the present application, the material of the light-emitting layer comprises host material and guest material, the host material is an exciplex formed by electron donor material and electron receptor material, the guest material is thermal activated delayed fluorescent material, and a singlet energy level of the host material is lower than a singlet energy level of the guest material.

The host material is an exciplex formed by electron donor material and electron receptor material, the electron donor material has a relatively deep Lowest Unoccupied Molecular Orbital (LUMO) energy level, and the electron receptor material has a relatively shallow Highest Occupied Molecular Orbital (HOMO) energy level, and when the electron donor material and the electron receptor material from an exciplex, the HOMO energy level and the LUMO energy level of the exciplex are respectively originated from the electron donor material and the electron receptor material, which causes the exciplex to have a relatively narrow energy gap and a small singlet-triplet energy level difference ($\Delta E_{ST}$), thereby effectively realizing the upward conversion of triplet state excitons of the host material to singlet state excitons and thus increasing the energy transfer rate from the host material to the guest material.

As shown in FIG. 1, the singlet energy level of the host material is lower than the singlet energy level of the guest material, the singlet state excitons of the host material can absorb heat energy from the environment so as to undergo transition to complete the energy transfer from the singlet state $S_1$ of the host material to the singlet state $S_1$ of the guest material. Meanwhile, in the process of the energy transfer, the low singlet state $S_1$ energy of the host material can prevent high-energy excitons from being generated, so as to effectively inhibit molecular bond fracture caused by high excitation energy, thereby prolonging the light-emitting service life of the device. In another aspect, as the singlet energy level of the host material is lower than the singlet energy level of the guest material, the energy of excitons during energy transfer in the light-emitting layer of the OLED device is significantly reduced, so as to effectively inhibit the phenomena of Triple-Triplet Annihilation (TTA), Triplet-Polaron Annihilation (TPA) and Singlet-Triplet Annihilation (STA) in the light-emitting layer of the device, thereby alleviating the efficiency rolling-down of the device and prolonging the service life of the device.

The guest material is thermal activated delayed fluorescent (TADF) material, in one aspect, it can receive the energy transferred from the singlet state excitons of the host material; in another aspect, because TADF material has small $\Delta E_{ST}$, the TADF material can utilize part of the triplet state excitons transferred from the host material by Dexter excitation transfer (electron exchange excitation transfer), and convert these triplet state excitons into singlet state excitons by Reverse Intersystem Crossing before the singlet state excitons jump back to the base state by radiative transition, so as to realize high quantum efficiency of device.

Therefore, the organic electroluminescent device provided by the present application has significantly alleviated phenomenon of efficiency rolling-down, prolonged light-emitting service life and high light-emitting efficiency for the device, which can realize long-time, stable and high-efficiency light-emitting.

2. In the organic electroluminescent device provided by the present application, the energy level difference between the singlet energy level of the guest material and the singlet energy level of the host material is less than 0.3 eV, so that the host material in the light-emitting layer under the influence of environmental heat can efficiently transfer the singlet state energy of the host material to the singlet state of the guest material, thereby increasing the efficiency of energy transfer in the device.

3. In the organic electroluminescent device provided by the present application, the energy level difference between the singlet energy level of the host material and the triplet energy level of the host material is less than 0.15 eV; the energy level difference between the singlet energy level of the guest material and the triplet energy level of the guest material is less than 0.3 eV.

The host material and the guest material both have small singlet-triplet energy level difference, which promotes the Reverse Intersystem Crossing from triplet state to singlet state in both the host material and the guest material, thereby increasing the energy transfer rate from the host material to the guest material and the exciton utilization rate in the light-emitting layer.

4. The electron donor material has a singlet energy level higher than the singlet energy level of the guest material, and/or the electron receptor material has a singlet energy level higher than the singlet energy level of the guest material, which is in favor of promoting energy transfer from the host material to the guest material and preventing reversed energy transfer from the guest material to the host material, thereby increasing the light-emitting efficiency of the device and effectively alleviate the efficiency rolling-down.

5. The electron donor material and the electron receptor material provided by the present application have a mass ratio of 1:9 to 9:1. More preferably, this mass ratio is 1:5 to 5:1. Most preferably, this mass ratio is 1:1. By setting the mass ratio between the electron donor material and the electron receptor material within the aforementioned range, interaction among molecules at excitation state can be promoted, so that the forming of the exciplex host material can be promoted. Especially, when this mass ratio is set to be 1:1, the effect of promoting the interaction among molecules at excitation state is optimal.

6. The guest material provided by the present application has a doping ratio of 0.1 wt %-50 wt %; more preferably, the guest material has a doping ratio of 1 wt %-20 wt %; most preferably, the guest material has a doping ratio of 10 wt %. By setting the doping ratio of the thermal activated delayed fluorescent material serving as the guest material within the aforementioned range, interaction between the guest material and the host material is promoted, which is more in favor of transferring the singlet state energy of the host material to the singlet state energy of the guest material. Especially, when this doping ratio is set to be 10 wt %, the effect of promoting the interaction between the guest material and the host material is optimal.

BRIEF DESCRIPTION OF THE DRAWINGS

In order to more clearly describe the technical solutions in the specific embodiments of the present application or in the prior art, hereinafter, the appended drawings used for describing the specific embodiments or the prior art will be briefly introduced. Apparently, the appended drawings described below are only directed to some embodiments of the present disclosure, and for a person skilled in the art, without expenditure of creative labor, other drawings can be derived on the basis of these appended drawings.

DETAILED DESCRIPTION OF THE INVENTION

A clear and complete description of the technical solution of the present application is given below, in conjunction with the appended drawings. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In the description of the present application, it should be noted that, terms such as "first", "second" are merely for the purpose of description and are not to be construed as an indication or implication of relative importance thereof.

The present application can be implemented in many different forms and should not be interpreted to be limited to the embodiment described herein. On the contrary, by providing the embodiment, the present application is made complete and thorough, and the inventive concept of the present application is sufficiently conveyed to a person skilled in the art, wherein the present application is only defined by the claims. In the appended drawing, for the sake of clarity, dimensions and relative sizes of layers and areas might be exaggerated. It should be understood that, when one element such as a layer, an area or a substrate is described as "formed on" or "disposed on" another element, this one element may be disposed directly on that another element, or intermediate element(s) may also exist therebetween. On the contrary, when one element is described as "formed directly on" or "disposed directly on" another element, no intermediate element(s) exist therebetween.

Embodiment 1

Figure 2:
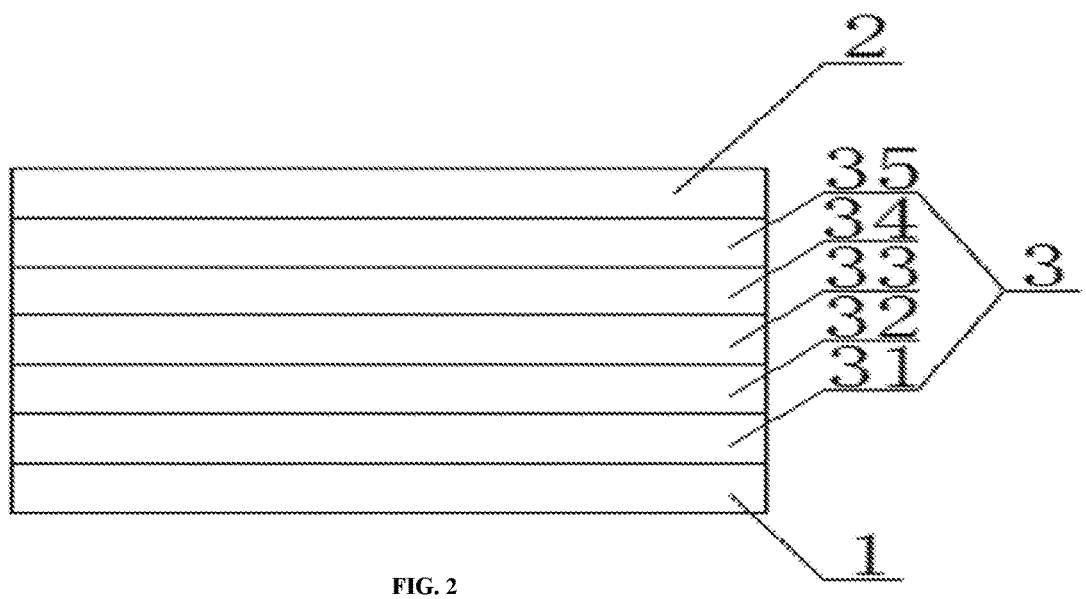
FIG. 2 is a structural schematic view of the organic electroluminescent device in Embodiment 1 of the present application.

The present embodiment provides an organic electroluminescent device, as shown in FIG. 2, comprises a first electrode 1, a second electrode 2 and an organic functional layer 3 disposed between the first electrode 1 and the second electrode 2. The first electrode 1 is an anode, the second electrode 2 is a cathode, the organic functional layer 3 comprises a hole injection layer 31, a hole transport layer 32, a light-emitting layer 33, an electron transport layer 34 and an electron injection layer 35 stacked in sequence from the bottom to top direction.

The light-emitting layer 33 comprises host material doped with guest material. The host material is an exciplex having both an electron transport function and a hole transport function. The guest material is thermal activated delayed fluorescent material. The thermal activated delayed fluorescent material has a doping ratio (the ratio of the mass of the thermal activated delayed fluorescent material to the total mass of the light-emitting layer material) of 0.1 wt %-50 wt %, preferably 1 wt %-20 wt %. The exciplex in the light-emitting layer 33 is formed by mixing electron donor material and electron receptor material, and the electron donor material and the electron receptor material in the exciplex have a mass ratio of 1:9 to 9:1, preferably 1:5 to 5:1.

The electron donor material has the following molecular structure:

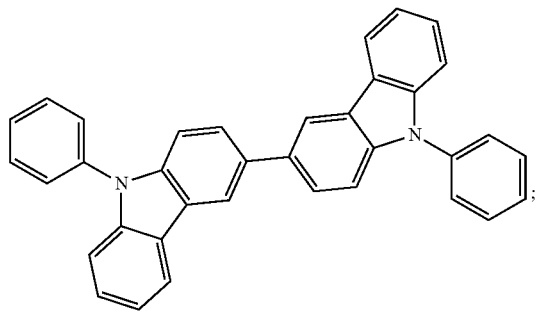

(D-20)

The electron receptor material has the following molecular structure:

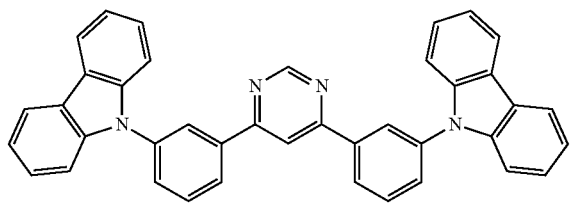

(A-30)

The thermal activated delayed fluorescent material has the following molecular structure:

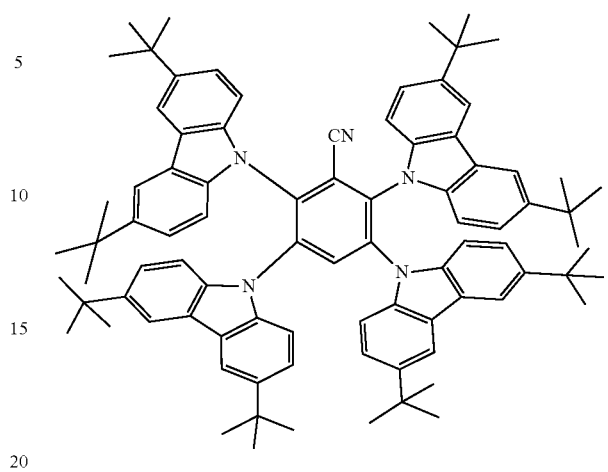

(T-3)

In the organic electroluminescent device, the anode is made of ITO material; the hole injection layer 31 is made of 2,3,6,7,10,11-hexocyanyl-1,4,5,8,9,12-hexaazobenzo-phenanthrene (abbreviated as HATCN), the hole transport layer 32 is made of N,N'-di-(1-naphthyl)-N,N'-diphenyl-1,1'-biphenyl-4,4'-diamine (abbreviated as NPB); the electron transport layer 34 is made of 9,10-di-(3-(3-pyridine)-phenyl)-anthracene (abbreviated as DPyPA) and quinoline lithium (Liq) in equal mass ratio: the electron injection layer 35 is made of electron injection material LiF: the cathode is made of metal Al. The host material in the light-emitting layer 33 is an exciplex formed by mixing the electron donor material shown by formula (D-20) and the electron receptor material shown by formula (A-30) in a mass ratio of 1:1; the guest material in the light-emitting layer 33 is thermal activated delayed fluorescent material shown by formula (T-3), and the compound shown by formula (T-3) has a doping ratio of 10 wt %.

The organic electroluminescent device has the following specific structure:
ITO/HATCN (5 nm)/NPB (30 nm)/TCTA (10 nm)/
45 wt % (D-20): 45 wt % (A-30): 10 wt % (T-3) (30 nm)/
50 wt % DpyPA: 50 wt % Liq (30 nm)/LiF (0.5 nm)/Al (150 nm).

When the chemical composition and molecular structure of a kind of material is given, the singlet energy level and triplet energy level of this kind of material can be directly and unambiguously determined by commonly known measurement means and calculation method. In the specific embodiments of the present application, the methods for determining the singlet energy level and triplet energy level of the used material are as follows:

The singlet energy levels of the exciplex, the electron donor material, the electron receptor material and the thermal activated delayed fluorescent material in the light-emitting layer 33 are calculated by the following method: measuring the thin-film photoluminescent spectrum of the exciplex, the electron donor material, the electron receptor material or the thermal activated delayed fluorescent material, acquiring the onset wavelength $\lambda_{onset}$ at the leftmost position of the fluorescent emission peak, and then calculating the corresponding singlet energy level by using the formula $S1=1241/\lambda_{onset}$.

The triplet energy levels of the exciplex and the thermal activated delayed fluorescent material in the light-emitting layer 33 are calculated by the following method: measuring the thin-film photoluminescent spectrum under low temperature (77 K) of the exciplex or the thermal activated delayed fluorescent material, acquiring the onset wavelength $\lambda_{onset}$ at the leftmost position of the phosphorescent emission peak, and then calculating the corresponding triplet energy level by using the formula $T1=1241/\lambda_{onset}$.

The singlet energy levels and triplet energy levels of the respective compounds in the present embodiment are listed in Table 1:

TABLE 1

| Material molecules | Singlet energy level (eV) | Triplet energy level (eV) |
| --- | --- | --- |
| Exciplex host material formed by (D-20) and (A-30) | 2.86 | 2.78 |
| Electron donor material shown by (D-20) | 3.14 | 2.90 |
| Electron receptor material shown by (A-30) | 3.05 | 2.76 |
| Thermal activated delayed fluorescent material shown by (T-3) | 2.90 | 2.63 |

Figure 1:
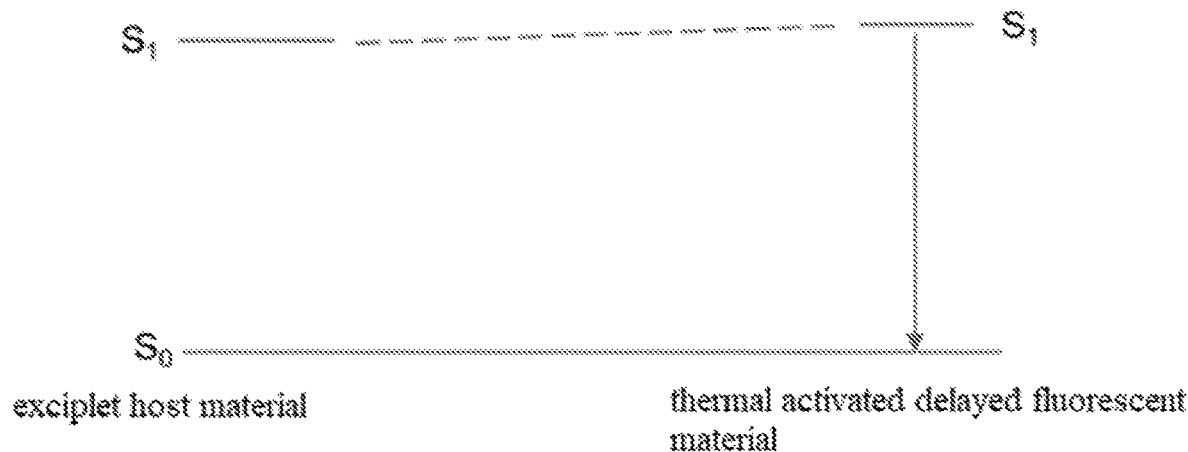
FIG. 1 is a light-emitting principle diagram of the organic electroluminescent device provided in Embodiment 1 of the present application.

In the organic electroluminescent device provided by the present embodiment, the host material of the light-emitting layer 33 is an exciplex formed by electron donor material and electron receptor material. The singlet energy level of the exciplex is lower than the singlet energy level of the thermal activated delayed fluorescent material serving as the guest doping material, while the singlet energy levels of the electron donor material and the electron receptor material forming the exciplex are both higher than the singlet energy level of the thermal activated delayed fluorescent material. The light-emitting mechanism of the above organic electroluminescent device is shown in FIG. 1: the host material of the light-emitting layer 33 absorbs environmental heat, so as to cause the singlet state $S_1$ energy of the host material to be transferred to the singlet state $S_1$ of the guest material, and then the singlet state excitons of the guest material undergo radiative transition such that the device emits fluorescent light. Because the singlet state energy level of the exciplex host material is low, high-energy excitons can be prevented from being generated, so as to effectively inhibit molecular bond fracture caused by high excitation energy. Secondly, as the singlet state $S_1$ energy level of the exciplex host material in the light-emitting layer 33 is lower than the singlet state $S_1$ energy level of the thermal activated delayed fluorescent material serving as the guest material, in the process of energy transfer from the host material to the guest material, the energy of excitons in the light-emitting layer 33 is effectively reduced, so as to inhibit Triple-Triplet Annihilation (TTA), Triplet-Polaron Annihilation (TPA) and Singlet-Triplet Annihilation (STA) of excitons in the light-emitting layer 33, thereby effectively alleviating the efficiency rolling-down of the organic electroluminescent device and prolonging the service life of the device. As the singlet state $S_1$ energy levels of the electron donor material and the electron receptor material forming the exciplex are both higher than the singlet state $S_1$ energy level of the thermal activated delayed fluorescent material serving as the guest material, the singlet state $S_1$ energy of the exciplex host material can be highly efficiently transferred to the TADF guest material, thereby increasing the light-emitting efficiency of the device.

The materials used in the organic functional layer 3 of the organic electroluminescent device of the present embodiment have the following structures:

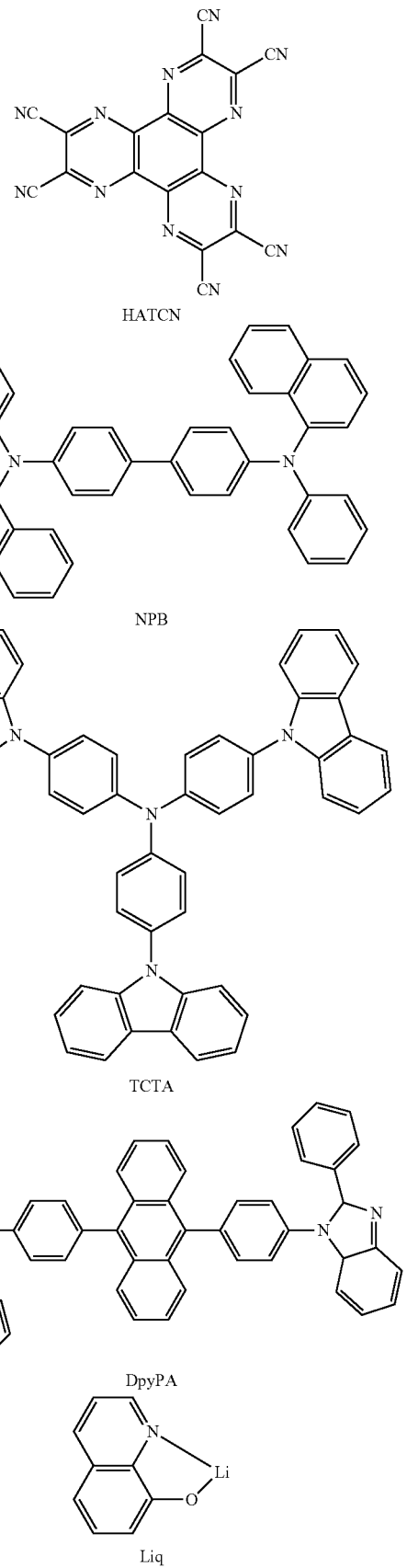

Embodiment 2

The present embodiment provides an organic electroluminescent device with a structure similar to Embodiment 1, and this organic electroluminescent device only differs from the organic electroluminescent device provided in Embodiment 1 in that the electron donor material (D-20) and the electron receptor material (A-30) forming the exciplex have a mass ratio of 7:3. The organic electroluminescent device has the following device structure:
ITO/HATCN (5 nm)/NPB (30 nm)/TCTA (10 nm)/
63 wt % (D-20): 27 wt % (A-3): 10 wt % (T-3) (30 nm)/
50 wt %/DpyPA: 50 wt % Liq (30 nm)/LiF (0.5 nm)/Al (150 nm).

The exciplex has a singlet energy level of 2.86 eV and a triplet energy level of 2.78 eV; the thermal activated delayed fluorescent material (T-3) has a singlet energy level of 2.90 eV and a triplet energy level of 2.63 eV.

Embodiment 3

The present embodiment provides an organic electroluminescent device with a structure similar to Embodiment 1, and this organic electroluminescent device only differs from the organic electroluminescent device provided in Embodiment 1 in that the host material of the light-emitting layer 33 is an exciplex formed by the electron donor material shown by formula (D-20) and the electron receptor material shown by formula (A-19). The electron donor material (D-20) and the electron receptor material (A-19) have a mass ratio of 1:1; the thermal activated delayed fluorescent material (T-3) serving as the guest material in the light-emitting layer 33 has a doping ratio of 20 wt %. The organic electroluminescent device has the following device structure:
ITO/HATCN (5 nm)/NPB (30 nm)/TCTA (10 nm)/
40 wt % (D-20): 40 wt % (A-19): 20 wt % (T-3) (30 nm)/
50 wt % DpyPA: 50 wt % Liq (30 nm)/LiF (0.5 nm)/Al (150 nm).

The exciplex has a singlet energy level of 2.86 eV and a triplet energy level of 2.73 eV; the thermal activated delayed fluorescent material (T-3) has a singlet energy level of 2.90 eV and a triplet energy level of 2.63 eV.

Comparison Example 1

The present comparison example provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material shown by formula (D-1) and the electron receptor material shown by formula (A-17). The electron donor material (D-1) and the electron receptor material (A-17) have a mass ratio of 1:1. The thermal activated delayed fluorescent material (T-3) serving as the guest material in the light-emitting layer 33 has a doping ratio of 10 wt %. The organic electroluminescent device has the following device structure:
ITO/HATCN (5 nm)/NPB (30 nm)/TCTA (10 nm)/
45 wt % (D-1): 45 wt % (A-17): 10 wt % (T-3) (30 nm)/
50 wt % DpyPA: 50 wt % Liq (30 nm)/LiF (0.5 nm)/Al (150 nm).

The exciplex has a singlet energy level of 2.96 eV and a triplet energy level of 2.91 eV. The electron donor material (D-1) has a singlet energy level of 3.10 eV, and the electron receptor material (A-17) has a singlet energy level of 3.04 eV. The thermal activated delayed fluorescent material (T-3) has a singlet energy level of 2.90 eV and a triplet energy level of 2.63 eV.

Comparison Example 2

The present comparison example provides an organic electroluminescent device with a structure similar to Embodiment 1. The organic electroluminescent device differs from the organic electroluminescent device provided in Embodiment 1 in that the host material of the light-emitting layer 33 is an exciplex formed by the electron donor material shown by formula (D-1) and the electron receptor material shown by formula (A-17). The electron donor material (D-1) and the electron receptor material (A-17) have a mass ratio of 6:4. The thermal activated delayed fluorescent material (T-3) serving as the guest material in the light-emitting layer 33 has a doping ratio of 10 wt %. The organic electroluminescent device has the following device structure:
ITO/HATCN (5 nm)/NPB (30 nm)/TCTA (10 nm)/
54 wt % (D-1): 36 wt % (A-17): 10 wt % (T-3) (30 nm)/
50 wt % DpyPA: 50 wt % Liq (30 nm)/LiF (0.5 nm)/Al (150 nm).

The exciplex has a singlet energy level of 2.96 eV and a triplet energy level of 2.91 eV. The thermal activated delayed fluorescent material (T-3) has a singlet energy level of 2.90 eV and a triplet energy level of 2.63 eV.

Comparison Example 3

The present comparison example provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material shown by formula (D-1) and the electron receptor material shown by formula (A-17). The electron donor material (D-1) and the electron receptor material (A-17) have a mass ratio of 2:1. The thermal activated delayed fluorescent material (T-3) serving as the guest material in the light-emitting layer 33 has a doping ratio of 40 wt %. The organic electroluminescent device has the following device structure:
ITO/HATCN (5 nm)/NPB (30 nm)/TCTA (10 nm)/
40 wt % (D-1): 20 wt % (A-17): 40 wt % (T-3) (30 nm)/
50 wt % DpyPA: 50 wt % Liq (30 nm)/LiF (0.5 nm)/Al (150 nm).

The exciplex has a singlet energy level of 2.96 eV and a triplet energy level of 2.91 eV. The thermal activated delayed fluorescent material (T-3) has a singlet energy level of 2.90 eV and a triplet energy level of 2.63 eV.

Comparison Example 4

The present comparison example provides an organic electroluminescent device with a structure similar to that of Embodiment 1. The organic electroluminescent device only differs from the organic electroluminescent device provided in Embodiment 1 in that the host material of the light-emitting layer 33 is 4,4-N,N'-dicarbazole-biphenyl (abbreviated as mCBP). The thermal activated delayed fluorescent material (T-3) serving as the guest material in the light-emitting layer 33 has a doping ratio of 10 wt %. The organic electroluminescent device has the following device structure:
ITO/HATCN (5 nm)/NPB (30 nm)/TCTA (10 nm)/
90 wt % (mCBP): 10 wt % (T-3) (30 nm)/
50 wt % DpyPA: 50 wt % Liq (30 nm)/LiF (0.5 nm)/Al (150 nm).

The mCBP material has a singlet energy level of 3.21 eV and a triplet energy level of 3.01 eV. The thermal activated delayed fluorescent material (T-3) has a singlet energy level of 2.90 eV and a triplet energy level of 2.63 eV. The mCBP material has the following molecular structure:

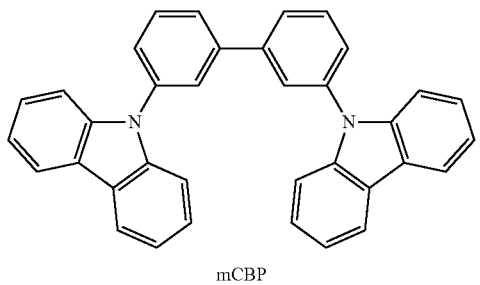 [SMILES: c1cc(-c2cccc(-n3c4ccccc4c4ccccc43)c2)cc(-n2c3ccccc3c3ccccc32)c1]

mCBP

Comparison Example 5

The present comparison example provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material shown by formula (D-20) and the electron receptor material shown by formula (A-30). The electron donor material (D-20) and the electron receptor material (A-30) have a mass ratio of 1:1; there is no guest material doping in the light-emitting layer 33, and the light is emitted by the exciplex itself. The organic electroluminescent device has the following device structure:
ITO/HATCN (5 nm)/NPB (30 nm)/TCTA (10 nm)/
50 wt % (D-20): 50 wt % (A-30) (30 nm)/
50 wt % DpyPA: 50 wt % Liq (30 nm)/LiF (0.5 nm)/Al (150 nm).

The exciplex has a singlet energy level of 2.86 eV and a triplet energy level of 2.76 eV. The electron donor material (D-20) has a singlet energy level of 3.14 eV, and the electron receptor material (A-30) has a singlet energy level of 3.05 eV. The light-emitting wavelength of the device is 468 nm.

Figure 3:
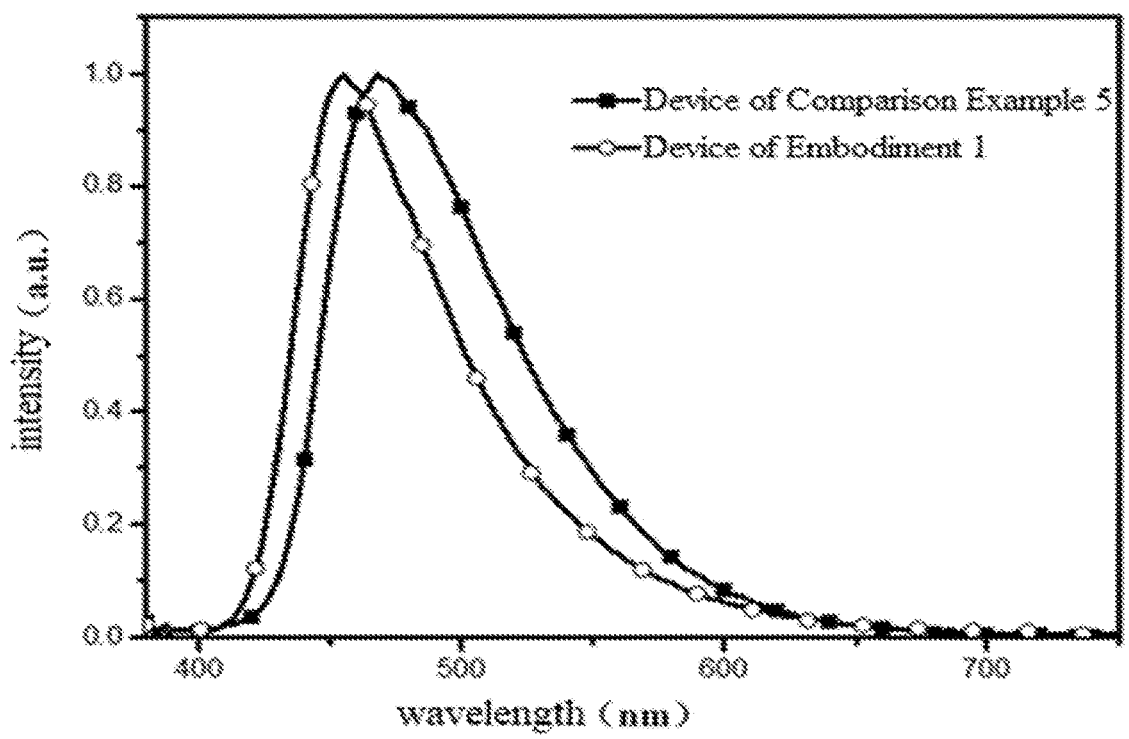
FIG. 3 is an electroluminescent spectrogram of the organic electroluminescent devices in Embodiment 1 of the present application and Comparison Example 5.

FIG. 3 shows an electroluminescent spectrogram of the organic electroluminescent device provided in this Comparison Example 5 and the organic electroluminescent device provided in Embodiment 1. As seen from FIG. 3, in comparison with the exciplex doped with thermal activated delayed fluorescent material, the light-emitting spectrum of the light emitted only by the exciplex itself has significant red-shift, which indicates that the singlet energy level of the exciplex is lower than the singlet energy level of the thermal activated delayed fluorescent material, and proves energy would be transferred from the exciplex host material with a lower singlet energy level to the thermal activated delayed fluorescent dye material with a higher singlet energy level.

Test Example 1

Tests are carried out on characteristics such as voltage, luminance, efficiency, light-emitting spectrum of the organic electroluminescent devices provided by Embodiment 1-3 and Comparison Examples 1-4, by synchronous testing with PR650 spectral scanning luminometer and Keithley K2400 digital source meter system. The test results are listed in Table 2 below:

TABLE 2

Performance tests of organic electroluminescent devices

| | Singlet state $S_1$ energy level of host material | Singlet state $S_1$ energy level of thermal activated delayed fluorescent material | Light-emitting wavelength of the device | Service life LT50 at 500 cd/m$^2$ |
|---|---|---|---|---|
| Embodiment 1 | 2.86 eV | 2.90 eV | 460 nm | 277 h |
| Embodiment 2 | 2.86 eV | 2.90 eV | 460 nm | 253 h |
| Embodiment 3 | 2.86 eV | 2.90 eV | 460 nm | 222 h |
| Comparison Example 1 | 2.96 eV | 2.90 eV | 460 nm | 156 h |
| Comparison Example 2 | 2.96 eV | 2.90 eV | 460 nm | 147 h |
| Comparison Example 3 | 2.96 eV | 2.90 eV | 460 nm | 140 h |
| Comparison Example 4 | 3.21 eV | 2.90 eV | 460 nm | 37 h |

In Table 2, the organic electroluminescent devices of Embodiments 1-3 use exciplex having a singlet state $S_1$ energy level lower than that of the TADF material as the host material; while the devices in Comparison Examples 1-3 use exciplex having a singlet state $S_1$ energy level higher than that of the TADF material as the host material. In comparison with the devices of Comparison Examples 1-3, the exciplex having a lower singlet state $S_1$ energy level makes the light-emitting service life of the device significantly prolonged. When the electron donor material and the electron receptor material have a mass ratio of 1:1 and the TADF material is doping at a ratio of 10 wt %, the device has the optimal light-emitting service life.

Figure 4:
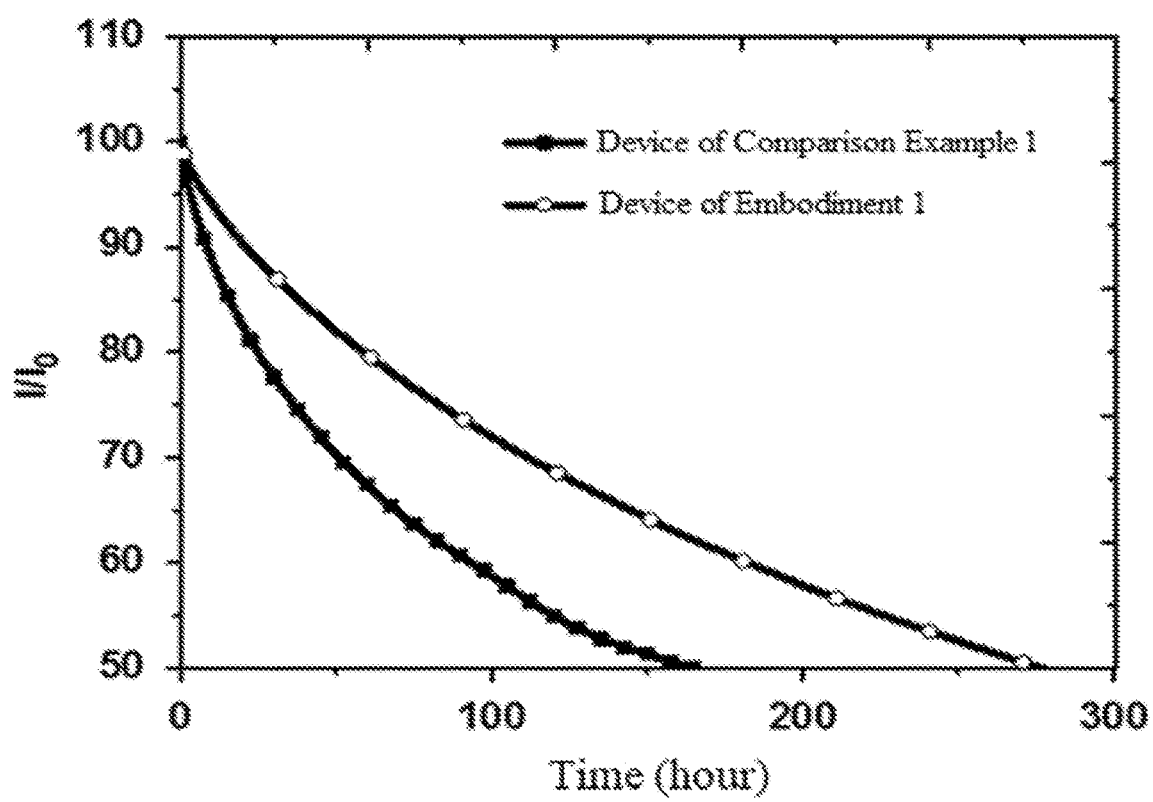
FIG. 4 is a service life comparison chart of the organic electroluminescent devices in Embodiment 1 of the present application and Comparison Example 1.
Figure 5:
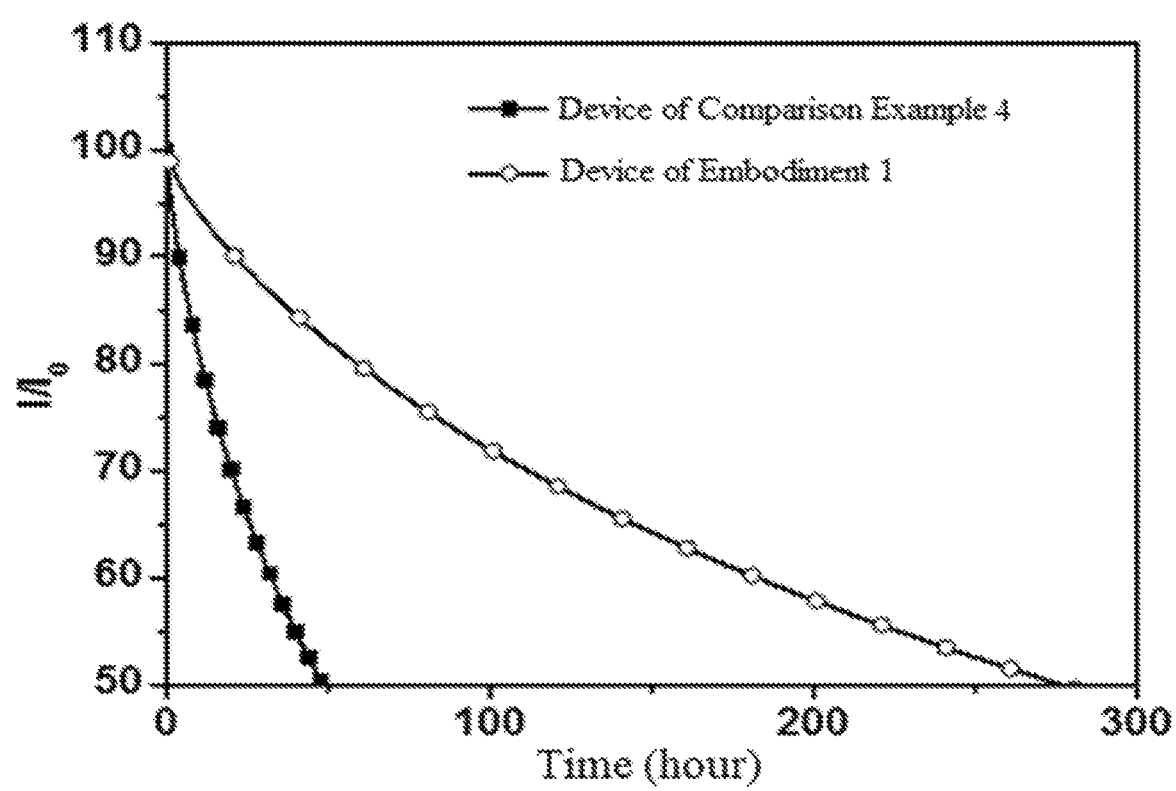
FIG. 5 is a service life comparison chart of the organic electroluminescent devices in Embodiment 1 of the present application and Comparison Example 4.

FIG. 4 shows service life comparison between the organic electroluminescent devices in Embodiment 1 and Comparison Example 1 at 500 cd/m$^2$. When the singlet energy level of the exciplex serving as the host material in the light-emitting layer is lower than the singlet energy level of the doping thermal activated delayed fluorescent material, high-energy excitons can be prevented from being generated, so as to inhibit molecular bond fracture caused by high excitation energy, and the energy of excitons in the light-emitting layer is reduced, so as to inhibit Triple-Triplet Annihilation (TTA), Triplet-Polaron Annihilation (TPA) and Singlet-Triplet Annihilation (STA), thereby helping to alleviate the efficiency rolling-down of the device and effectively prolong the service life of the organic electroluminescent device. FIG. 5 shows service life comparison between the organic electroluminescent devices in Embodiment 1 and Comparison Example 4 at 500 cd/m$^2$. When using traditional host material with a higher singlet state $S_1$ energy level doped with TADF material, severe molecular bond fracture in the device would easily be caused, and the phenomena of Triple-Triplet Annihilation (TTA), Triplet-Polaron Annihilation (TPA) and Singlet-Triplet Annihilation (STA) would intensify, leading to sharp shortening of the light-emitting service life of the device.

Embodiment 4

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-1) and the electron receptor material (A-18). The electron donor material (D-1) and the electron receptor material (A-18) have a mass ratio of 6:4. The guest material in the light-emitting layer 33 is thermal activated delayed fluorescent material (T-3) and the guest material has a doping ratio of 10 wt %. The organic electroluminescent device has the following device structure:
ITO/HATCN (5 nm)/NPB (30 nm)/TCTA (10 nm)/
54 wt % (D-1): 36 wt % (A-18): 10 wt % (T-3) (30 nm)/
50 wt % DpyPA: 50 wt % Liq (30 nm)/LiF (0.5 nm)/Al (150 nm).

The exciplex has a singlet energy level of 2.87 eV and a triplet energy level of 2.75 eV. The thermal activated delayed fluorescent material has a singlet energy level of 2.90 eV and a triplet energy level of 2.63 eV. The light-emitting wavelength of the device is 460 nm, and at 500 cd/m$^2$, the service life LT50 is 188 h.

Embodiment 5

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-3) and the electron receptor material (A-30). The electron donor material (D-3) and the electron receptor material (A-30) have a mass ratio of 6:4. The guest material in the light-emitting layer 33 is thermal activated delayed fluorescent material (T-3) and the guest material has a doping ratio of 10 wt %. The organic electroluminescent device has the following device structure:
ITO/HATCN (5 nm)/NPB (30 nm)/TCTA (10 nm)/
54 wt % (D-3): 36 wt % (A-30): 10 wt % (T-3) (30 nm)/
50 wt % DpyPA: 50 wt % Liq (30 nm)/LiF (0.5 nm)/Al (150 nm).

The exciplex has a singlet energy level of 2.82 eV and a triplet energy level of 2.71 eV; the thermal activated delayed fluorescent material has a singlet energy level of 2.90 eV and a triplet energy level of 2.63 eV. The light-emitting wavelength of the device is 460 nm, and at 500 cd/m$^2$, the service life LT50 is 194 h.

Embodiment 6

The present embodiment provides an organic electroluminescent device with a structure similar to Embodiment 1. The organic electroluminescent device only differs from the organic electroluminescent device provided in Embodiment 1 in that the host material of the light-emitting layer 33 is an exciplex formed by the electron donor material (D-9) and the electron receptor material (A-33). The electron donor material (D-9) and the electron receptor material (A-33) have a mass ratio of 6:4. The guest material in the light-emitting layer 33 is thermal activated delayed fluorescent material (T-3) and the guest material has a doping ratio of 10 wt %. The organic electroluminescent device has the following device structure:
ITO/HATCN (5 nm)/NPB (30 nm)/TCTA (10 nm)/
54 wt % (D-9): 36 wt % (A-33): 10 wt % (T-3) (30 nm)/
50 wt % DpyPA: 50 wt % Liq (30 nm)/LiF (0.5 nm)/Al (150 nm).

The exciplex has a singlet energy level of 2.85 eV and a triplet energy level of 2.73 eV; the thermal activated delayed fluorescent material has a singlet energy level of 2.90 eV and a triplet energy level of 2.63 eV. The light-emitting wavelength of the device is 460 nm, and at 500 cd/m$^2$, the service life LT50 is 194 h.

Embodiment 7

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-20) and the electron receptor material (A-33). The electron donor material (D-20) and the electron receptor material (A-33) have a mass ratio of 6:4. The guest material in the light-emitting layer 33 is thermal activated delayed fluorescent material (T-3) and the guest material has a doping ratio of S10 wt %. The organic electroluminescent device has the following device structure:
ITO/HATCN (5 nm)/NPB (30 nm)/TCTA (10 nm)/
54 wt % (D-20): 36 wt % (A-33): 10 wt % (T-3) (30 nm)/
50 wt % DpyPA: 50 wt % Liq (30 nm)/LiF (0.5 nm)/Al (150 nm).

The exciplex has a singlet energy level of 2.81 eV and a triplet energy level of 2.72 eV; the thermal activated delayed fluorescent material has a singlet energy level of 2.90 eV and a triplet energy level of 2.63 eV. The light-emitting wavelength of the device is 460 nm, and at 500 cd/m$^2$, the service life LT50 is 234 h.

Embodiment 8

The present embodiment provides an organic electroluminescent device with a structure similar to Embodiment 1. The organic electroluminescent device only differs from the organic electroluminescent device provided in Embodiment 1 in that the host material of the light-emitting layer 33 is an exciplex formed by the electron donor material (D-20) and the electron receptor material (A-33). The electron donor material (D-20) and the electron receptor material (A-33) have a mass ratio of 1:4. The guest material in the light-emitting layer 33 is thermal activated delayed fluorescent material (T-3) and the guest material has a doping ratio of 50 wt %. The organic electroluminescent device has the following device structure:
ITO/HATCN (5 nm)/NPB (30 nm)/TCTA (10 nm)/
14 wt % (D-20): 40 wt % (A-33): 50 wt % (T-3) (30 nm)/
50 wt % DpyPA: 50 wt % Liq (30 nm)/LiF (0.5 nm)/Al (150 nm).

The exciplex has a singlet energy level of 2.81 eV and a triplet energy level of 2.72 eV. The thermal activated delayed fluorescent material has a singlet energy level of 2.90 eV and a triplet energy level of 2.63 eV. The light-emitting wavelength of the device is 460 nm, and at 500 cd/m$^2$, the service life LT50 is 221 h.

Embodiment 9

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-9) and the electron receptor material (A-17). The electron donor material (D-9) and the electron receptor material (A-17) have a mass ratio of 1:1. The guest material in the light-emitting layer 33 is thermal activated delayed fluorescent material (T-86) and the guest material has a doping ratio of 10 wt %. The organic electroluminescent device has the following device structure:
ITO/HATCN (5 nm)/NPB (30 nm)/TCTA (10 nm)/
45 wt % (D-9): 45 wt % (A-17): 10 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.33 eV. The thermal activated delayed fluorescent material has a singlet energy level of 2.46 eV and a triplet energy level of 2.39 eV. The light-emitting wavelength of the device is 510 nm, and at 1000 cd/m$^2$, the service life LT50 is 4600 h.

Embodiment 10

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-9) and the electron receptor material (A-17). The electron donor material (D-9) and the electron receptor material (A-17) have a mass ratio of 2:1. The guest material in the light-emitting layer 33 is thermal activated delayed fluorescent material (T-86) and the guest material has a doping ratio of 10 wt %. The organic electroluminescent device has the following device structure:
ITO/HATCN (5 nm)/NPB (30 nm)/TCTA (10 nm)/
60 wt % (D-9): 30 wt % (A-17): 10 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.33 eV; the thermal activated delayed fluorescent material has a singlet energy level of 2.46 eV and a triplet energy level of 2.39 eV. The light-emitting wavelength of the device is 510 nm, and at 1000 cd/m$^2$, the service life LT50 is 5092 h.

Embodiment 11

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-9) and the electron receptor material (A-18). The electron donor material (D-9) and the electron receptor material (A-18) have a mass ratio of 8:1. The guest material in the light-emitting layer 33 is thermal activated delayed fluorescent material (T-86) and the guest material has a doping ratio of 10 wt %. The organic electroluminescent device has the following device structure:
ITO/HATCN (5 nm)/NPB (30 nm)/TCTA (10 nm)/
80 wt % (D-9): 10 wt % (A-18): 10 wt % (T-86) (30 nm)/
50 wt % DpyPA: 50 wt % Liq (30 nm)/LiF (0.5 nm)/Al (150 nm).

The exciplex has a singlet energy level of 2.43 eV and a triplet energy level of 2.39 eV; the thermal activated delayed fluorescent material has a singlet energy level of 2.46 eV and a triplet energy level of 2.39 eV. The light-emitting wavelength of the device is 510 nm, and at 1000 cd/m$^2$, the service life LT50 is 6692 h.

Embodiment 12

The present embodiment provides an organic electroluminescent device with a structure similar to Embodiment 1. The organic electroluminescent device only differs from the organic electroluminescent device provided in Embodiment 1 in that the host material of the light-emitting layer 33 is an exciplex formed by the electron donor material (D-9) and the electron receptor material (A-33). The electron donor material (D-9) and the electron receptor material (A-33) have a mass ratio of 1:1. The guest material in the light-emitting layer 33 is thermal activated delayed fluorescent material (T-86) and the guest material has a doping ratio of 10 wt %. The organic electroluminescent device has the following device structure:
ITO/HATCN (5 nm)/NPB (30 nm)/TCTA (10 nm)/
45 wt % (D-9): 45 wt % (A-33): 10 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.29 eV. The thermal activated delayed fluorescent material has a singlet energy level of 2.46 eV and a triplet energy level of 2.39 eV. The light-emitting wavelength of the device is 510 nm, and at 1000 cd/m$^2$, the service life LT50 is 7750 h.

Embodiment 13

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-10) and the electron receptor material (A-17). The electron donor material (D-10) and the electron receptor material (A-17) have a mass ratio of 5:1. The guest material in the light-emitting layer 33 is thermal activated delayed fluorescent material (T-86) and the guest material has a doping ratio of 40 wt %. The organic electroluminescent device has the following device structure:
ITO/HATCN (5 nm)/NPB (30 nm)/TCTA (10 nm)/
50 wt % (D-10): 10 wt % (A-17): 40 wt % (T-86) (30 nm)/
50 wt % DpyPA: 50 wt % Liq (30 nm)/LiF (0.5 nm)/Al (150 nm).

The exciplex has a singlet energy level of 2.41 eV and a triplet energy level of 2.38 eV. The thermal activated delayed fluorescent material has a singlet energy level of 2.46 eV and a triplet energy level of 2.31 eV. The light-emitting wavelength of the device is 510 nm, and at 1000 cd/m$^2$, the service life LT50 is 4620 h.

Embodiment 14

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-3) and the electron receptor material (A-18). The electron donor material (D-3) and the electron receptor material (A-18) have a mass ratio of 2:1. The guest material in the light-emitting layer 33 is thermal activated delayed fluorescent material (T-86) and the guest material has a doping ratio of 10 wt %. The organic electroluminescent device has the following device structure:
ITO/HATCN (5 nm)/NPB (30 nm)/TCTA (10 nm)/
60 wt % (D-3): 30 wt % (A-18): 10 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.28 eV. The thermal activated delayed fluorescent material has a singlet energy level of 2.46 eV and a triplet energy level of 2.31 eV. The light-emitting wavelength of the device is 510 nm, and at 1000 cd/m$^2$, the service life LT50 is 6952 h.

Embodiment 15

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-3) and the electron receptor material (A-18). The electron donor material (D-3) and the electron receptor material (A-18) have a mass ratio of 1:9. The guest material in the light-emitting layer 33 is thermal activated delayed fluorescent material (T-86) and the guest material has a doping ratio of 1 wt %. The organic electroluminescent device has the following device structure:
ITO/HATCN (5 nm)/NPB (30 nm)/TCTA (10 nm)/
9.9 wt % (D-3): 89.1 wt % (A-18): 1 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.28 eV. The thermal activated delayed fluorescent material has a singlet energy level of 2.46 eV and a triplet energy level of 2.31 eV. The light-emitting wavelength of the device is 510 nm, and at 1000 cd/m$^2$, the service life LT50 is 4469 h.

Embodiment 16

The present embodiment provides an organic electroluminescent device with a structure similar to that of Embodiment 1. The organic electroluminescent device only differs from the organic electroluminescent device provided in Embodiment 1 in that the host material of the light-emitting layer 33 is an exciplex formed by the electron donor material (D-3) and the electron receptor material (A-18). The electron donor material (D-3) and the electron receptor material (A-18) have a mass ratio of 2:1. The guest material in the light-emitting layer 33 is thermal activated delayed fluorescent material (T-86) and the guest material has a doping ratio of 0.1 wt %. The organic electroluminescent device has the following device structure:
ITO/HATCN (5 nm)/NPB (30 nm)/TCTA (10 nm)/
66.6 wt % (D-3): 33.3 wt % (A-18): 0.1 wt % (T-86) (30 nm)/
50 wt % DpyPA: 50 wt % Liq (30 nm)/LiF (0.5 nm)/Al (150 nm).

The exciplex has a singlet energy level of 2.39 eV and a triplet energy level of 2.28 eV. The thermal activated delayed fluorescent material has a singlet energy level of 2.46 eV and a triplet energy level of 2.31 eV. The light-emitting wavelength of the device is 510 nm, and at 1000 cd/m$^2$, the service life LT50 is 4250 h.

Alternatively, in the above embodiments, the electron donor material of the exciplex in the light-emitting layer 33 may be any other compound containing at least one of the following groups with a hole transport function: a carbazolyl group, an aromatic amine group, a phenyl group, a fluorene group, a silane group; and a dense-cyclic group, a bicyclic group or a spirocyclic group formed by any of the groups above. Furthermore, alternatively, the electron donor material may be a compound having any one of the structures shown by formulas (D-1) to (D-20).

Alternatively, in the above embodiments, the electron receptor material of the exciplex in the light-emitting layer 33 may be any other compound containing at least one of the following groups with an electron transport function: a pyridyl group, a pyrimidine group, a pyrazole group, an imidazolyl group, a pyrrole group, an oxazolyl group, a triazine group, a pyrazinyl group, a pyridazine group, a carbazole group, a cyan group, a phenyl group, a dibenzothiophene group, a phenyl phosphonyl group, a phenyl sulphone group; and a dense-cyclic group, a bicyclic group or a spirocyclic group formed by any of the groups above. Furthermore, alternatively, the electron receptor material may be a compound having any one of the structures shown by formulas (A-1) to (A-33).

Alternatively, in the above embodiments, the guest material doping in the light-emitting layer 33 may also be thermal activated delayed fluorescent material having any one of the structures shown by formulas (T-1) to (T-109).

Alternatively, in the above embodiments, the electron donor material and the electron receptor material may have a mass ratio of any value in the range of 1:9 to 9:1.

Alternatively, in the above embodiments, the guest material may have a doping ratio of any value in the range of 0.1 wt %-50 wt %.

In the above embodiments, as long as the singlet energy level of the formed exciplex is lower than the singlet energy level of the thermal activated delayed fluorescent material and the singlet energy levels of the electron donor material and the electron receptor material forming the exciplex are both higher than the singlet energy level of the thermal activated delayed fluorescent material, environmental heat can be utilized to realize energy transfer from the host material $S_1$ to the guest material $S_1$, so as to decrease the high-energy excitons in the light-emitting layer and Triple-Triplet Annihilation (TTA), Triplet-Polaron Annihilation (TPA), Singlet-Triplet Annihilation (STA) in the device.

Further alternatively, with the singlet energy level of the exciplex in the light-emitting layer 33 lower than the singlet energy level of the thermal activated delayed fluorescent material, it can also be implemented that the electron donor material has a singlet energy level higher than the singlet energy level of the thermal activated delayed fluorescent material or the electron receptor material has a singlet energy level higher than the singlet energy level of the thermal activated delayed fluorescent material, which also can decrease the high-energy excitons when transferring energy from the host material to the guest material, so as to have the effect of inhibiting Triple-Triplet Annihilation (TTA), Triplet-Polaron Annihilation (TPA) and Singlet-Triplet Annihilation (STA) in the device.

Apparently, the aforementioned embodiments are merely examples illustrated for clearly describing the present application, rather than limiting the implementation ways thereof. For a person with ordinary skill in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present application.

The invention claimed is:

1. An organic electroluminescent device, comprising a light-emitting layer including a host material and guest material,
   the host material is an exciplex formed by electron donor material and electron receptor material,
   the guest material is thermal activated delayed fluorescent material,
   the singlet energy level ($S_1$) of the host material is lower than the singlet energy level ($S_1$) of the guest material.

2. The organic electroluminescent device of claim 1, wherein, an energy level difference between the singlet energy level ($S_1$) of the guest material and the singlet energy level ($S_1$) of the host material is less than 0.3 eV.

3. The organic electroluminescent device of claim 1, wherein, an energy level difference between the singlet energy level ($S_1$) of the host material and a triplet energy level of the host material is less than 0.15 eV.

4. The organic electroluminescent device of claim 1, wherein, an energy level difference between the singlet energy level ($S_1$) of the guest material and a triplet energy level of the guest material is less than 0.3 eV.

5. The organic electroluminescent device of claim 1, wherein, the electron donor material has the singlet energy level ($S_1$) higher than the singlet energy level ($S_1$) of the guest material, and/or the electron receptor material has the singlet energy level ($S_1$) higher than the singlet energy level ($S_1$) of the guest material.

6. The organic electroluminescent device of claim 1, wherein, the electron donor material and the electron receptor material have a mass ratio of 1:9 to 9:1.

7. The organic electroluminescent device of claim 6, wherein, the electron donor material and the electron receptor material have a mass ratio of 1:5 to 5:1.

8. The organic electroluminescent device of claim 7, wherein, the electron donor material and the electron receptor material have a mass ratio of 1:1.

9. The organic electroluminescent device of claim 1, wherein, the electron donor material is a compound having a hole transport function, the electron donor material contains at least one of the following groups:
   a carbazolyl group, an aromatic amine group, a phenyl group, a fluorene group, a silane group; and a polycyclic group, a bicyclic group or a spirocyclic group formed by any of the groups above.

10. The organic electroluminescent device of claim 9, wherein, the electron donor material has a compound structure selected from any one of the following structural formulas:

(D-1)

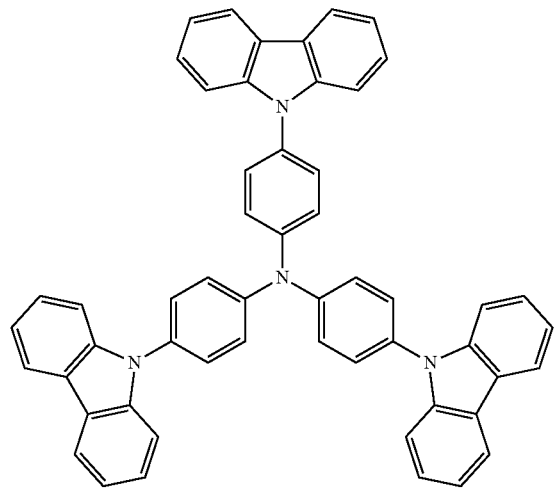

(D-2)

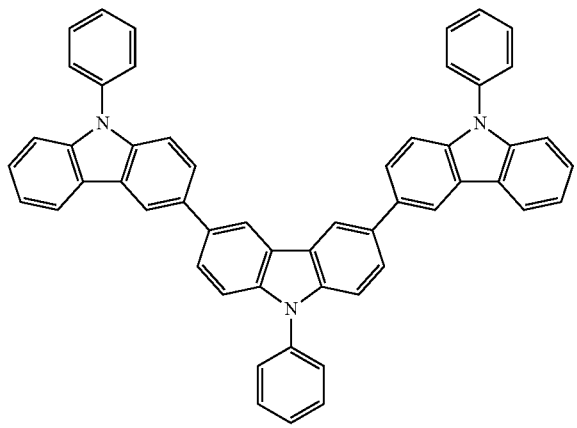

(D-3)

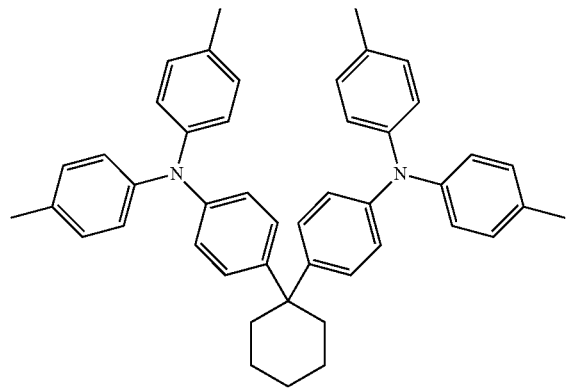

(D-4)

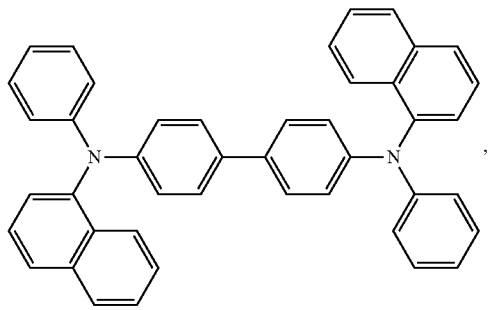

-continued
(D-5)
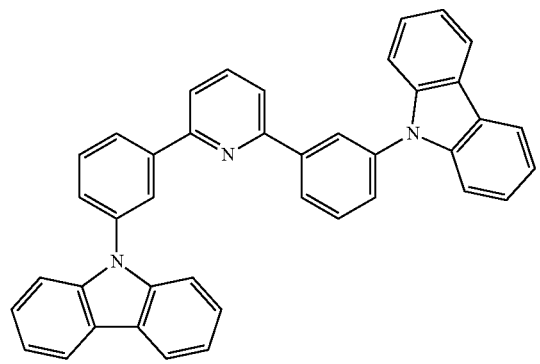
(D-6)
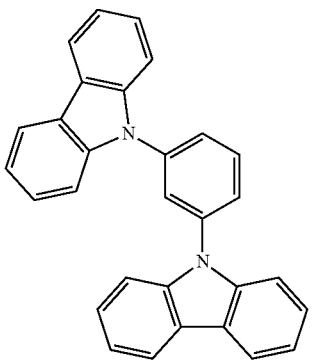
(D-7)
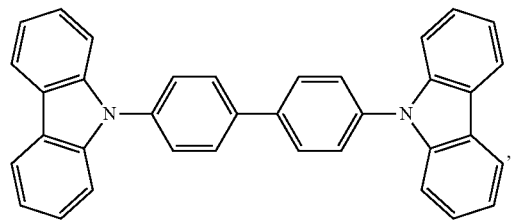
(D-8)
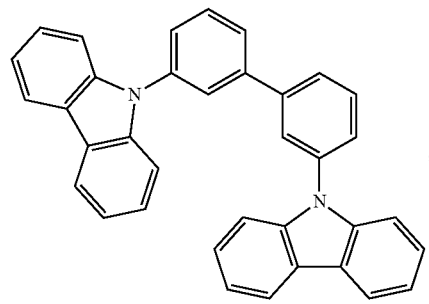
(D-9)
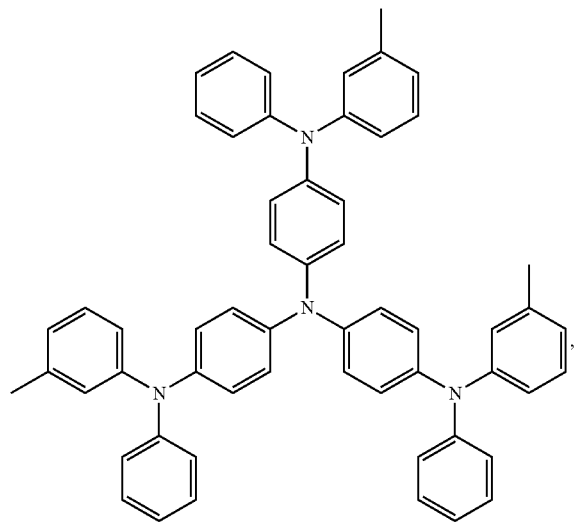
(D-10)
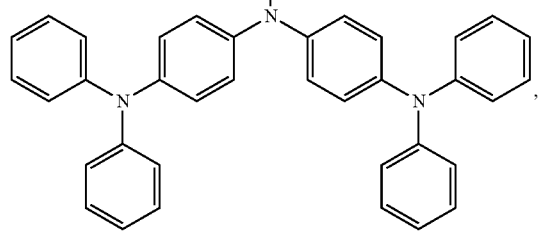
(D-11)
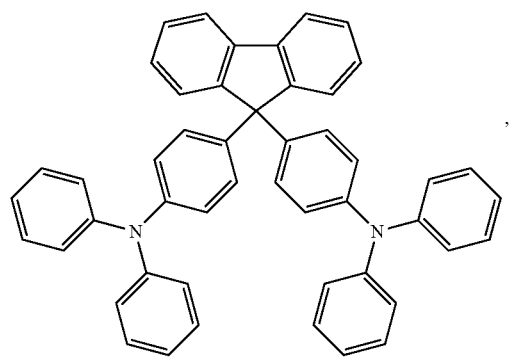
(D-12)
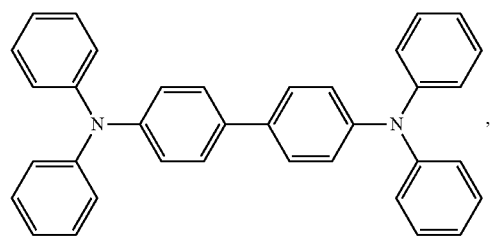

(D-13)
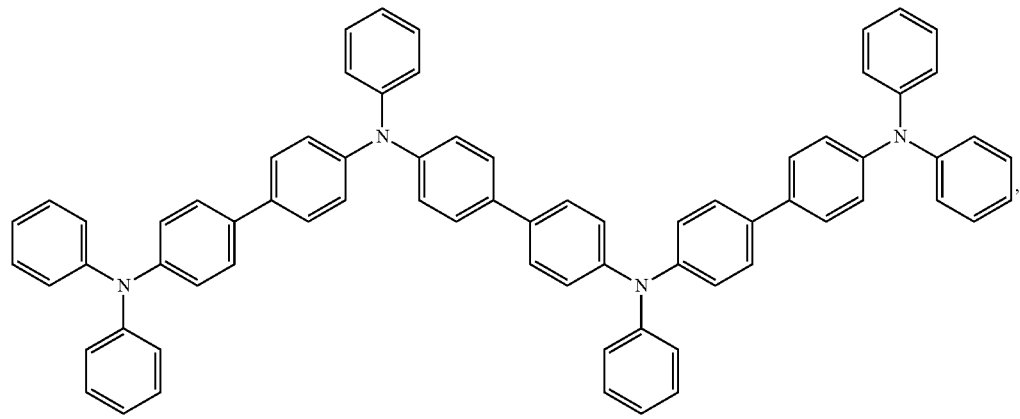
(D-14)
(D-15)
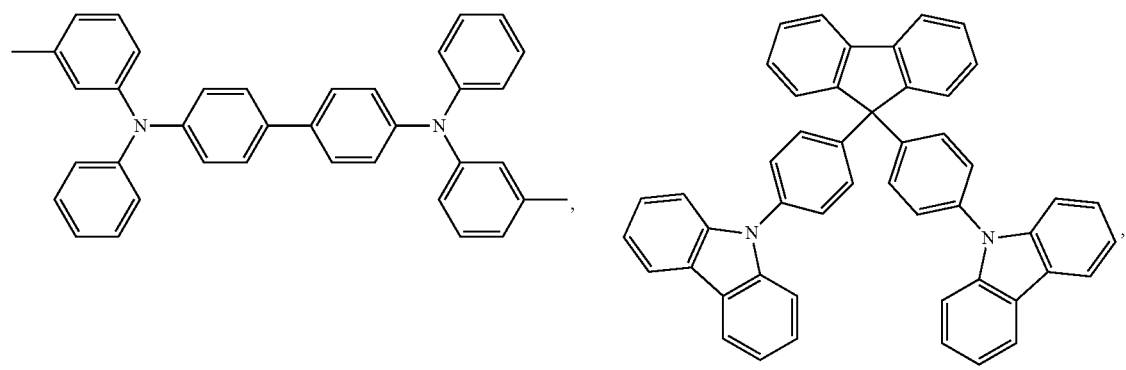
(D-16)
(D-17)
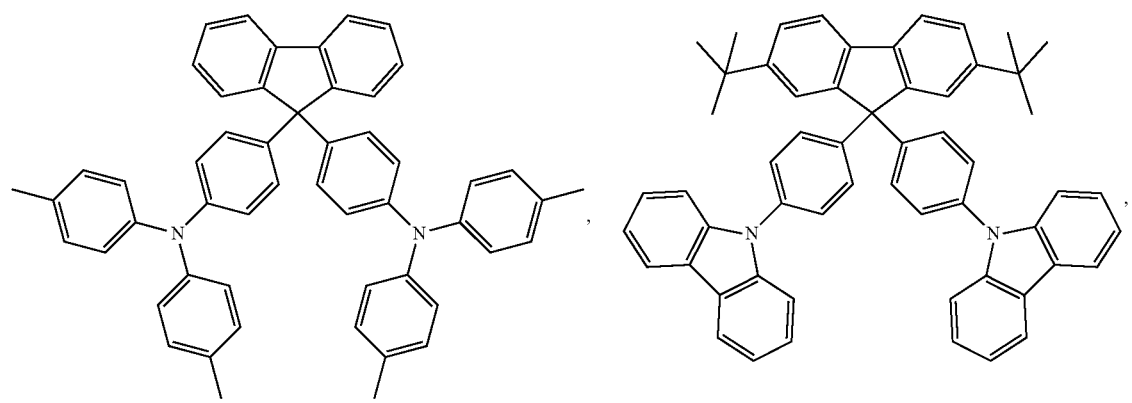

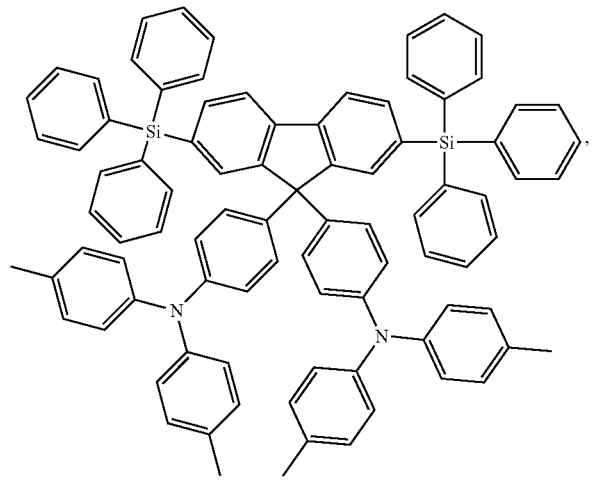
(D-18)

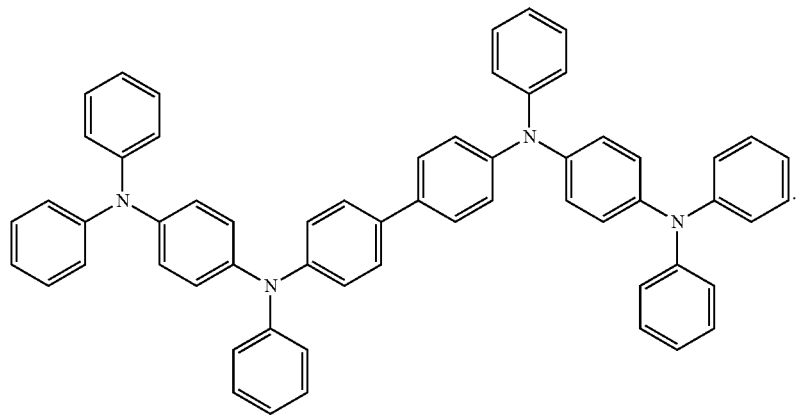
(D-19)

11. The organic electroluminescent device of claim 1, wherein, the electron receptor material is a compound having an electron transport function, the electron receptor material contains at least one of the following groups:
a pyridyl group, a pyrimidine group, a pyrazole group, an imidazolyl group, a pyrrole group, an oxazolyl group, a triazine group, a pyrazinyl group, a pyridazine group, a carbazole group, a cyan group, a phenyl group, a dibenzothiophene group, a phenyl phosphonyl group, a phenyl sulphone group; and a polycyclic group, a bicyclic group or a spirocyclic group formed by any of the groups above.

12. The organic electroluminescent device of claim 11, wherein, the electron receptor material has a compound structure selected from any one of the following structural formulas:

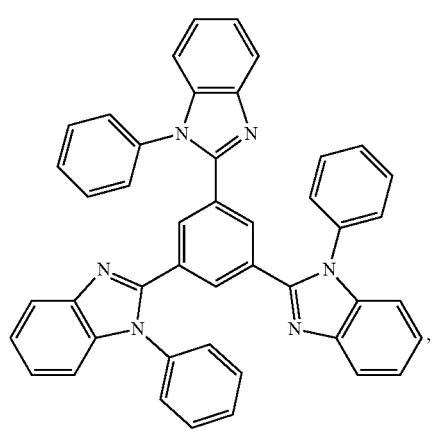
(A-1)

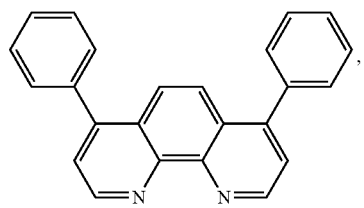
(A-2)
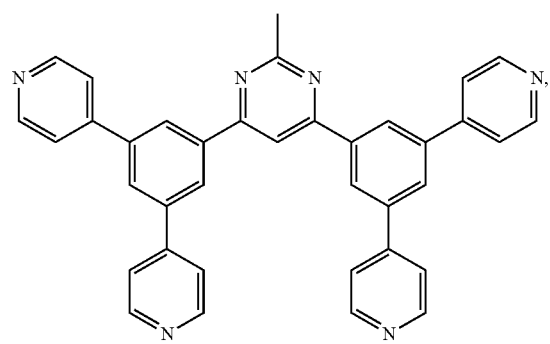
(A-3)
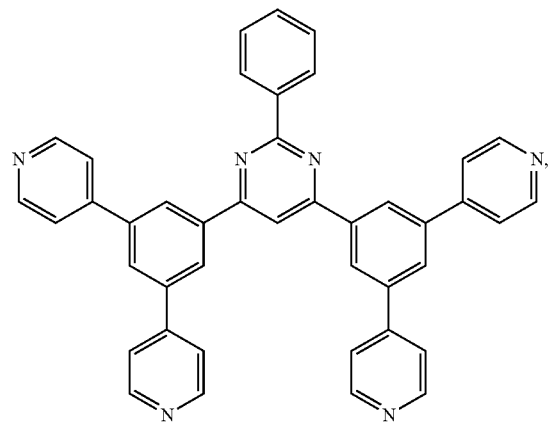
(A-4)
(A-5)
(A-6)
(A-7)
(A-8)

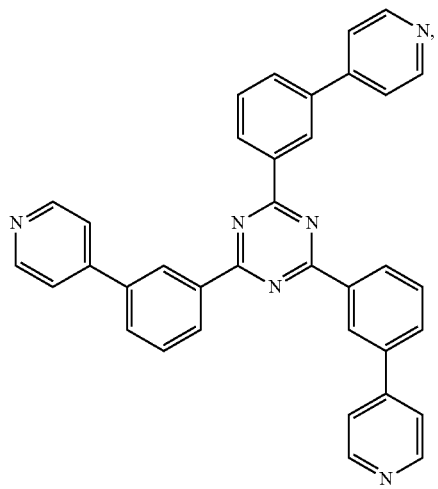
(A-9)
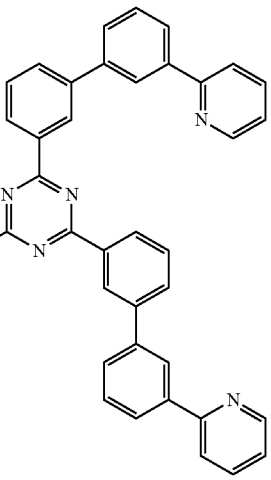
(A-12)
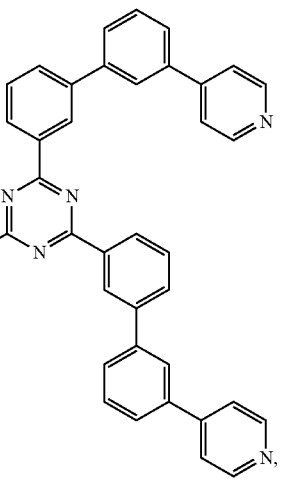
(A-13)
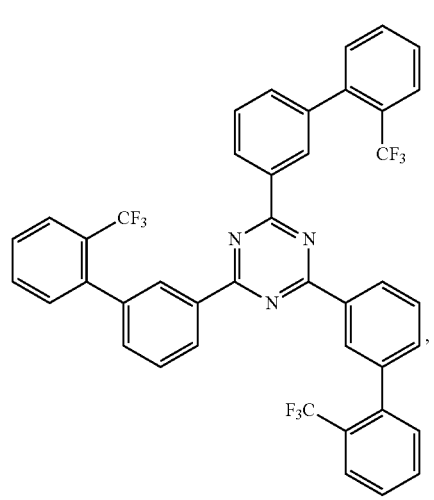
(A-14)

(A-15) 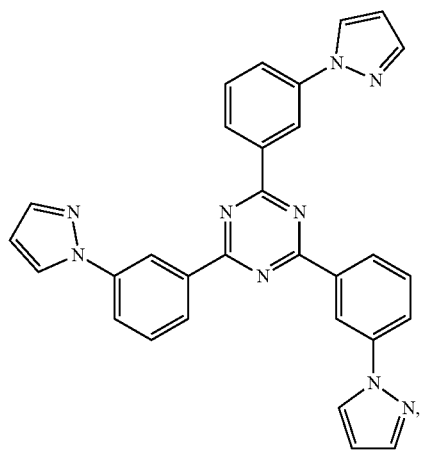
(A-16) 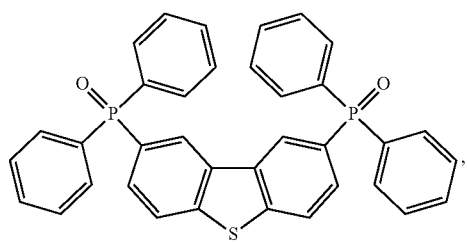
(A-17) 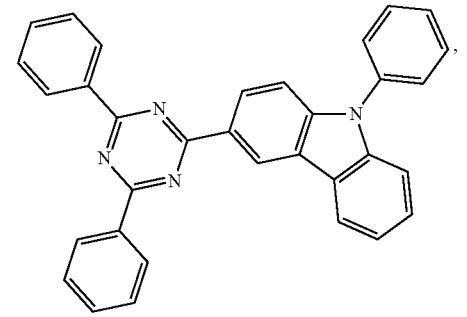
(A-18) 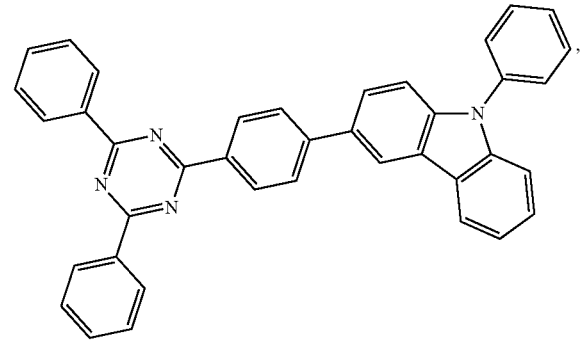
(A-19) 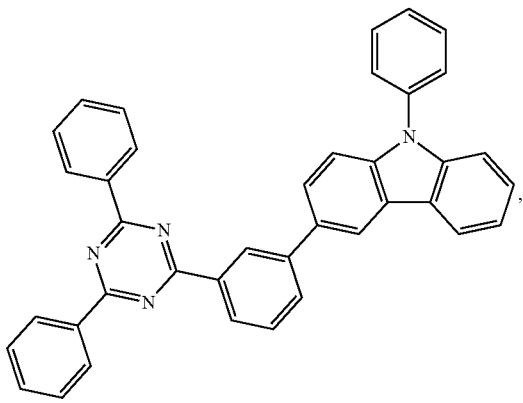
(A-20) 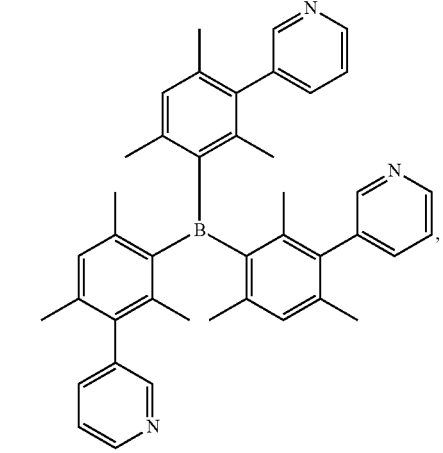
(A-21) 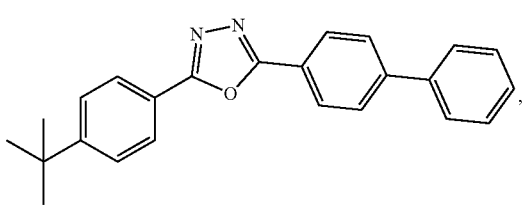
(A-22) 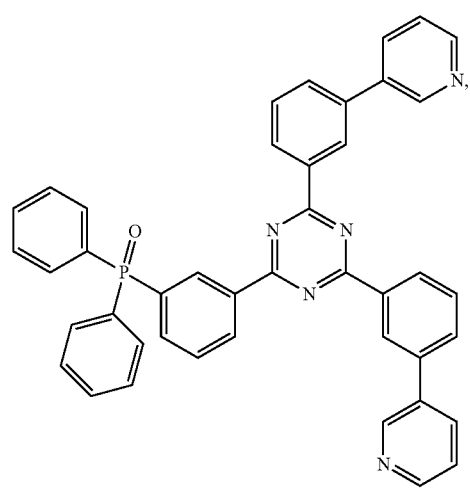

-continued
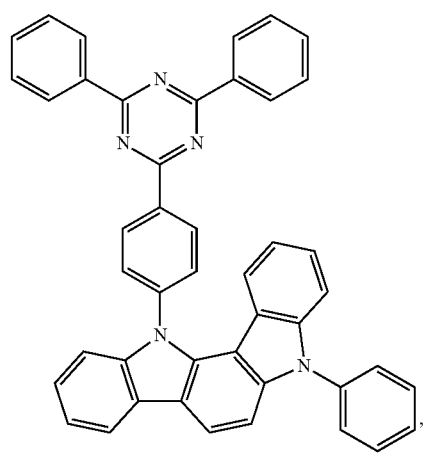
(A-23)
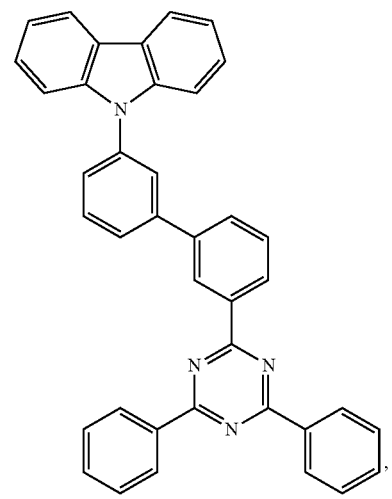
(A-24)
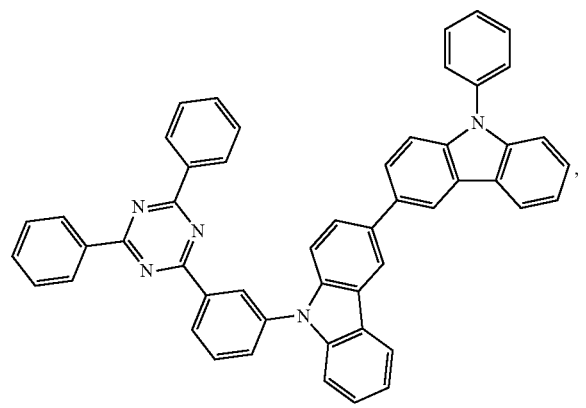
(A-25)
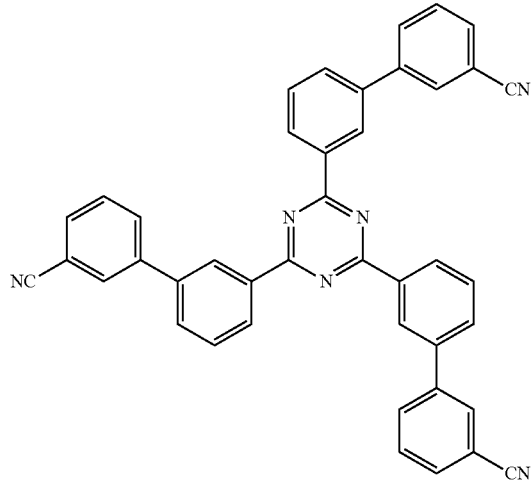
(A-26)
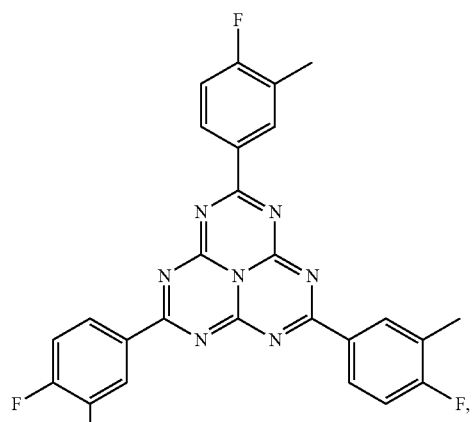
(A-27)
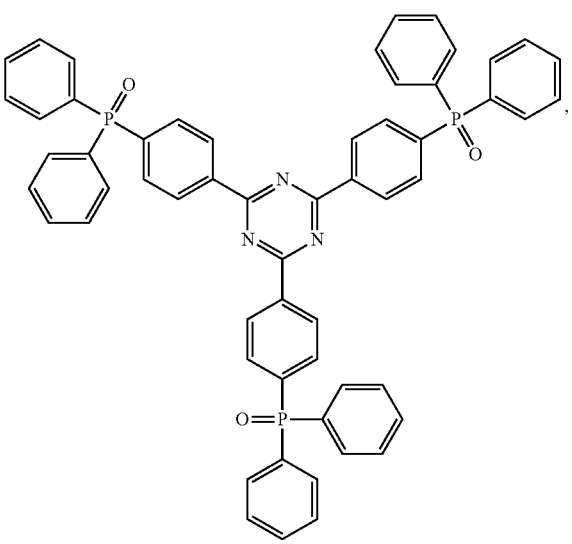
(A-28)

(A-29)
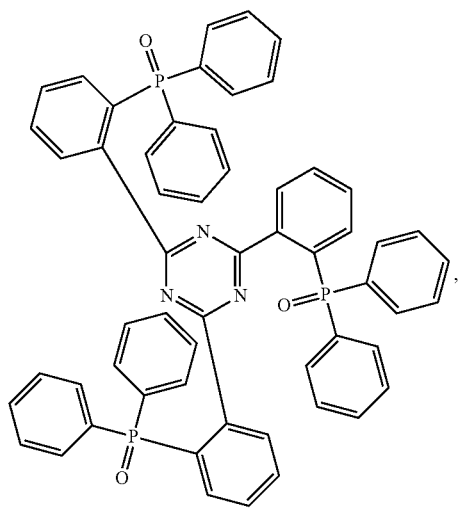
(A-31)
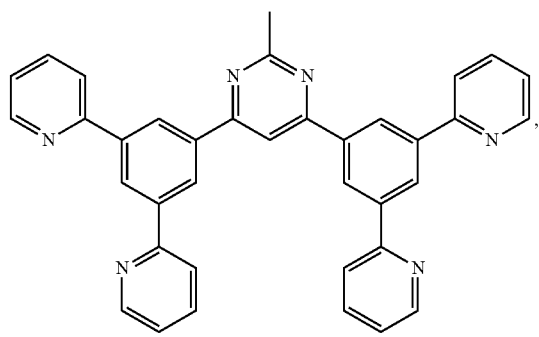
(A-32)
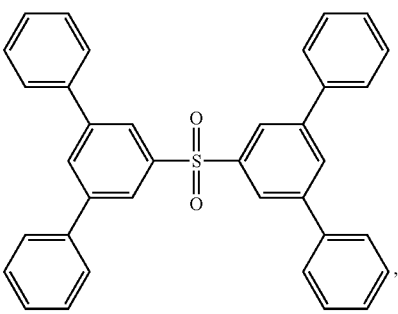
(A-33)
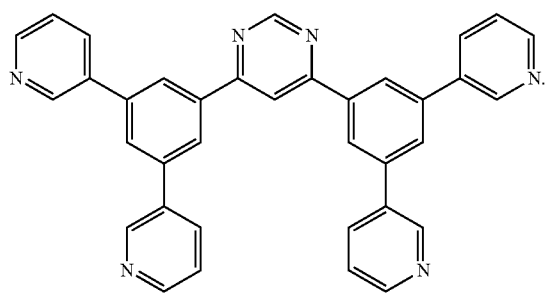
13. The organic electroluminescent device of claim 1, wherein, the thermal activated delayed fluorescent material has a compound structure selected from any one of the following structural formulas:
(T-1)
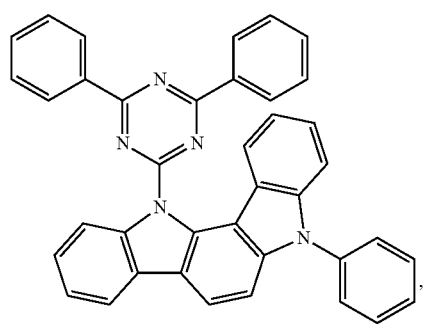
(T-2)
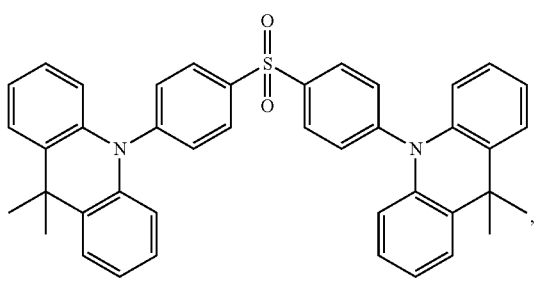

-continued
(T-3)
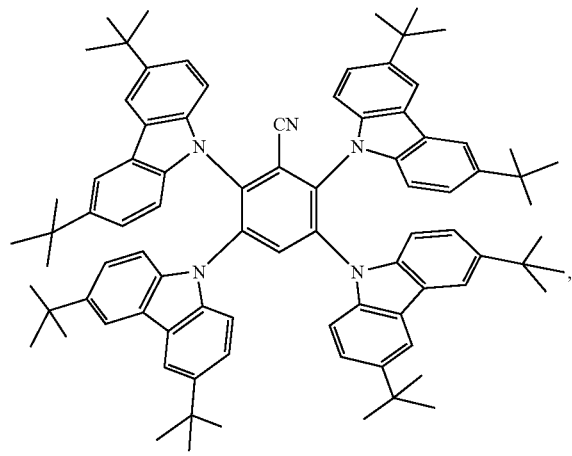
(T-4)
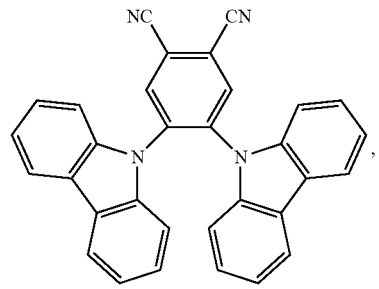
(T-5)
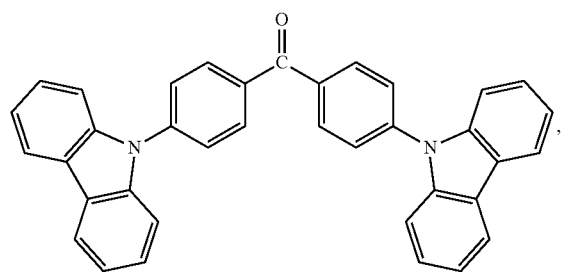
(T-6)
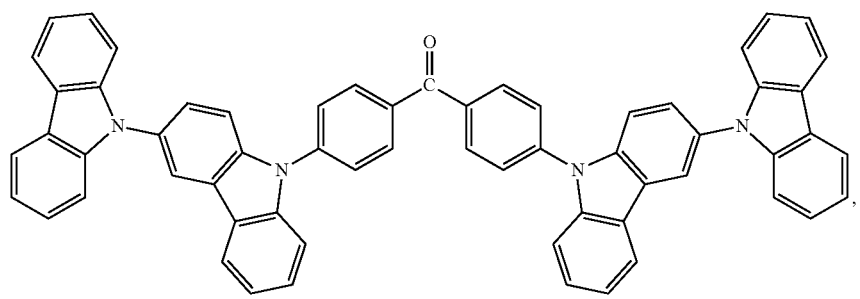
(T-7)
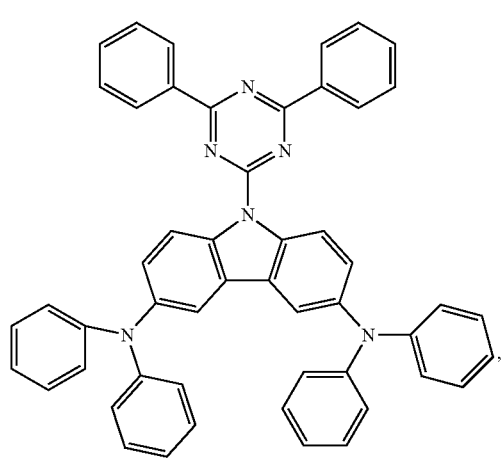
(T-8)
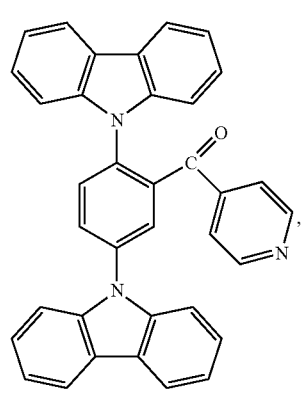

(T-9)
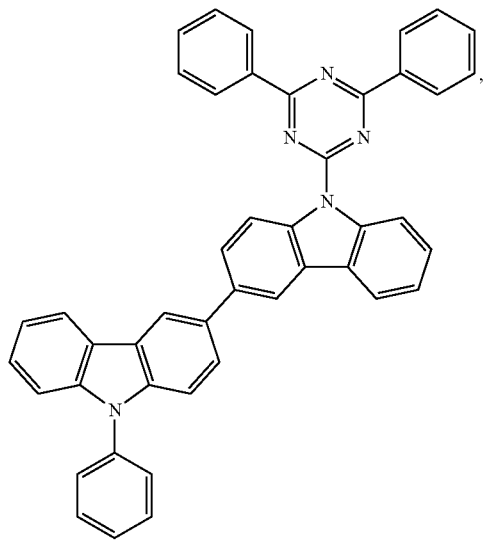
(T-10)
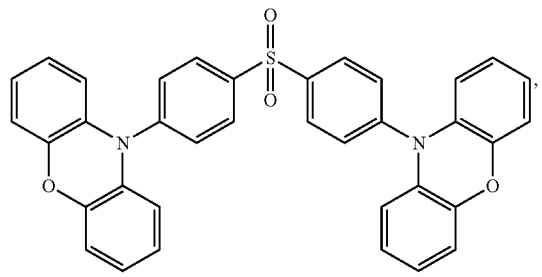
(T-12)
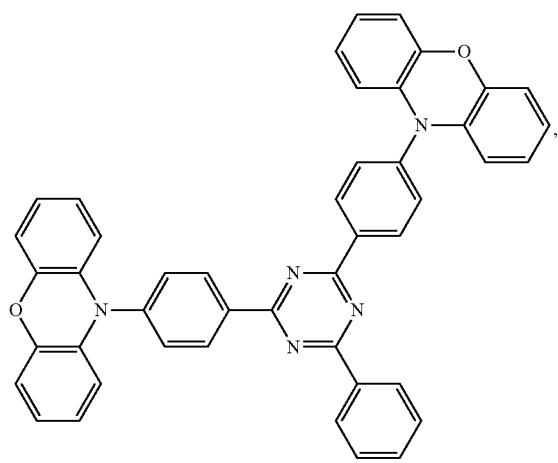
(T-13)
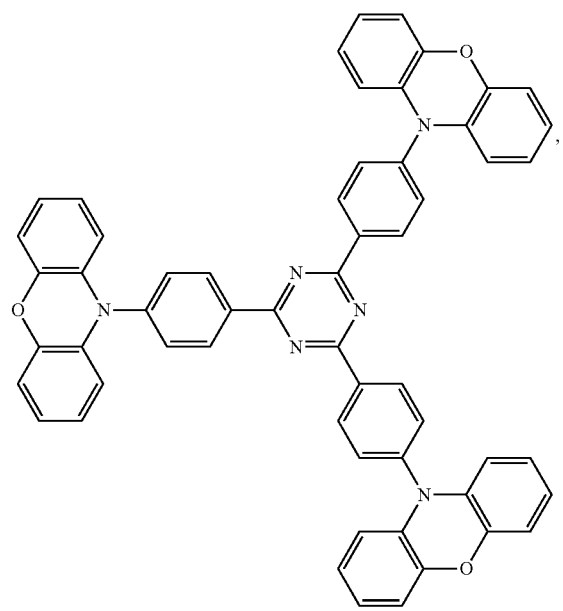
(T-14)
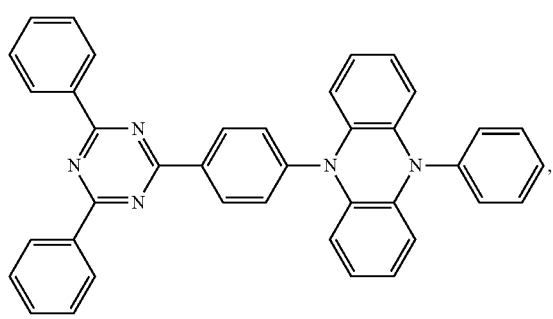
(T-15)
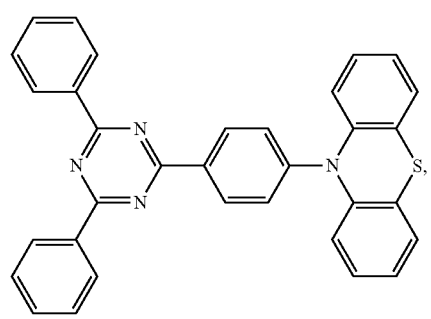

-continued
(T-16)
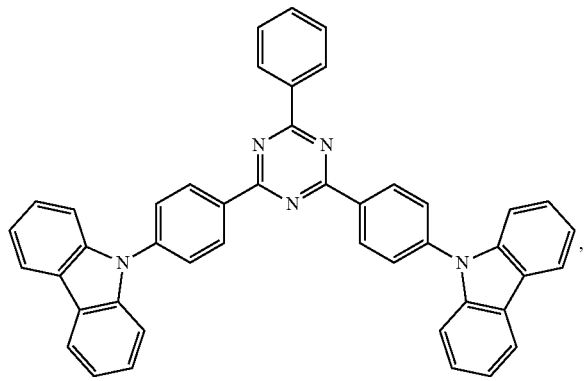
(T-17)
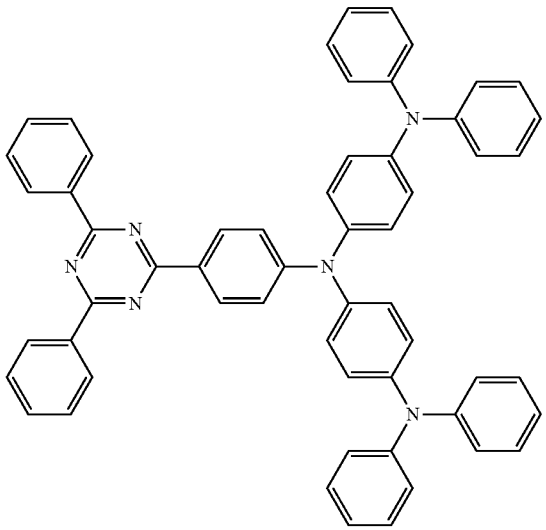
(T-18)
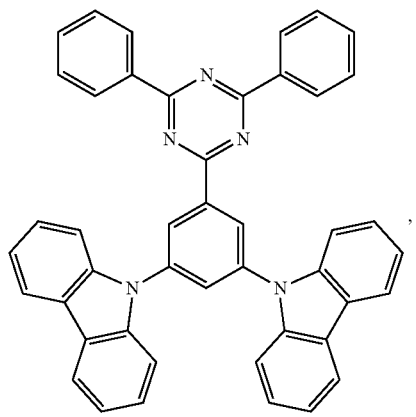
(T-19)
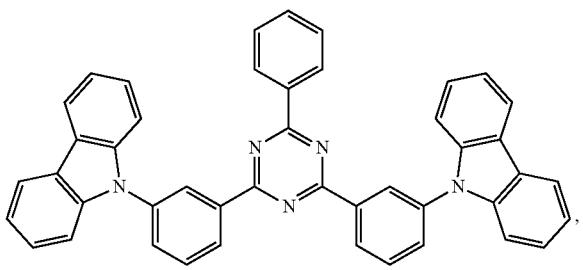
(T-20)
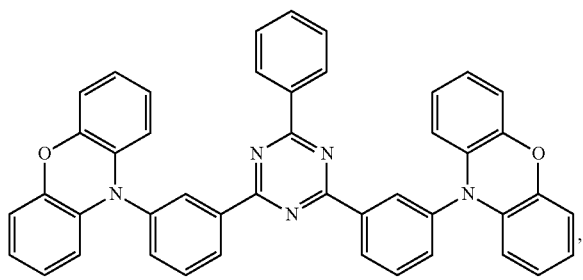
(T-22)
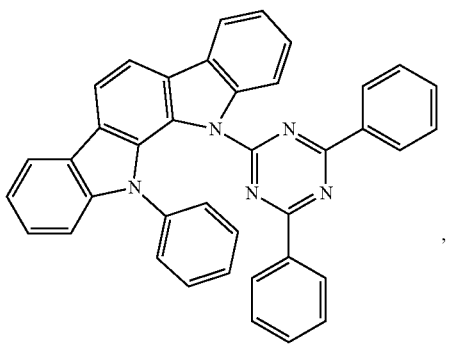

-continued
(T-23)
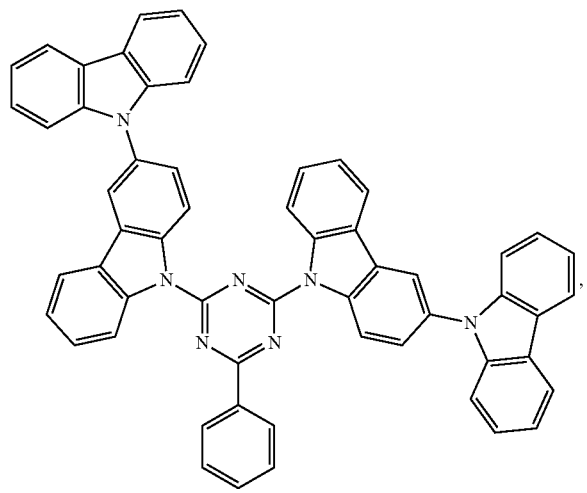
(T-24)
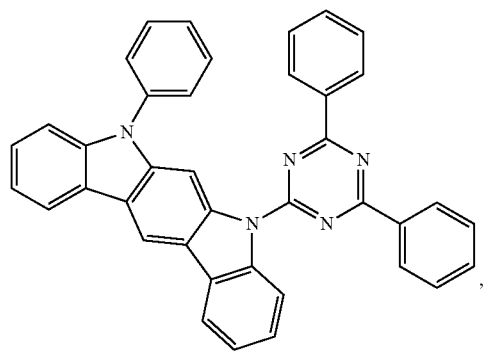
(T-25)
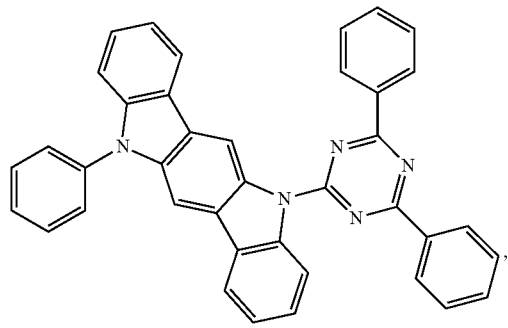
(T-27)
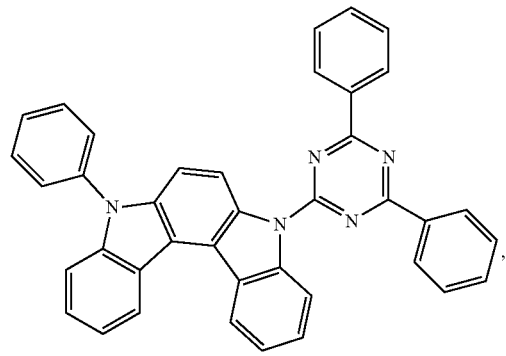
(T-28)
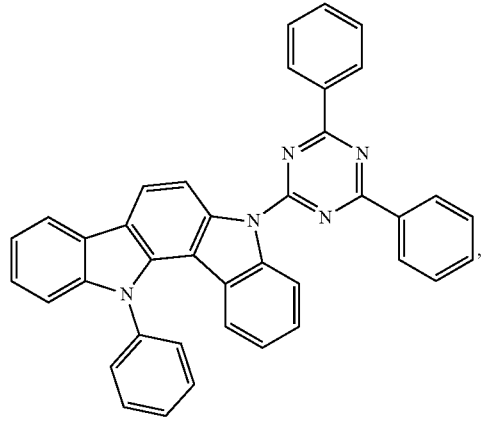
(T-29)
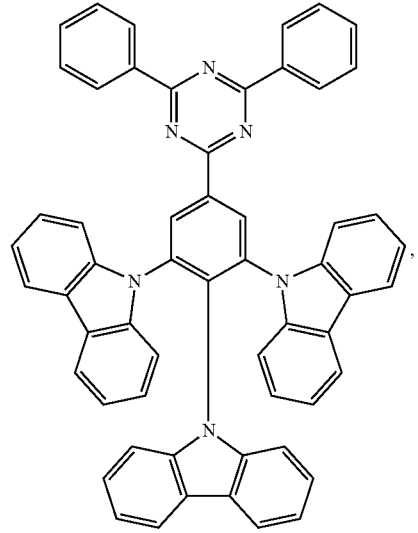

-continued
(T-30)
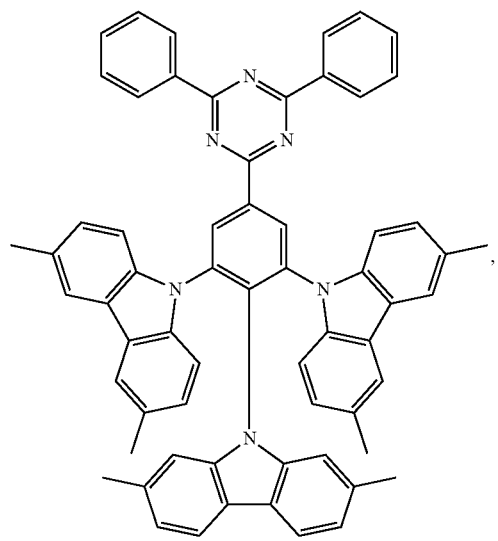
(T-31)
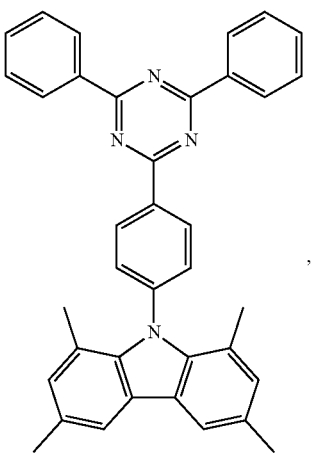
(T-32)
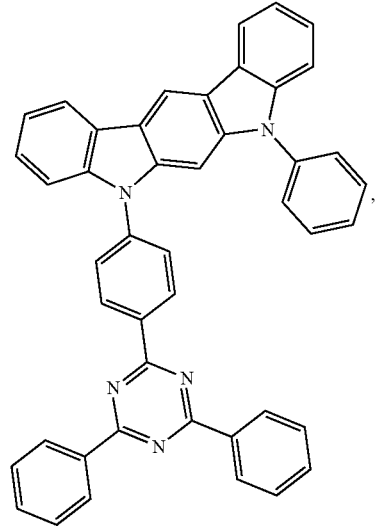
(T-33)
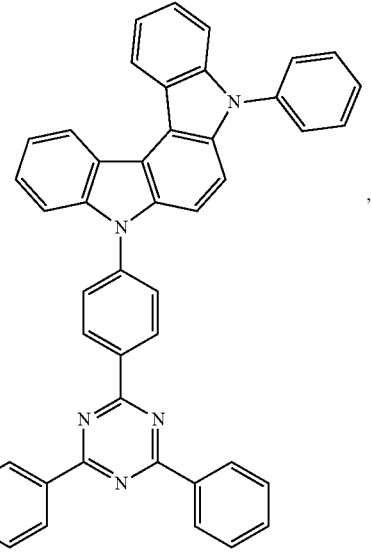
(T-34)
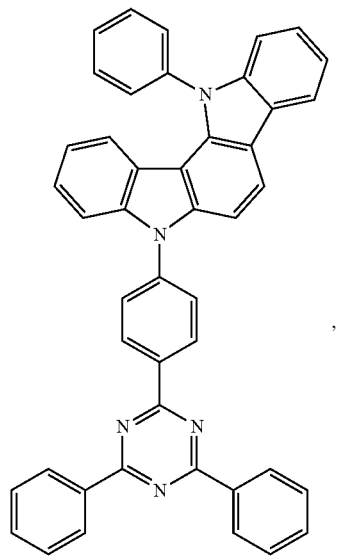
(T-35)
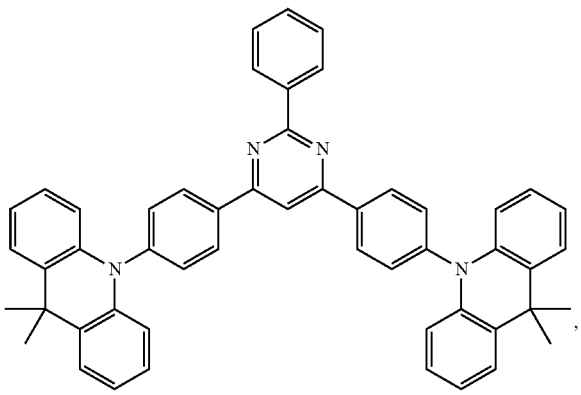

-continued
(T-36) (T-37)
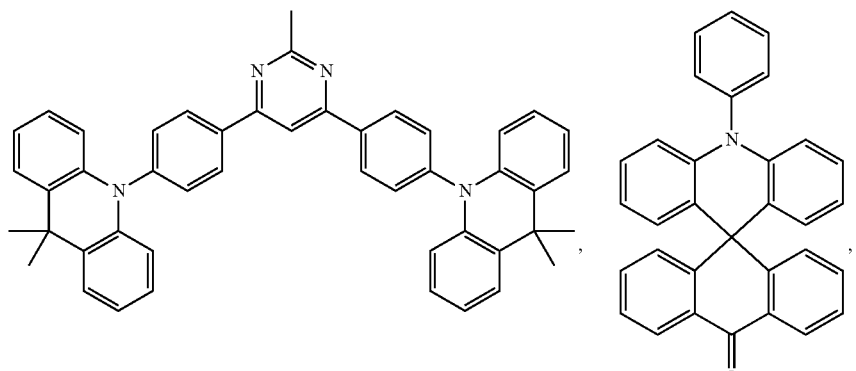
(T-38) (T-39)
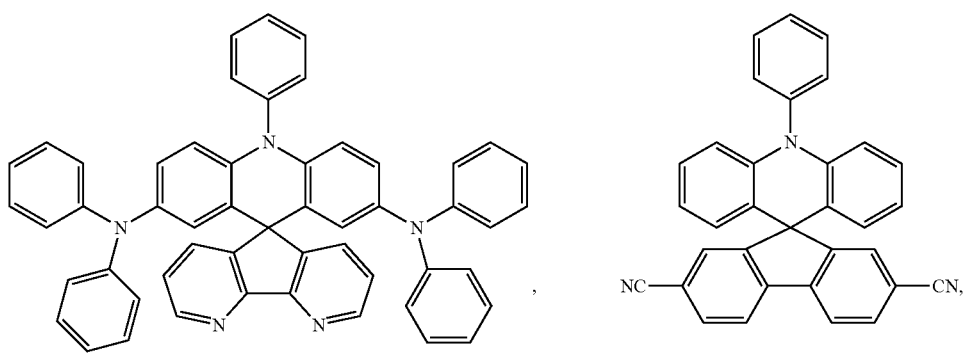
(T-40) (T-41)
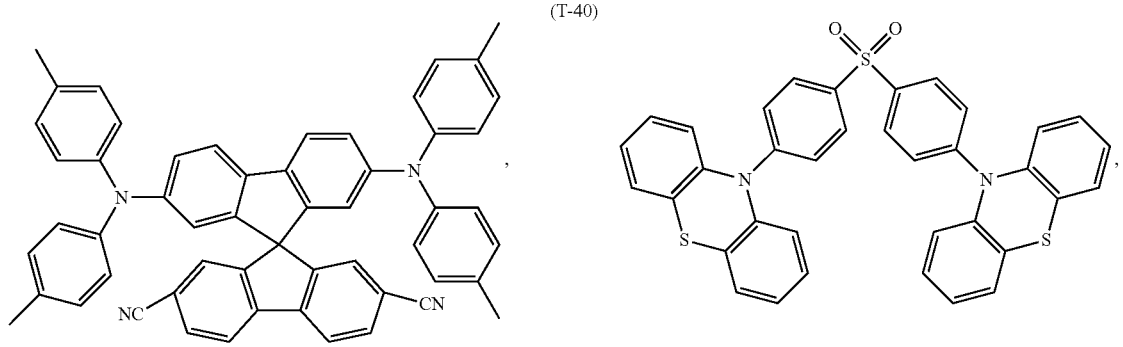
(T-42) (T-43)
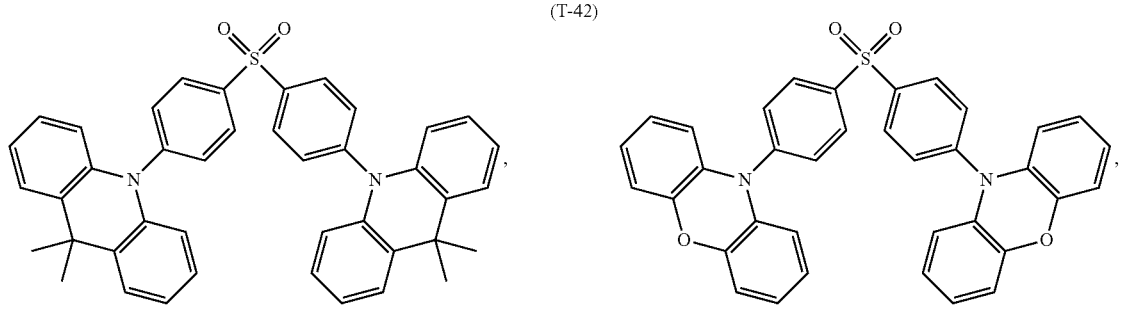

-continued
(T-44)
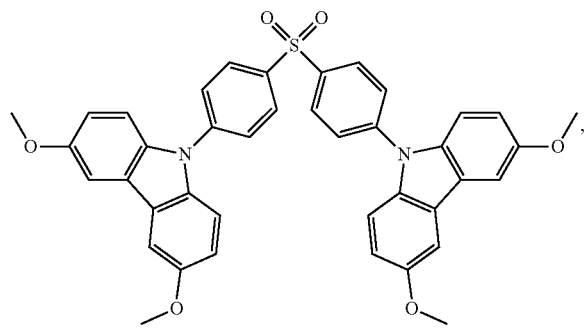
(T-45)
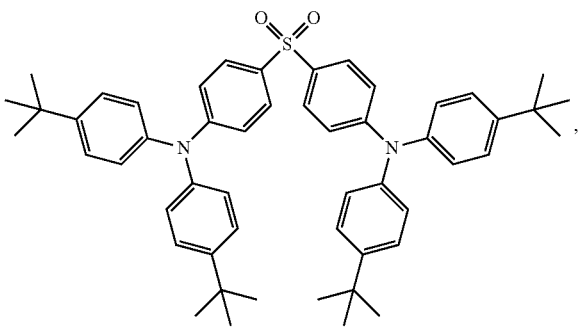
(T-46)
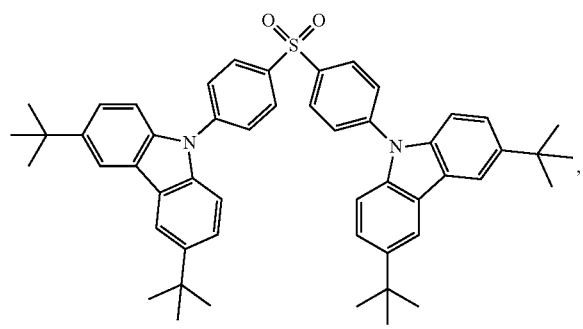
(T-47)
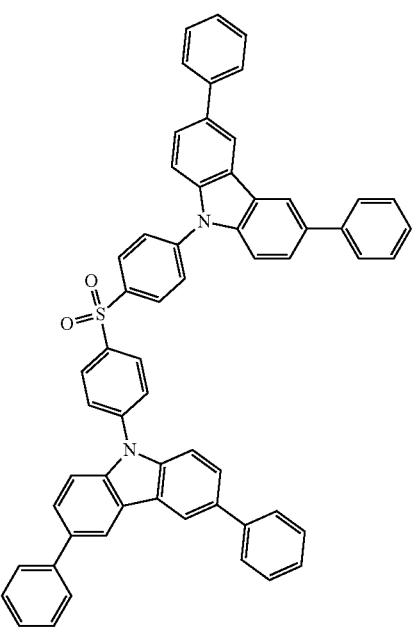
(T-48)
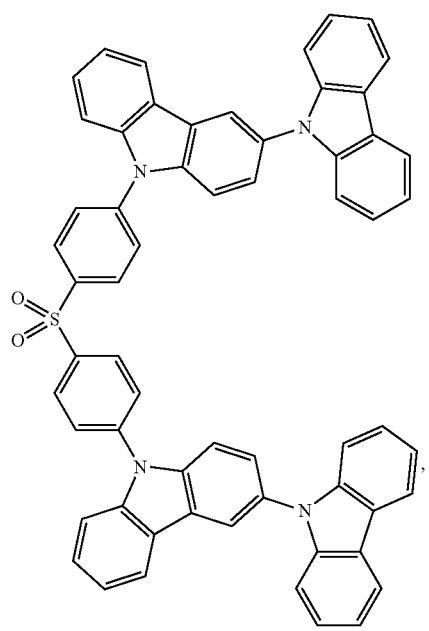
(T-49)
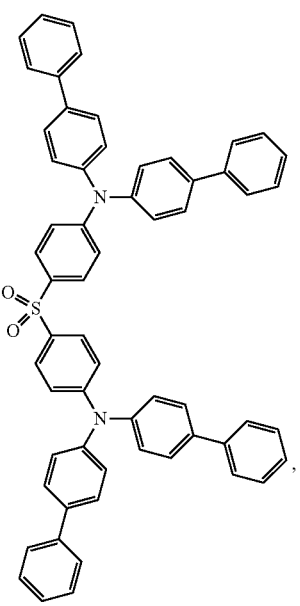

-continued
(T-50)
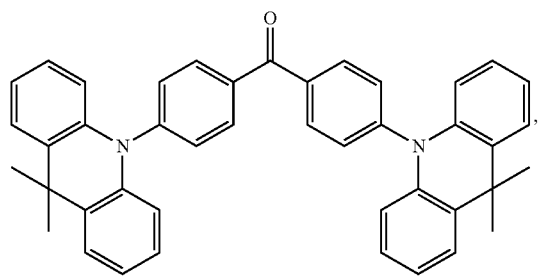
(T-51)
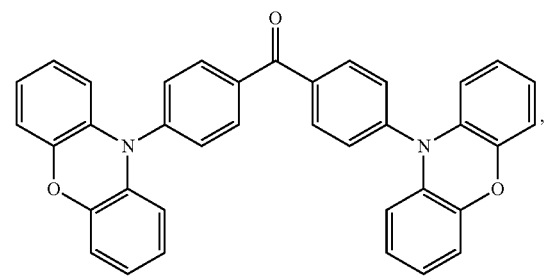
(T-52)
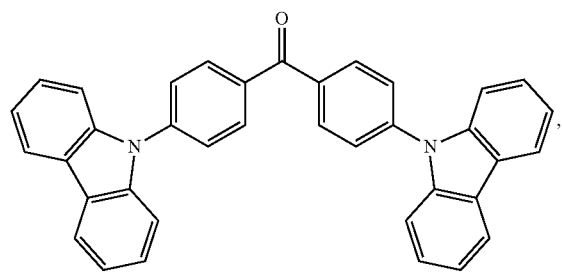
(T-53)
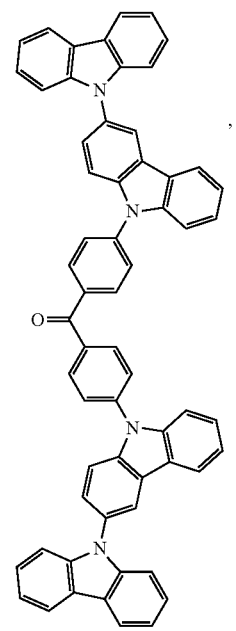
(T-54)
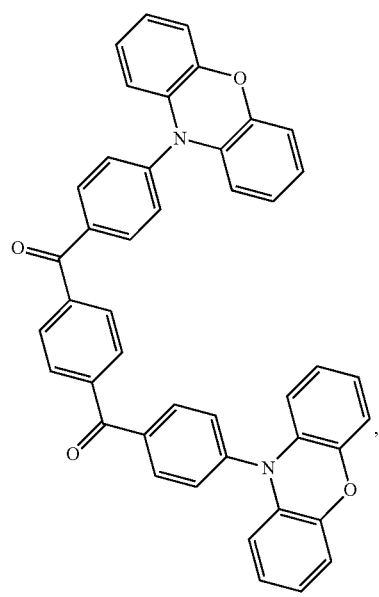
(T-55)
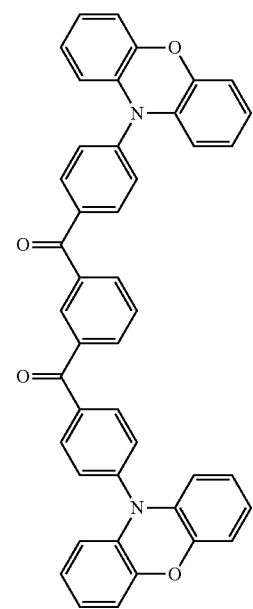

-continued
(T-56)
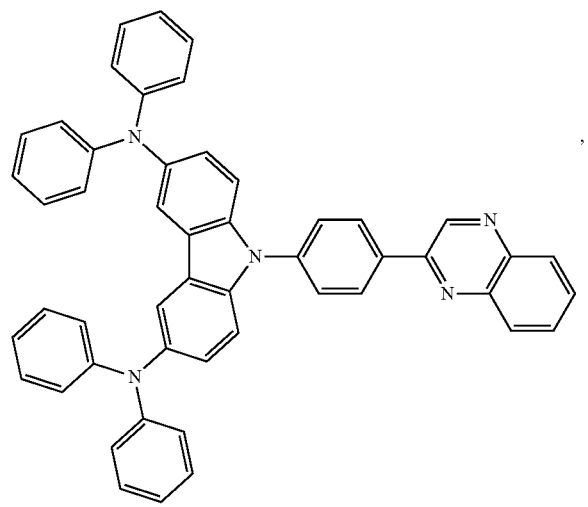
(T-57)
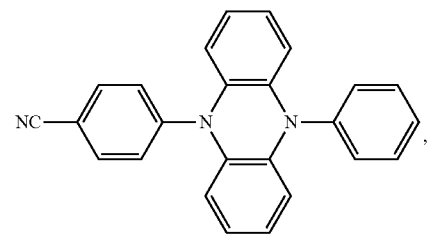
(T-58)
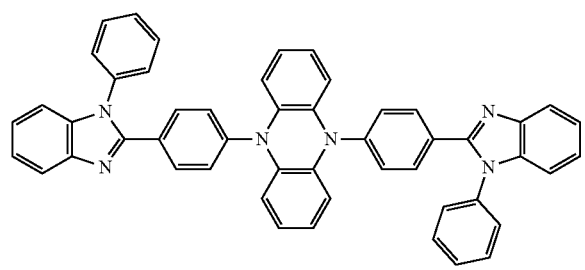
(T-59)
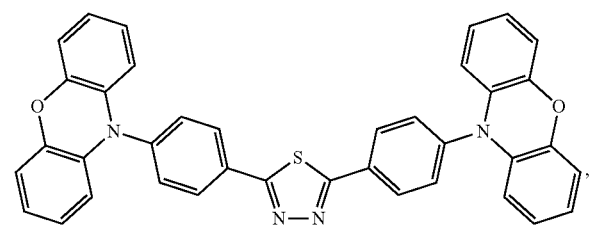
(T-60)
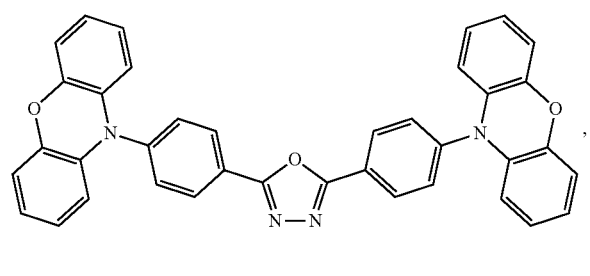
(T-61)
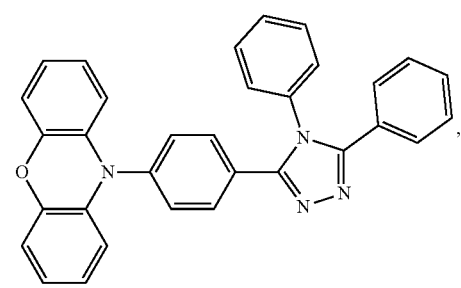
(T-62)
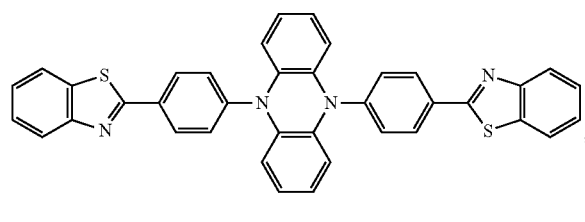
(T-63)
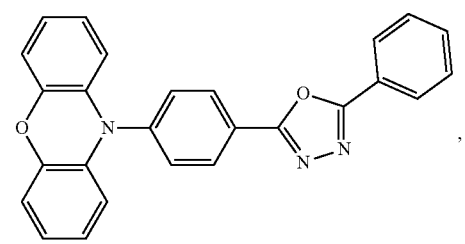

-continued
(T-64)
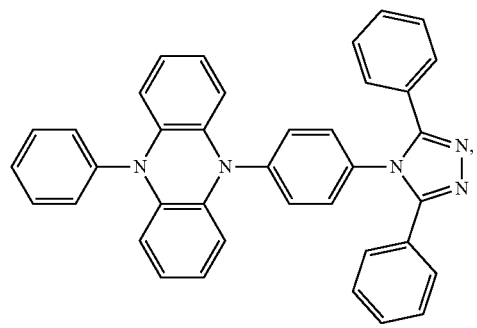
(T-65)
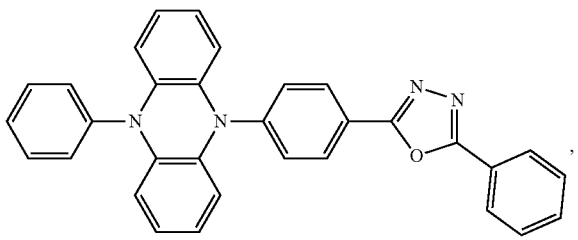
(T-66)
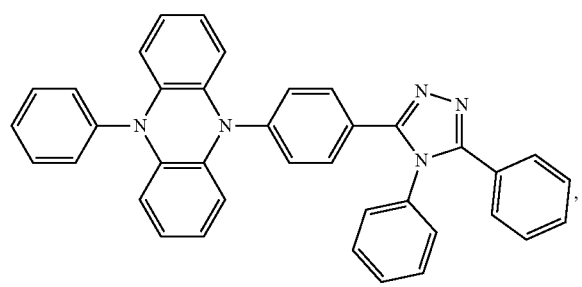
(T-67)
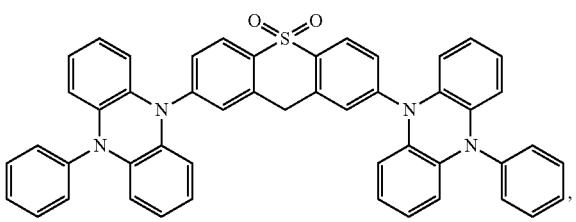
(T-68)
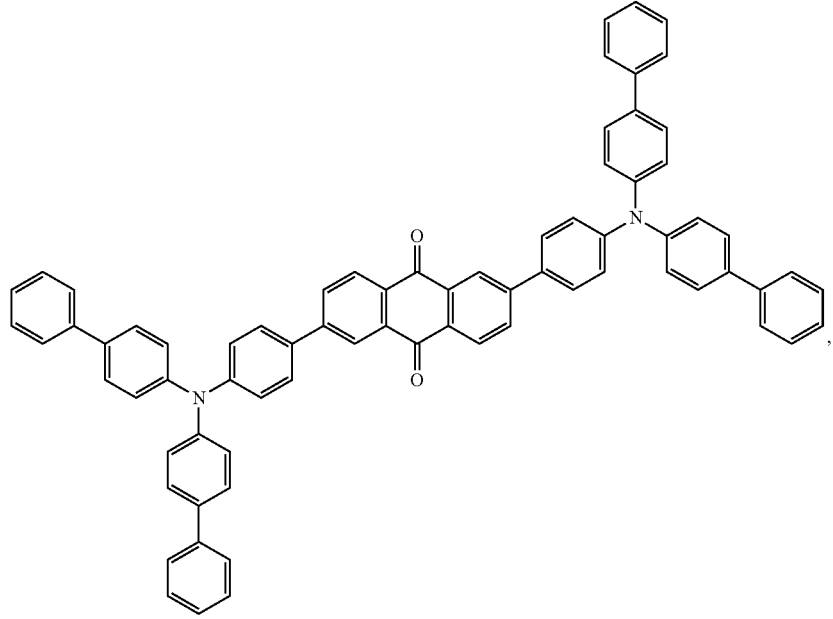
(T-69)
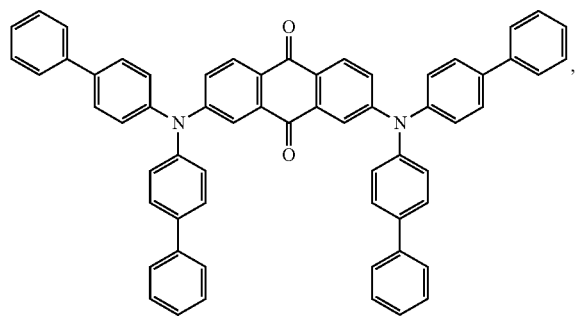
(T-70)
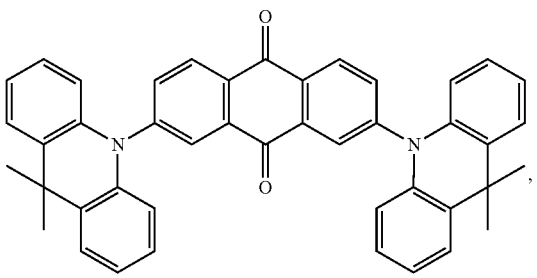

-continued
(T-71)
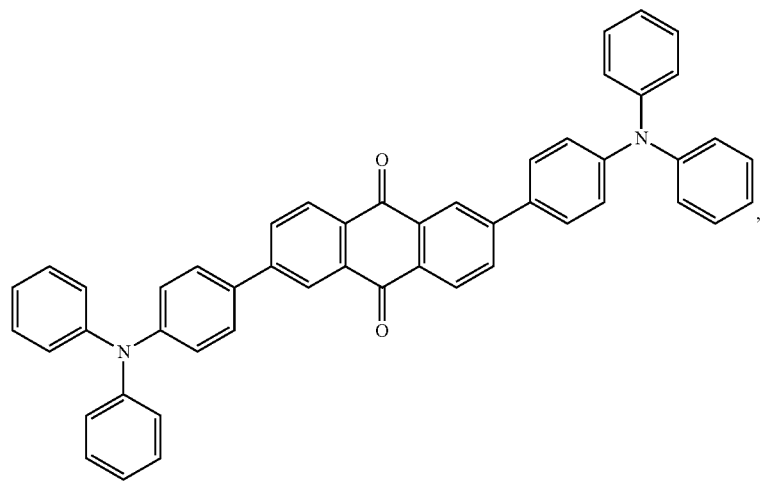
(T-72)
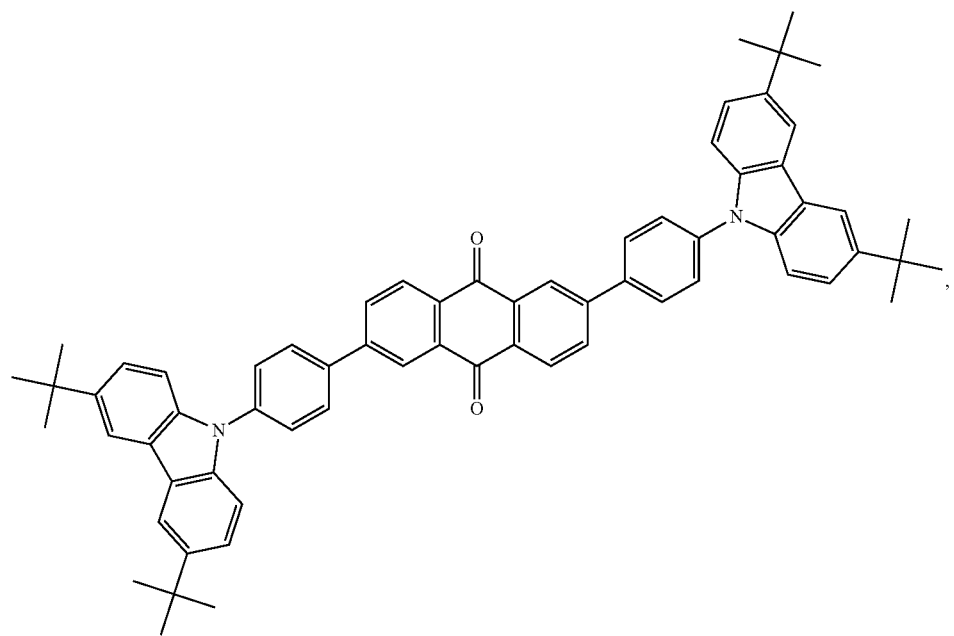
(T-73) (T-74)
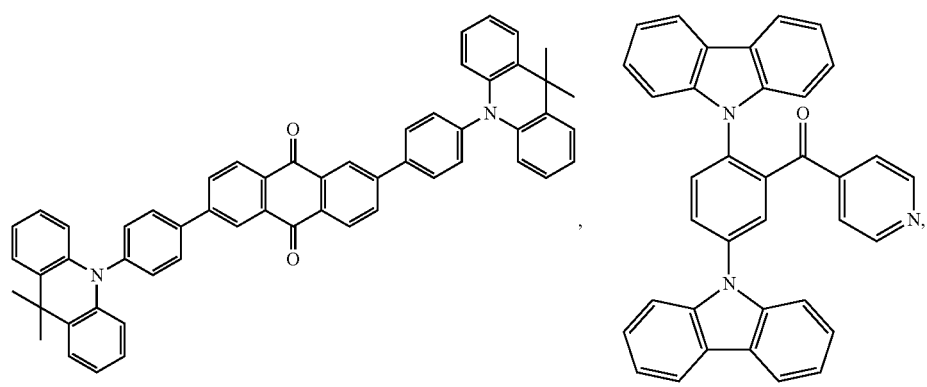

-continued
(T-75)
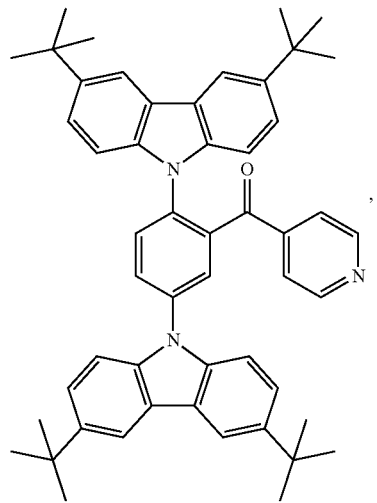
(T-76)
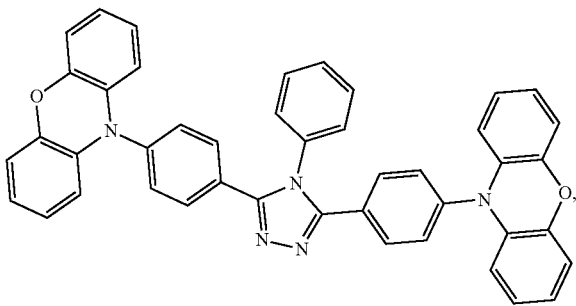
(T-77)
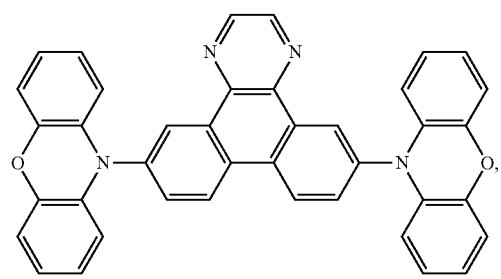
(T-78)
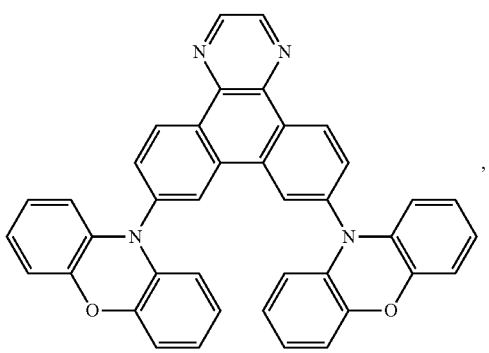
(T-79)
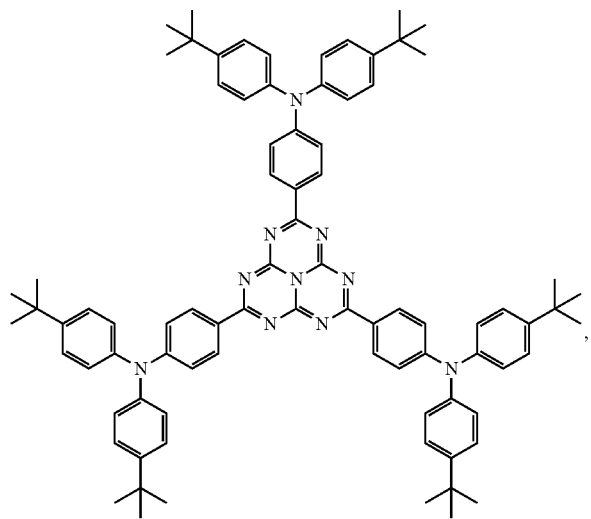
(T-80)
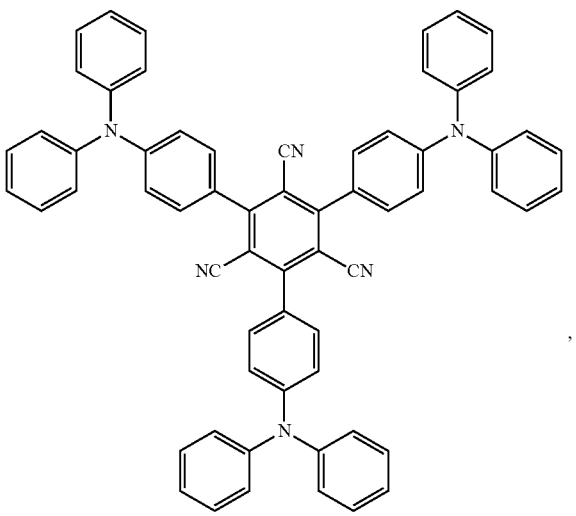

-continued
(T-81)
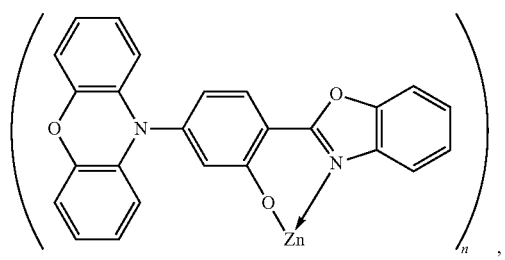
(T-82)
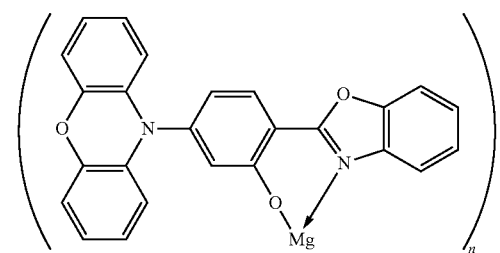
(T-83)
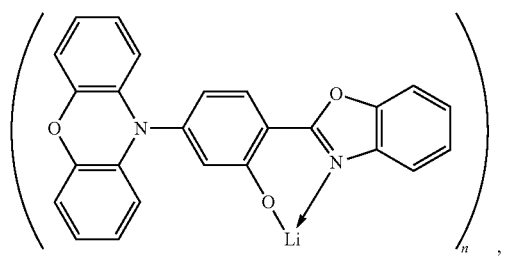
(T-84)
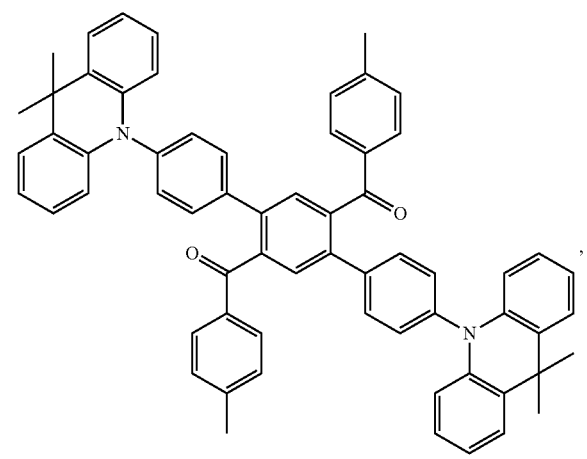
(T-85)
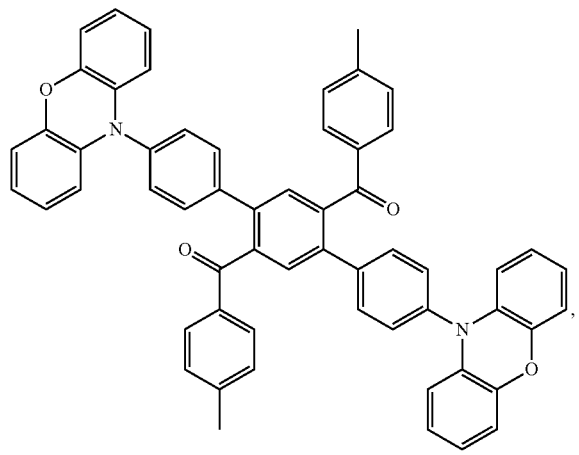
(T-86)
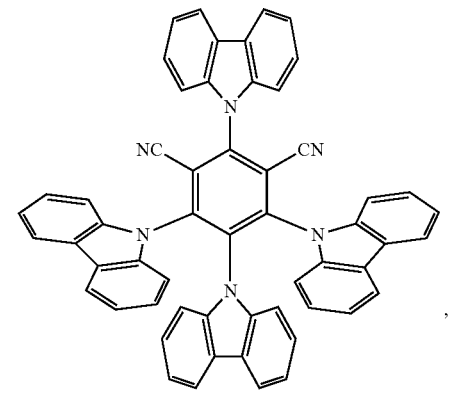
(T-87)
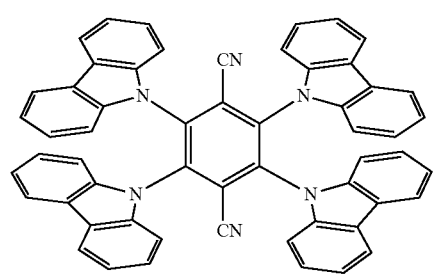
(T-88)
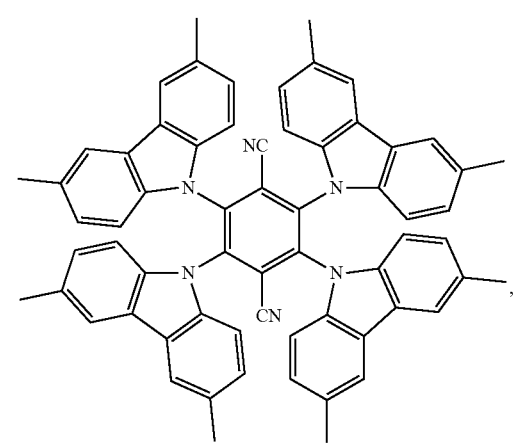

-continued
(T-89)
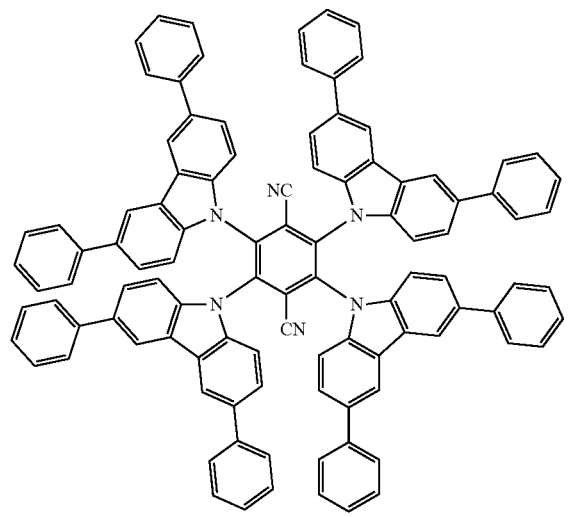
(T-90)
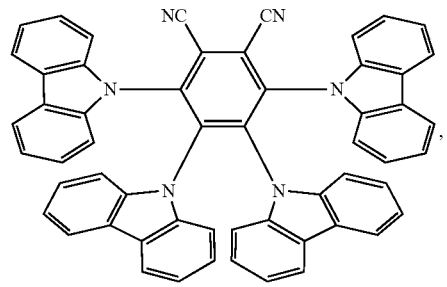
(T-91)
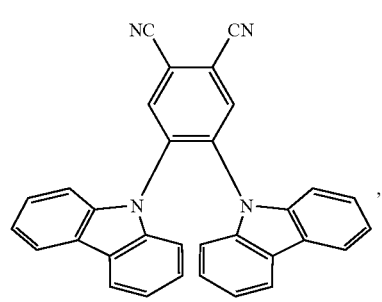
(T-92)
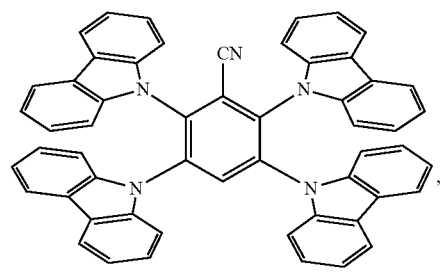
(T-93)
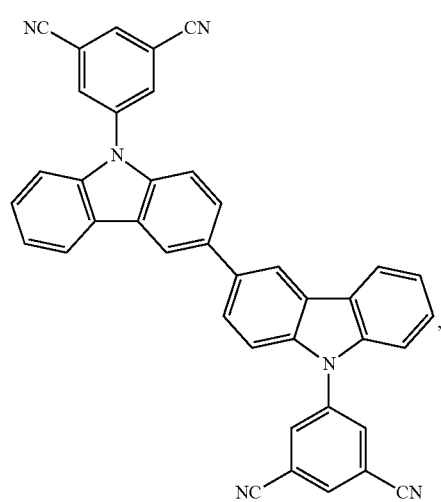
(T-94)
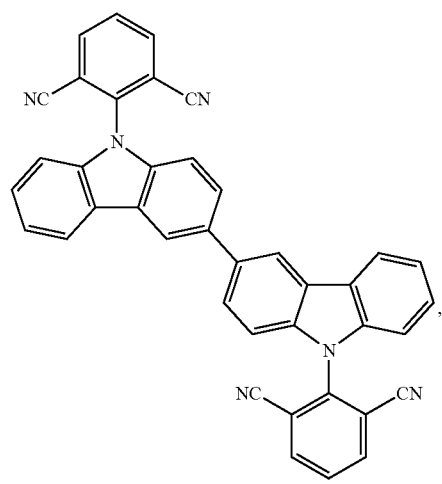

-continued
(T-95)
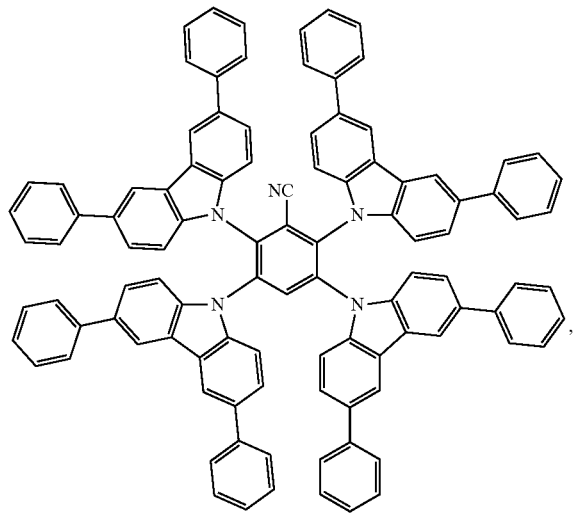
(T-96)
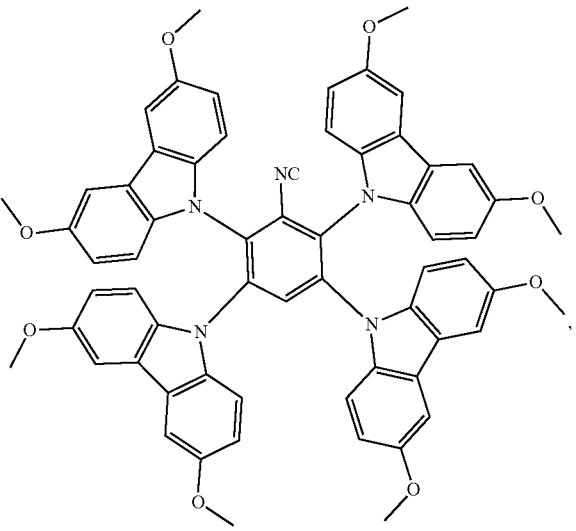
(T-97)
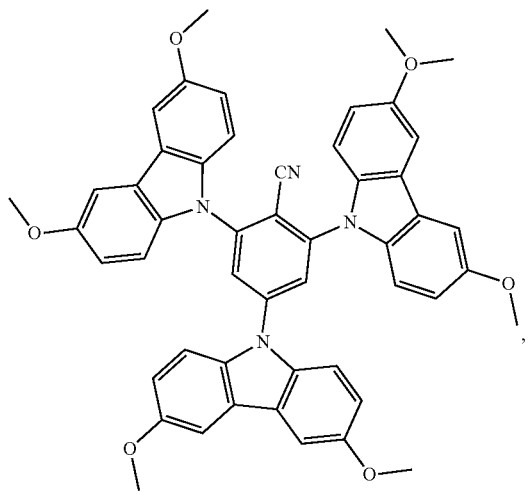
(T-98)
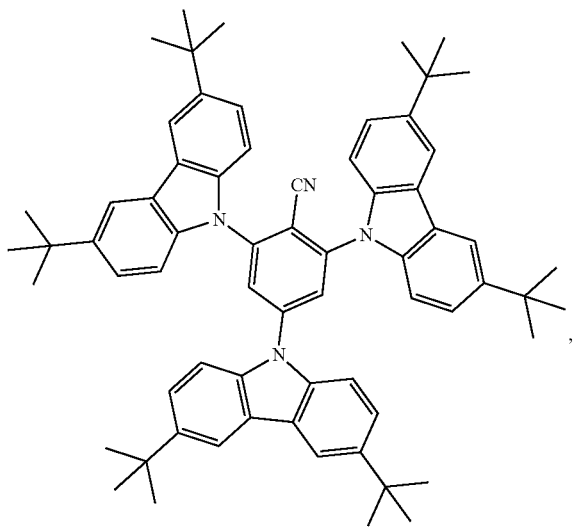
(T-99)
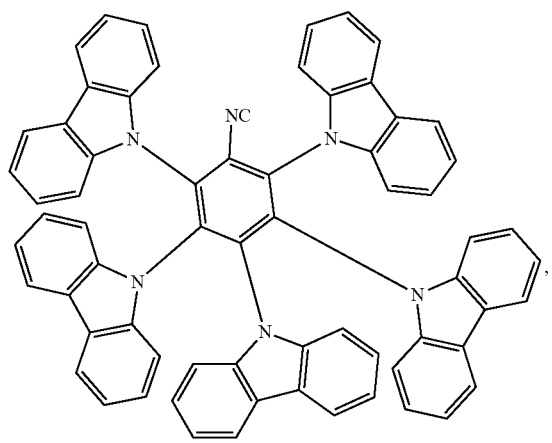
(T-100)
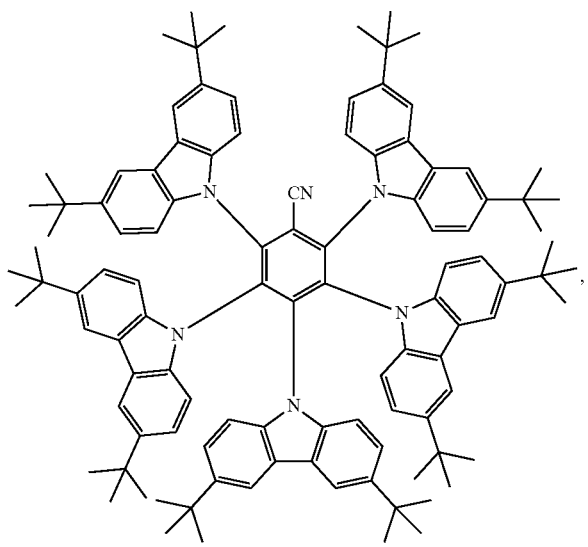

-continued
(T-101)
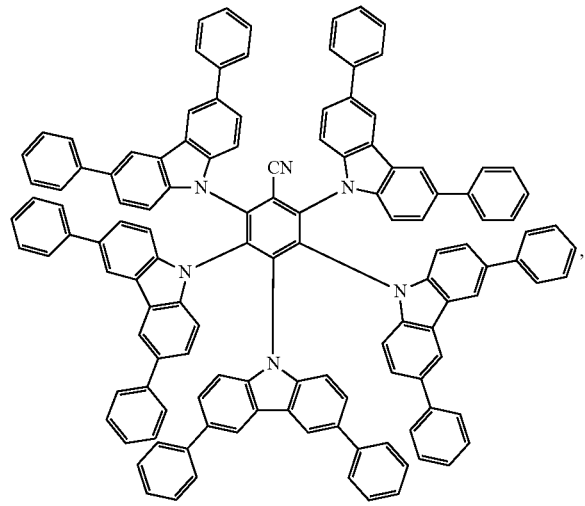
(T-102)
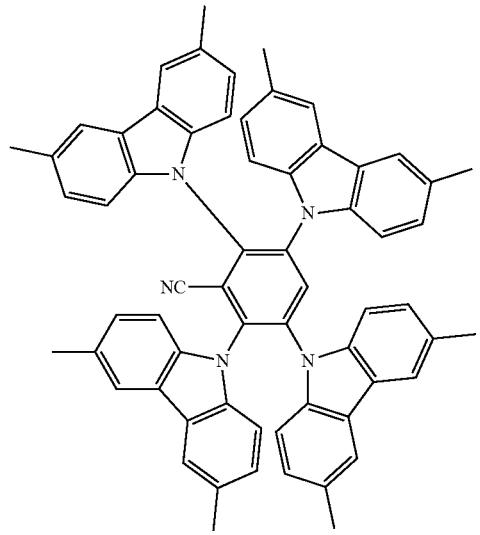
(T-103)
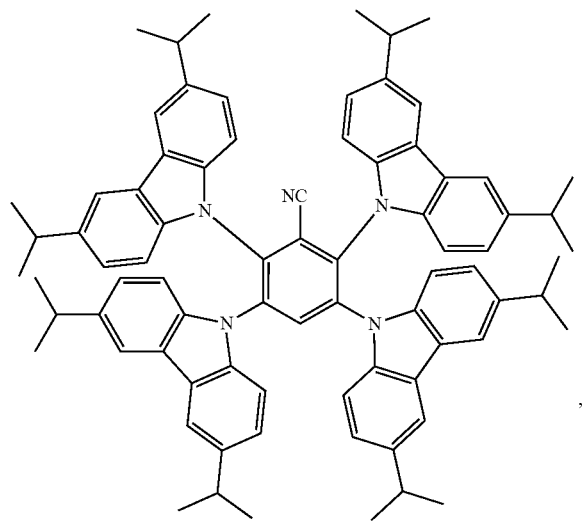
(T-104)
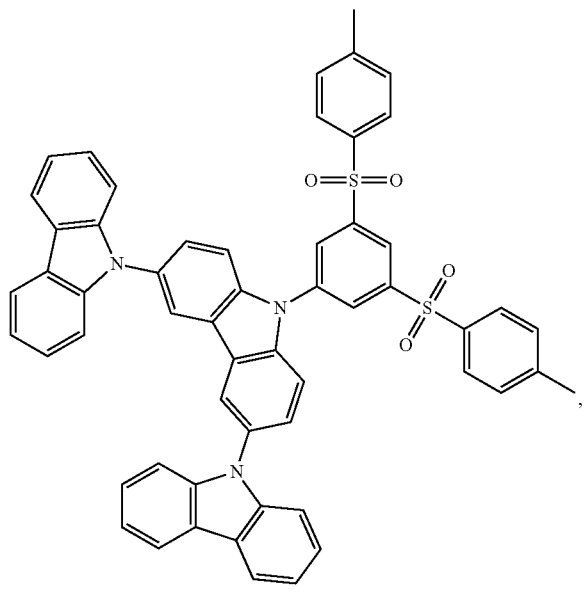
(T-105)
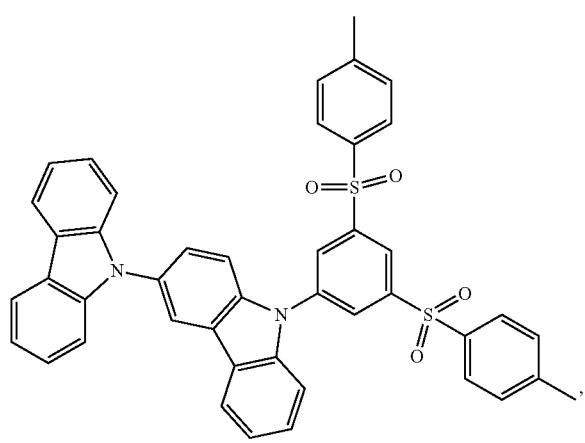
(T-106)
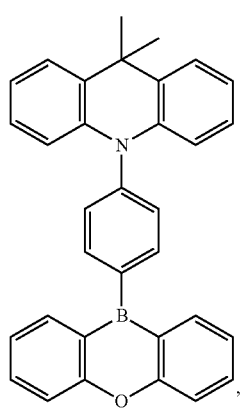

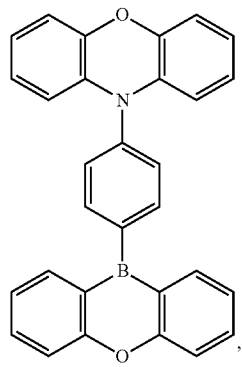
(T-107)

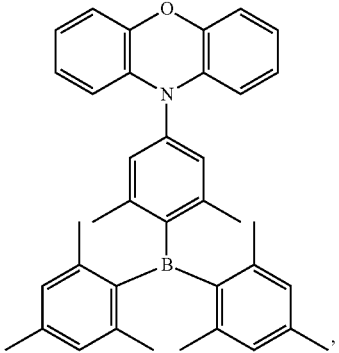
(T-108)

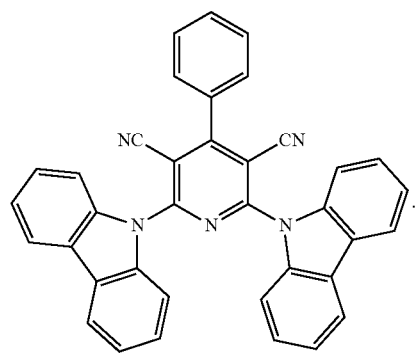
(T-109)

14. The organic electroluminescent device of claim 1, wherein, the guest material has a doping ratio of 0.1 wt %-50 wt %.

15. The organic electroluminescent device of claim 14, wherein, the guest material has a doping ratio of 1 wt %-20 wt %.

16. The organic electroluminescent device of claim 15, wherein, the guest material has a doping ratio of 10 wt %.

17. The organic electroluminescent device of claim 15, further comprising:
- a first electrode, made of indium tin oxide;
- a hole injection layer, made of 2,3,6,7,10,11-hexacyano-1,4,5,8,9,12-hexaazobenzophenanthrene;
- a hole transport layer, made of N,N'-(di-1-naphthyl)-N,N'-diphenyl-1,1'-biphenyl-4,4'-diamine;
- an electron transport layer, made of 9,10-di-(3-(3-pyridine)-phenyl)-anthracene and quinoline lithium in equal mass ratio;
- an electron injection layer, made of lithium fluoride;
- a second electrode, made of metal aluminum.

18. The organic electroluminescent device of claim 1, wherein the electron donor material has a compound structure of:

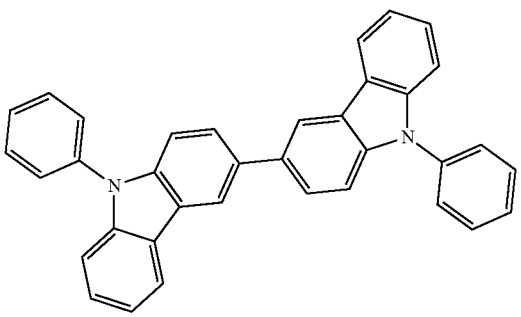
(D-20)

the electron receptor material has a compound structure of:

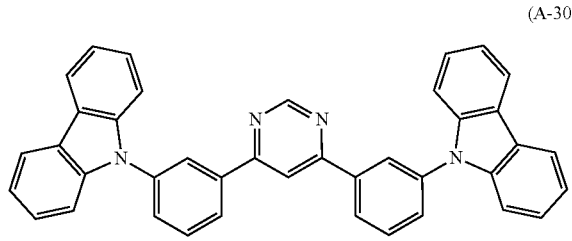
(A-30)

the thermal activated delayed fluorescent material has a compound structure of:

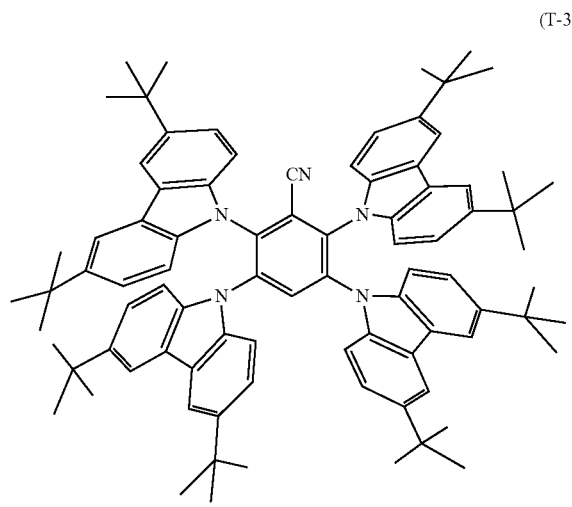
(T-3)

wherein the exciplex is formed by mixing the electron donor material and the electron receptor material in a mass ratio of 1:1, and the thermal activated delayed fluorescent material has a doping ratio of 10 wt %.

19. The organic electroluminescent device of claim 1, wherein the electron donor material has a compound structure of:

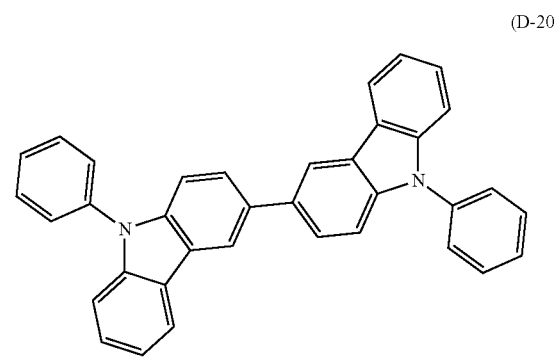
(D-20)

the electron receptor material has a compound structure of:

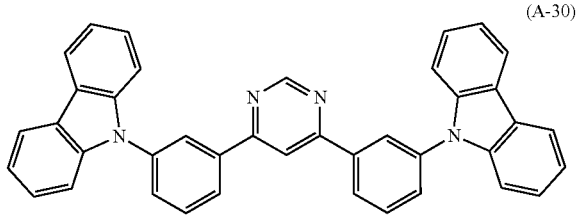 [SMILES: c1cc(-c2cc(-c3cccc(-n4c5ccccc5c5ccccc54)c3)ncn2)cc(-n2c3ccccc3c3ccccc32)c1]
(A-30)

the thermal activated delayed fluorescent material has a compound structure of:

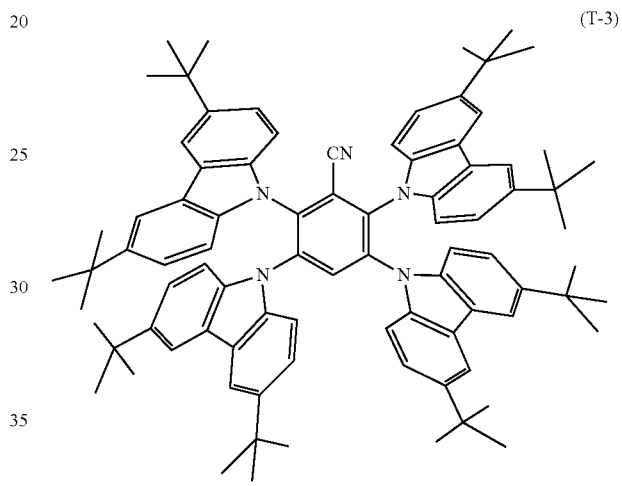
(T-3)

wherein the exciplex is formed by mixing the electron donor material and the electron receptor material in a mass ratio of 7:3, and the thermal activated delayed fluorescent material has a doping ratio of 10 wt %.

20. The organic electroluminescent device of claim 1, wherein the electron donor material has a compound structure of:

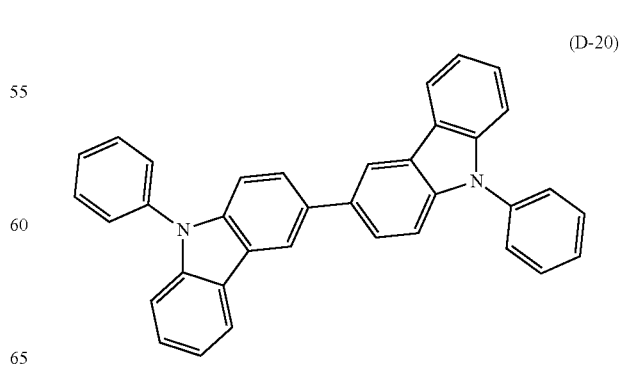
(D-20)

the electron receptor material has a compound structure of:
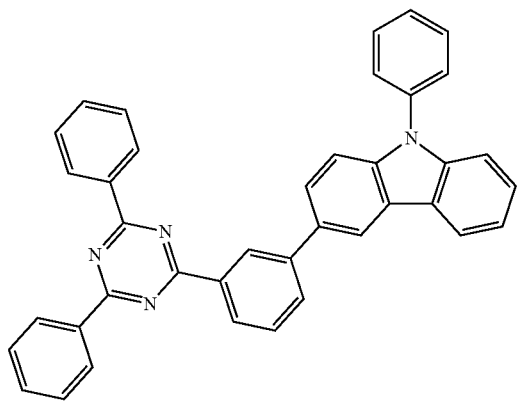
(A-19)
the thermal activated delayed fluorescent material has a compound structure of:
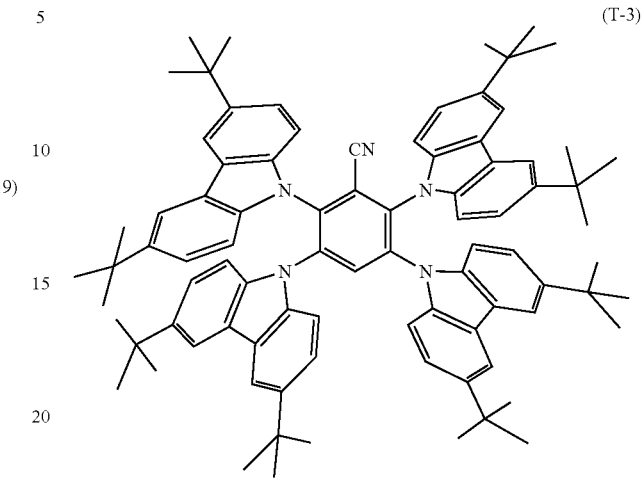
(T-3)
wherein the exciplex is formed by mixing the electron donor material and the electron receptor material in a mass ratio of 1:1, and the thermal activated delayed fluorescent material has a doping ratio of 20 wt %.
* * * * *